(12) United States Patent
Hasegawa et al.

(10) Patent No.: US 8,760,840 B2
(45) Date of Patent: Jun. 24, 2014

(54) ELECTROCHEMICAL DEVICE AND MANUFACTURING METHOD THEREOF, CIRCUIT BOARD AND HOUSING TRAY

(75) Inventors: Hiroaki Hasegawa, Tokyo (JP); Hidetake Itoh, Tokyo (JP); Yoshihiko Ohashi, Tokyo (JP); Kazuo Katai, Tokyo (JP); Yosuke Miyaki, Tokyo (JP)

(73) Assignee: TDK Corporation, Tokyo (JP)

( * ) Notice: Subject to any disclaimer, the term of this patent is extended or adjusted under 35 U.S.C. 154(b) by 434 days.

(21) Appl. No.: 13/085,735

(22) Filed: Apr. 13, 2011

(65) Prior Publication Data

US 2011/0253436 A1 Oct. 20, 2011

(30) Foreign Application Priority Data

Apr. 14, 2010 (JP) ................. 2010-093400
Apr. 14, 2010 (JP) ................. 2010-093409
Apr. 14, 2010 (JP) ................. 2010-093468
Apr. 14, 2010 (JP) ................. 2010-093472

(51) Int. Cl.
*H01G 2/02* (2006.01)
*H01G 9/06* (2006.01)
*H01G 4/228* (2006.01)
*H01G 9/10* (2006.01)
*H05K 5/03* (2006.01)
*H01R 9/00* (2006.01)

(52) U.S. Cl.
USPC ........... 361/271; 361/513; 361/520; 361/538; 361/773

(58) Field of Classification Search
USPC ................... 361/271, 773, 520, 538, 513
See application file for complete search history.

(56) References Cited

U.S. PATENT DOCUMENTS

| 6,225,778 B1 * | 5/2001 | Hayama et al. ............... 320/112 |
| 7,054,139 B2 | 5/2006 | James et al. |
| 7,233,482 B2 | 6/2007 | James et al. |
| 7,554,790 B2 | 6/2009 | James et al. |
| 2004/0195567 A1 * | 10/2004 | Ogino et al. ................ 257/59 |
| 2009/0277784 A1 | 11/2009 | Suto |
| 2009/0323254 A1 * | 12/2009 | Yamane et al. ............... 361/520 |
| 2011/0253436 A1 | 10/2011 | Hasegawa et al. |

FOREIGN PATENT DOCUMENTS

| CN | 101533901 A | 9/2009 |
| CN | 202042374 U | 11/2011 |
| JP | A-63-20189 | 1/1988 |
| JP | A-9-265973 | 10/1997 |
| JP | A-2001-76706 | 3/2001 |
| JP | A-2003-142057 | 5/2003 |
| JP | A-2004-515083 | 5/2004 |
| JP | A-2009-218118 | 9/2009 |

* cited by examiner

*Primary Examiner* — Eric Thomas
*Assistant Examiner* — Arun Ramaswamy
(74) *Attorney, Agent, or Firm* — Oliff PLC

(57) ABSTRACT

A lead 3 of an electrochemical device includes a lead body 3A containing Al, and a bent metallic thin film 3*a* provided to a tip part of the lead body 3A. The metallic thin film 3*a* includes a thin film body 3*a*1 containing Ni, and a plating layer 3*a*2 containing Sn and covering at least an outer surface of the bent thin film body 3*a*1. A specific area of an inner surface of the bent thin film body 3*a*1 and a surface of the lead body 3A are welded in a predetermined area without the plating layer 3*a*2 being disposed there between.

41 Claims, 55 Drawing Sheets

Fig.2
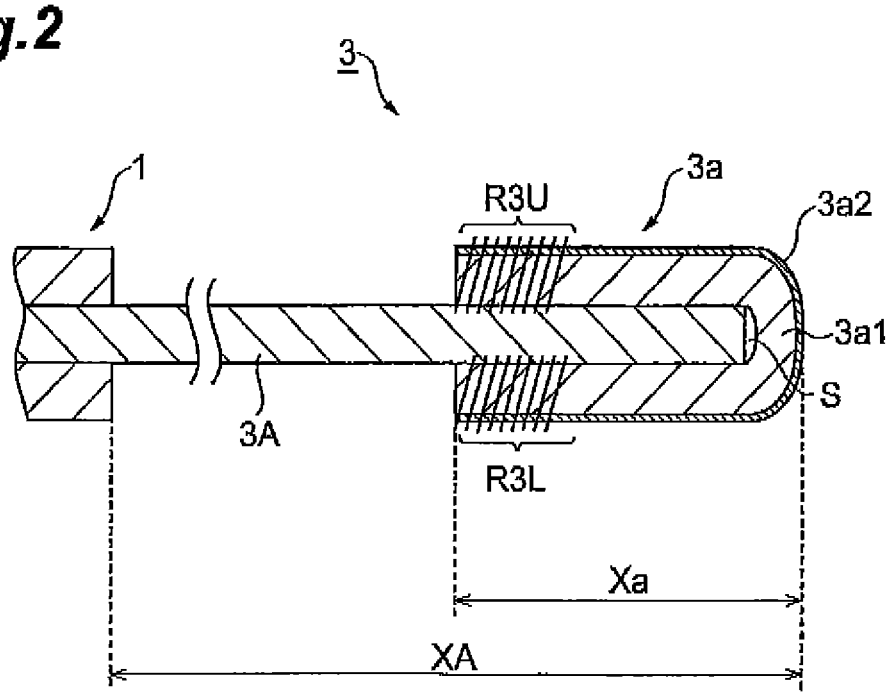
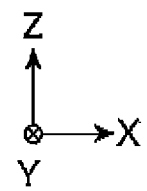

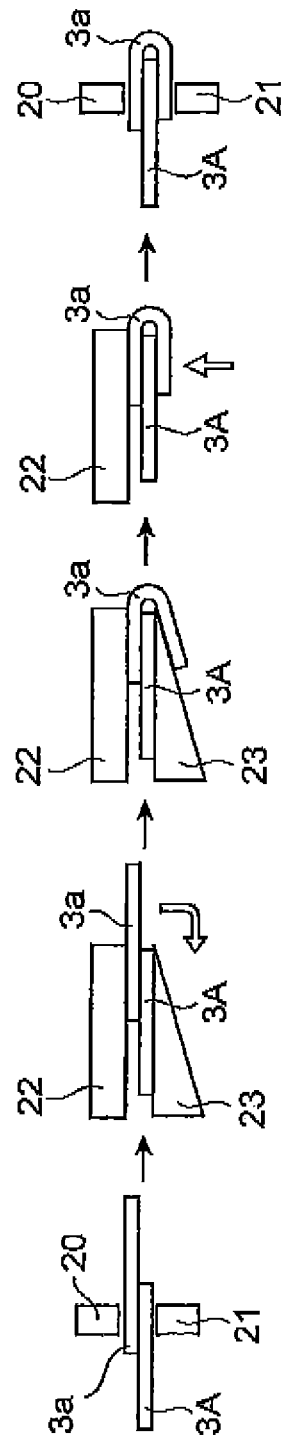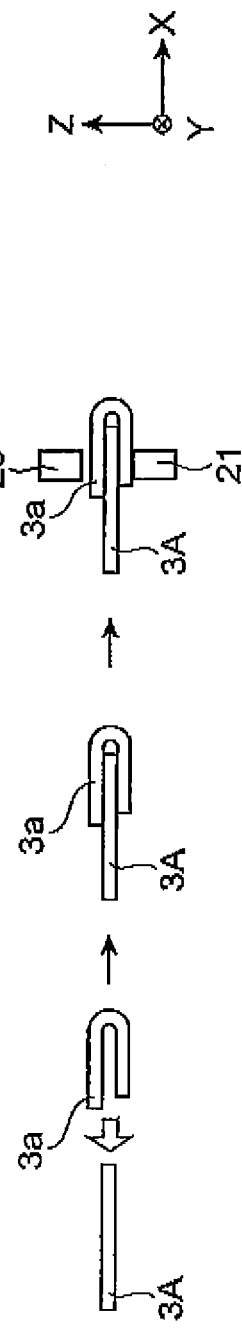

Fig.8
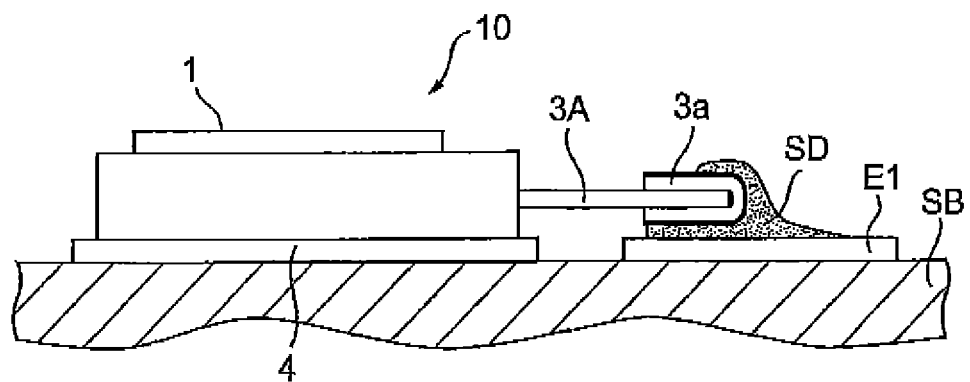
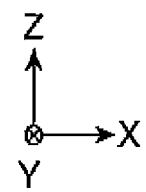

Fig.9
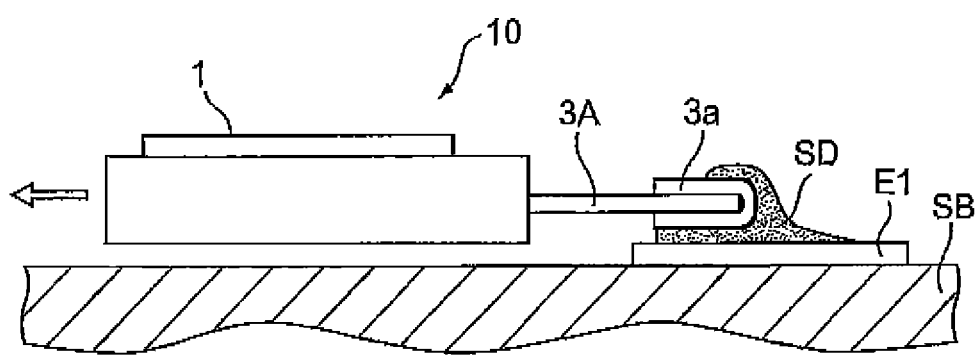
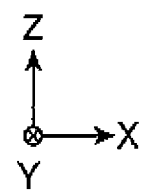

Fig.10
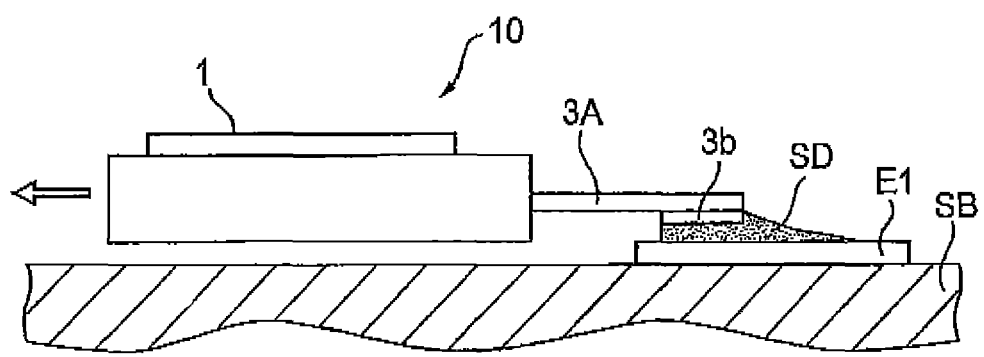
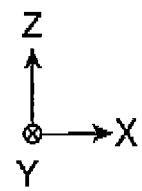

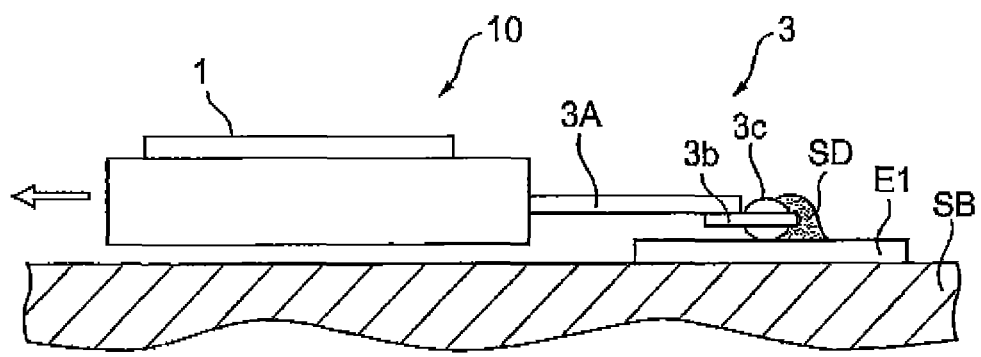
Fig.11
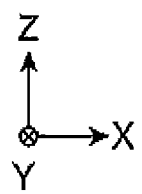

example1 example2 example3 example4 example5 example6

Fig.13

|  |  | thickness of plated layer ($\mu$m) | average (N) | standard deviation (N) | status of connection |
|---|---|---|---|---|---|
| example1 | example1-1 | 0.3 | >25 | — | △ |
|  | example1-2 | 0.5 |  |  | ○ |
|  | example1-3 | 2 |  |  | ○ |
|  | example1-4 | 5 |  |  | ○ |
|  | example1-5 | 7 |  |  | ○ |
|  | example1-6 | 10 |  |  | ○ |
|  | example1-7 | 10.5 |  |  | △ |
| example2 |  | 2 | >25 | — | ○ |
| example3 |  | 2 | >25 | — | ○ |
| example4 |  | 2 | >25 | — | ○ |
| example5 |  | 2 | >25 | — | ○ |
| example6 |  | 2 | >25 | — | ○ |
| comparatine example1 |  | 2 | 7.8 | 2.2 | × |
| comparatine example2 |  | — | 17.3 | 3.1 | × |

Fig.23
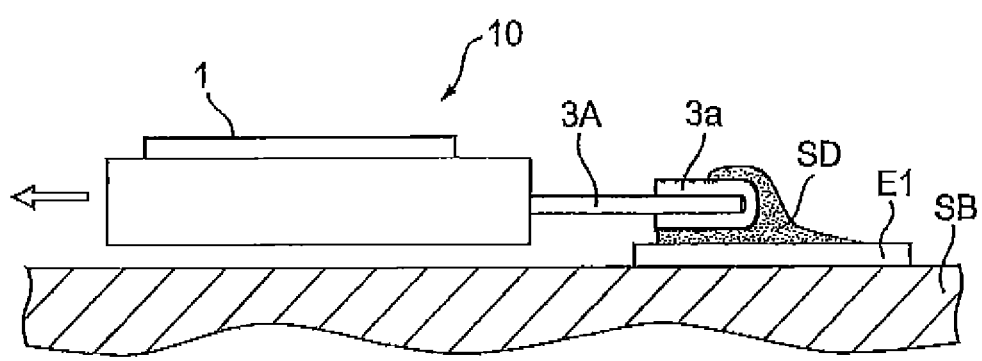
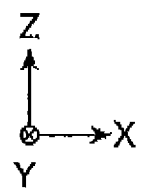

Fig.24
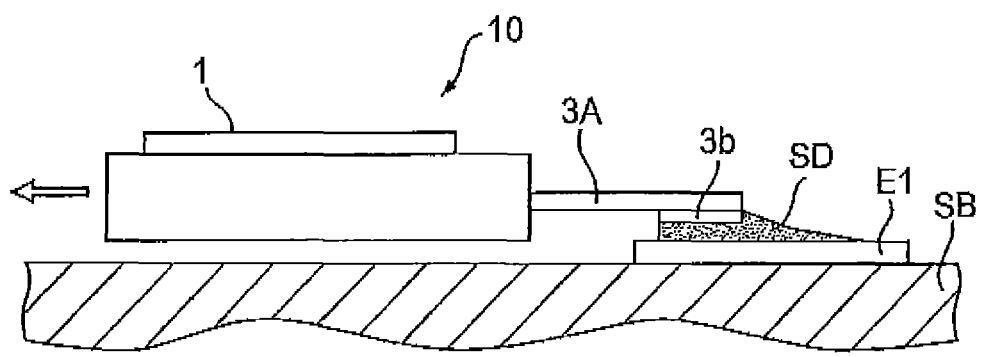
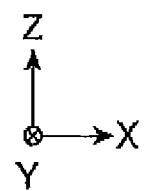

Fig.25
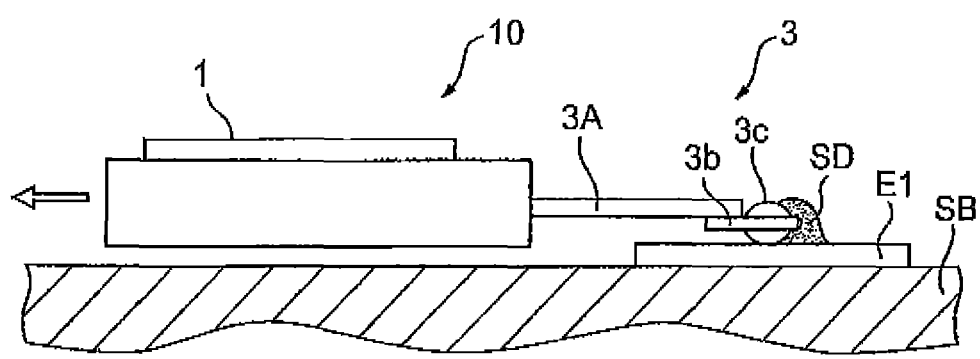
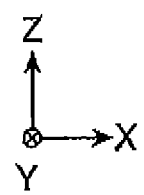

*Fig. 26A* example1
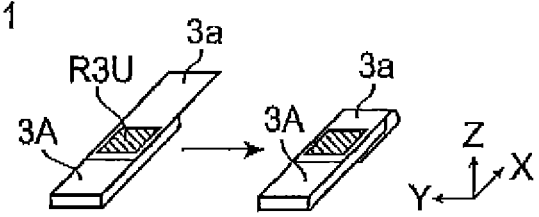
*Fig. 26B* example2
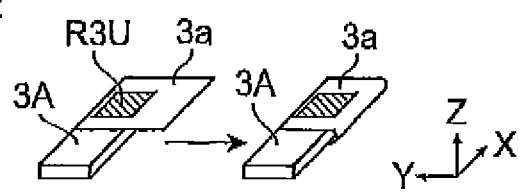
*Fig. 26C* example3
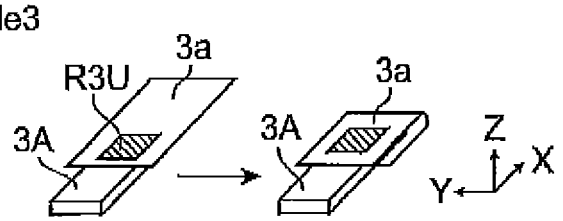

Fig.27

|  |  | thickness of plated layer ($\mu$m) | average (N) | standard deviation (N) | status of connection |
|---|---|---|---|---|---|
| example1 | example1-1 | 0.3 | >25 | — | △ |
|  | example1-2 | 0.5 |  |  | ○ |
|  | example1-3 | 2 |  |  | ○ |
|  | example1-4 | 5 |  |  | ○ |
|  | example1-5 | 7 |  |  | ○ |
|  | example1-6 | 10 |  |  | ○ |
|  | example1-7 | 10.5 |  |  | △ |
| example2 |  | 2 | >25 | — | ○ |
| example3 |  | 2 | >25 | — | ○ |
| comparative example1 |  | 2 | 7.8 | 2.2 | × |
| comparative example2 |  | — | 17.3 | 3.1 | × |

Fig.31
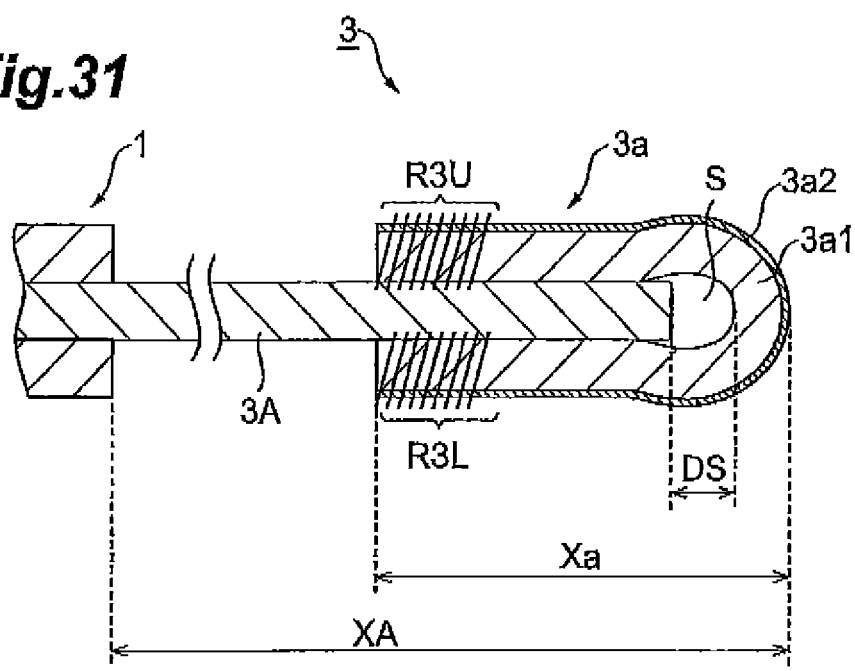
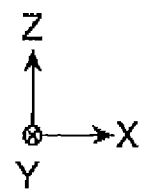

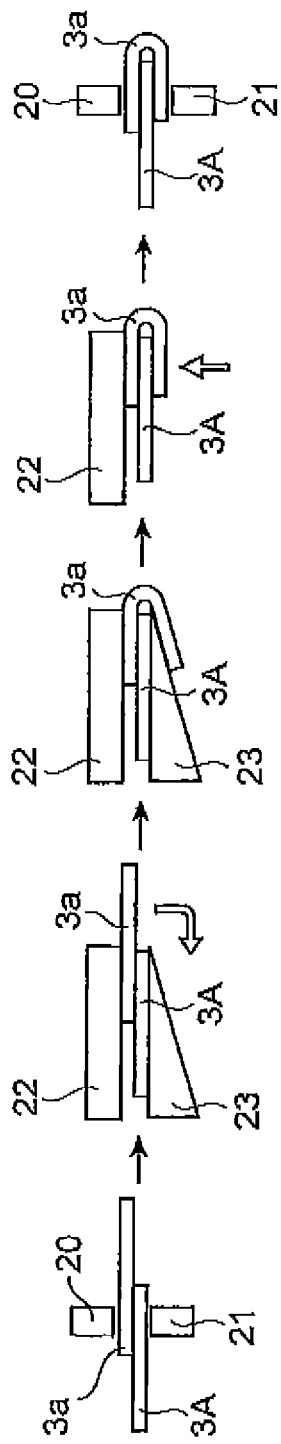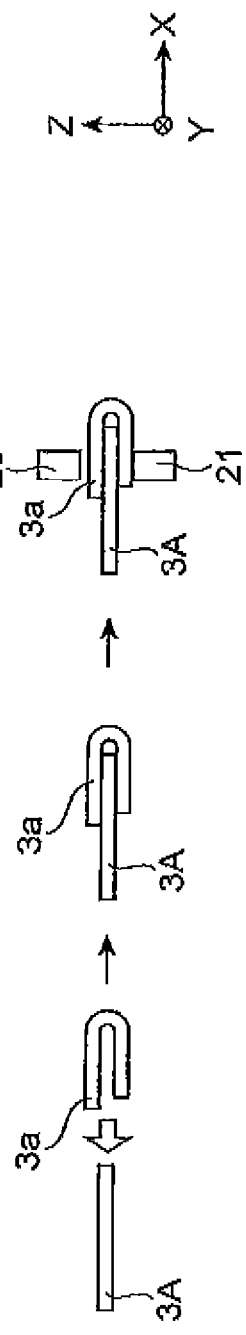

Fig.39
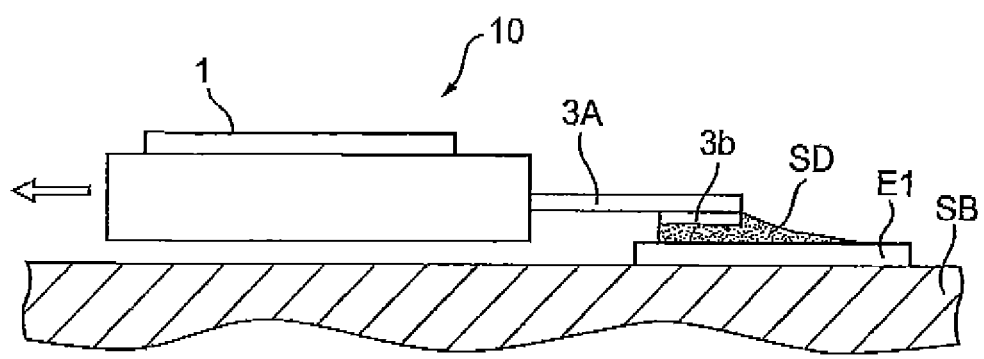
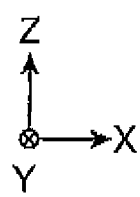

Fig.40
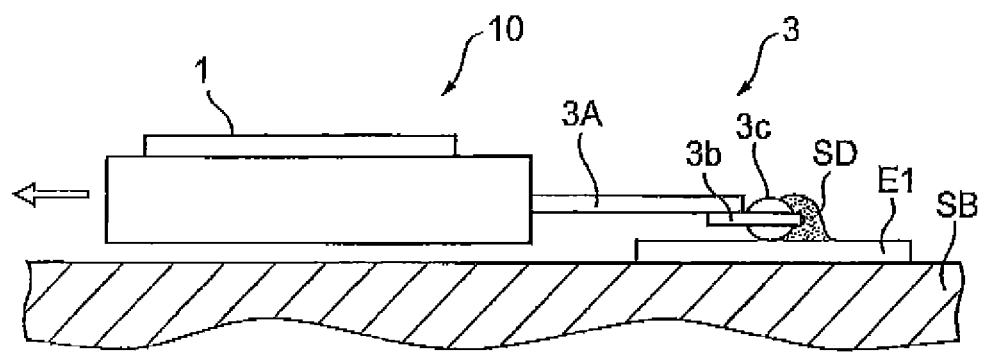
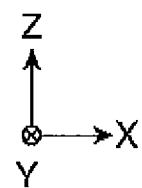

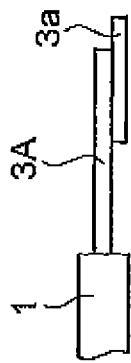
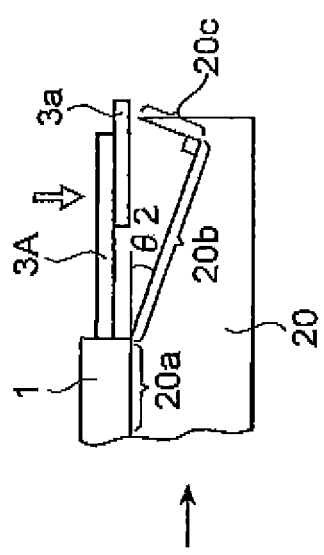
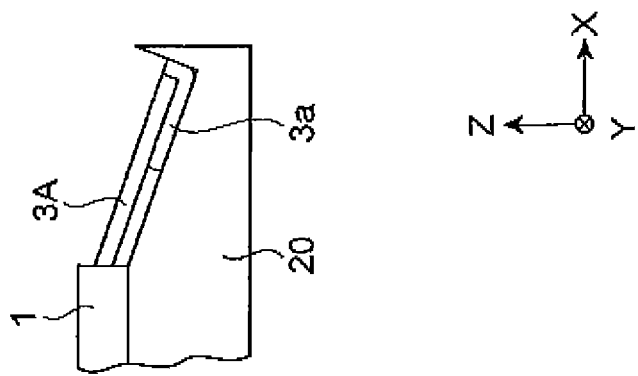

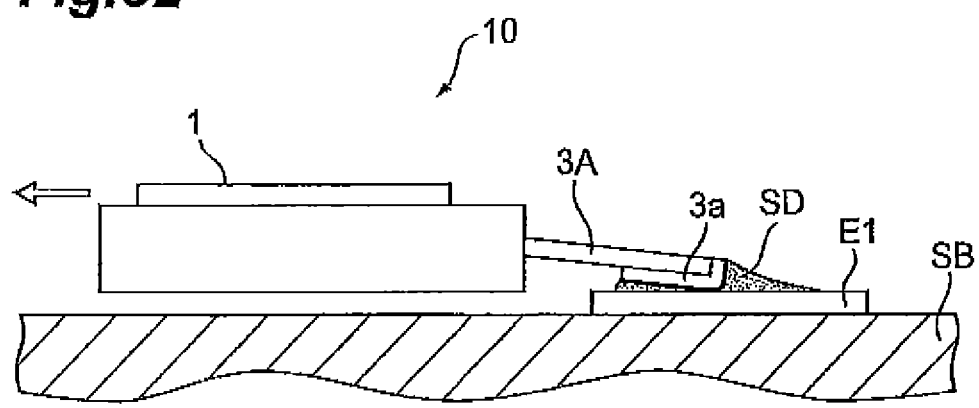
Fig.52
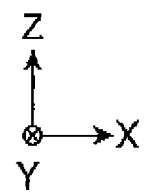

Fig.53
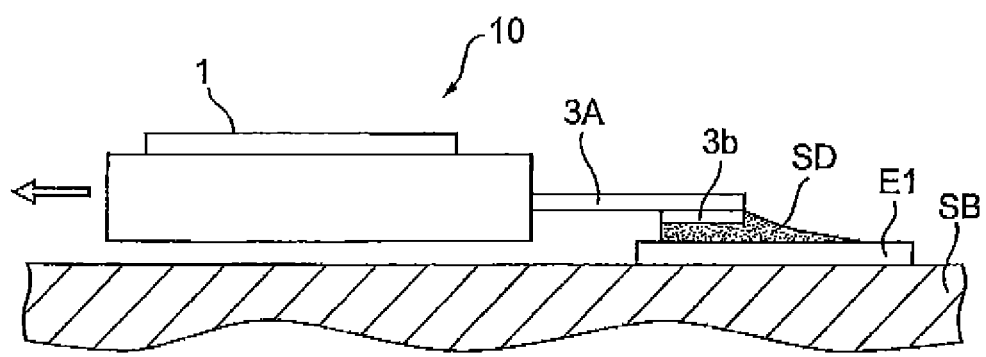
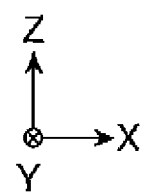

Fig.54
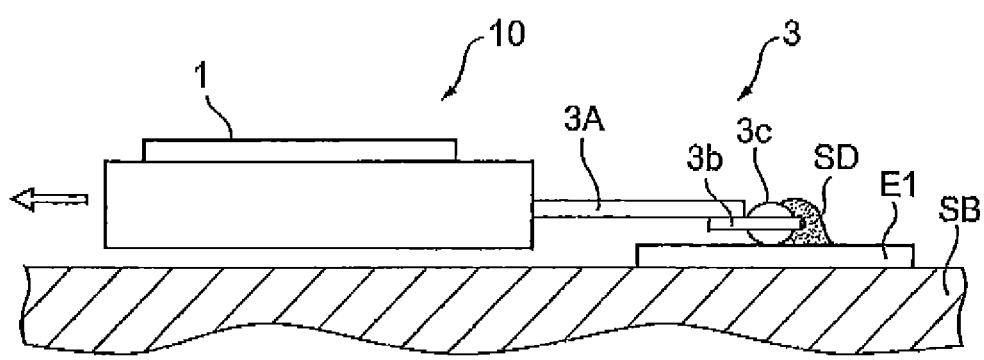
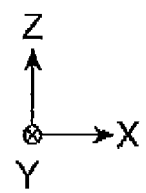

ELECTROCHEMICAL DEVICE AND MANUFACTURING METHOD THEREOF, CIRCUIT BOARD AND HOUSING TRAY

BACKGROUND OF THE INVENTION

1. Field of the Invention

The present invention relates to an electrochemical device such as an EDLC (Electric Double Layer Capacitor) as well as to the manufacturing method thereof, a circuit board, and a housing fray,

2. Related Background Art

A conventional flat-type electrochemical device is described, for example, in Japanese Translation of PCT Application No. 2004-515083. With this kind of flat-type electrochemical device, a plurality of leads are extending outward from the inside of an outer package in which the planar shape thereof is a square shape. These leads are generally made of aluminum since they need to satisfy both the resistance properties and electrical conductivity relative to the electrolytic solution, and are electrically connected to an electrode pad using a solder material.

Nevertheless, with a lead made of aluminum, there is a problem in that the fixation strength between the electrode pad and the lead deteriorates since the wettability relative to the solder material is low.

SUMMARY OF THE INVENTION

The present invention was devised in view of the foregoing problems. Thus, an object of this invention is to provide an electrochemical device capable of improving the fixation strength between the electrode pad and the lead, as well as the manufacturing method thereof, a circuit board, and a housing tray.

In order to achieve the foregoing object, the electrochemical device according to the present invention is an electrochemical device including a charger/discharger housed in an outer package, and a lead extending from the charger/discharger, wherein the lead has: a lead body containing Al, and a metallic thin film which is provided to a tip part of the lead body, and is bent at a side face position of the lead body as a boundary, and which covers upper and lower faces and a side face of the lead body, and in which a predetermined area is welded to the lead body; the metallic thin film includes: a thin film body containing Ni, and a plating layer containing Sn and covering at least an outer surface of the bent thin film body; and a specific area of an inner surface of the bent thin film body and a surface of the lead body are directly in contact and welded in the predetermined area without the plating layer being disposed therebetween. Note that, in cases of mounting the electrochemical device on a circuit board, the face positioned on the circuit board side in the lead body is referred to as the lower face, and the face that is on the opposite side is referred to as the upper face.

Since the surface of the metallic thin film includes a plating layer containing Sn and the wettability relative to the solder material is high, the metallic thin film and the electrode pad are firmly fixed via the solder material. Here, since Ni is contained in the thin film body on which the plating layer is formed, Ni and Sn are bonded firmly. Moreover, since the solder material can crawl up to the upper face of the outer surface of the bent metallic thin film, the fixation strength between the electrode pad and the metallic thin film can be further increased. The area where the plating layer of the metallic thin film is not formed is welded to the lead body containing Al, but since Ni and Al can be firmly welded, the metallic thin film and the lead body are also firmly fixed. Accordingly, it is possible to significantly improve the fixation strength between the electrode pad and the lead.

Moreover, with the electrochemical device of the present invention, the metallic thin film is welded to both the top and lower faces of the lead body. Since the metallic thin film and the lead body are welded at both the upper and lower faces, the fixation strength thereof is improved.

Moreover, with the electrochemical device of the present invention, the plating layer is formed along a longitudinal direction of the thin film body on an inner surface of the thin film body in the vicinity of opposite end positions of the bent metallic thin film in a bending axis direction.

As a result of forming the plating layer in the vicinity of such opposite end positions (e.g.: opposite end positions of the lead in the width direction), the contour of the cross section shape of the plating layer (e.g.: cross section shape that is perpendicular to the longitudinal direction of the lead) will acquire linearity. In other words, the product deviation can be reduced since variation in the thickness of the plating layer will decrease, and it is thereby possible to provide an electrochemical device of stable quality.

Moreover, with the electrochemical device of the present invention, a thickness of the plating layer is 0.5 µm or more and 10 µm, or less. Specifically, if the thickness is less than 0.5 µm, defects may arise in the plating layer, and, if the thickness exceeds 10 µm, it tends to interfere with the welding.

Moreover, with the electrochemical device of the present invention, a thickness of the thin film body is 50 µm or more and 500 µm or less. If the thickness of the thin film body falls below 50 µm, in the case of forming the foregoing plating layer structure, an adhesive tape is affixed to the non-plated area of the thin film body, plating is subsequently performed, and the adhesive tape is peeled thereafter at an appropriate timing, but the thin film body oscillates during the foregoing process and wrinkles, kinks, crimps and the like tend to form on the thin film body, and, since such defects cannot be controlled, an error occurs in the quality of the product. Moreover, if the thickness of the thin film body exceeds 500 µm, this is undesirable since a phenomenon occurs where bonding with the lead becomes difficult. The present invention can inhibit the foregoing defects by setting the thickness of the thin film body to be within the foregoing range.

Moreover, with the electrochemical device of the present invention, a dimension of the bent metallic thin film in a longitudinal direction of the lead is 1 mm or more, If the foregoing dimension is less than 1 mm, the bond strength with the electrode pad based on soldering tends to deteriorate, and bond strength can be obtained if the dimension is 1 mm or more, especially if it is 2 mm or more. Note that the foregoing dimension is preferably 5 mm or less, and sufficient connection strength can be obtained in the foregoing case.

Moreover, with the electrochemical device of the present invention, the plating layer contains 98±1 (mass %) of Sn and 2±1 (mass %) of Cu.±1 (mass %) is a tolerable error.

In the foregoing case, an effect is yielded in that the melting point of the solder decreases during solder welding, and bonding can be performed easily.

Moreover, when the width of the metallic thin film is greater than the width of the lead body, it becomes easier for the solder material to crawl onto the metallic thin film of the portion protruding from the lead body, and the tensile strength and the torsional strength will thereby increase.

Moreover, the circuit board of the present invention comprises any one of the foregoing electrochemical devices, a substrate on which the electrochemical device is mounted and which comprises an electrode pad, a double-sided adhesive tape which is interposed between a rear face of the outer package and the substrate, and a solder material which is interposed between the electrode pad and the metallic thin film, and which reaches an outer upper face of the metallic thin film.

In the foregoing case, since the lead and the electrode pad are firmly fixed and the rear face of the outer package and the substrate are also firmly fixed with the double-sided adhesive tape, obtained is a circuit board that is resistant to oscillation.

Moreover, with the circuit board of the present invention, the solder material contains Sn and Cu. In the case of this kind of material, since the affinity with Sn contained in the plating layer is favorable, the wettability of the solder material will increase. However, since Cu is contained, the melting point of the solder decreases during solder welding, and an effect is yielded in that bonding can be performed easily. Moreover, the solder material preferably contains trace amounts of Ag. In the foregoing case, an effect is yielded in that the durability after the solder welding will improve.

According to the electrochemical device and the circuit board of the present invention, superior reliability is yielded since the fixation strength between the electrode pad and the lead can be improved.

The housing tray according to the present invention comprises a body housing part for housing the charger/discharger housed in the outer package, and a lead housing part including an inclined plane extending at an angle from the body housing part in an obliquely downward direction.

The method of manufacturing the electrochemical device in the foregoing case comprises the steps of: preparing an electrochemical device, before being subjected to bending, including the charger/discharger housed in the outer package, and the lead which has the lead body and the metallic thin film before being subjected to bending provided to the tip part of the lead body, and which extends from the charger/discharger in a direction that is parallel to the bottom face of the charger/discharger; mounting the electrochemical device, before being subjected to bending, on a bending jig including a principal plane for mounting the charger/discharger housed in the outer package, an inclined plane extending at an angle from the principal plane in an obliquely downward direction, and a vertical plane extending in a direction that is perpendicular to the inclined plane, and bending the lead so that it inclines in an obliquely downward direction from a position which is in contact with the outer package by pressing the lead against the inclined plane and the vertical plane; and simultaneously bending the metallic thin film so as to cover a lower face and a side face of the lead body.

BRIEF DESCRIPTION OP THE DRAWINGS

FIG. 1 is a perspective view of the electrochemical device;
FIG. 2 is an arrow II-II cross section of the electrochemical device shown in FIG. 1;
FIG. 3 is an arrow III-III cross section of the electrochemical device shown in FIG. 1;
FIG. 4 is a perspective view of the metallic thin film;
FIG. 5A and FIG. 5B are cross sections of the metallic thin film;
FIG. 6 is a perspective view showing the welding process of the lead body and the metallic thin film;
FIG. 7Aa, FIG. 7Ab, FIG. 7Ac, FIG. 7Ad, FIG. 7Ae, FIG. 7Ba, FIG. 7Bb, and FIG. 7Bc are diagrams showing the method of fixing the lead body and the metallic thin film;
FIG. 8 is a cross section of the circuit board in which the electrochemical device is mounted on the substrate;
FIG. 9 is a diagram explaining the experimental method of the Examples;
FIG. 10 is a diagram explaining the experimental method of Comparative Example 1;
FIG. 11 is a diagram explaining the experimental method of Comparative Example 2;
FIG. 12A, FIG. 12B, FIG. 12C, FIG. 12D, FIG. 12E, and FIG. 12F are diagrams explaining the structure and mounting method of the metallic thin film of the respective Examples;
FIG. 13 is a table showing the experimental results;
FIG. 14 is a circuit diagram showing the internal structure of the electrochemical device;
FIG. 15 is a perspective view of the electrochemical device;
FIG. 16 is an arrow II-II cross section of the electrochemical device shown in FIG. 15;
FIG. 17 is an arrow III-III cross section of the electrochemical device shown in FIG. 15;
FIG. 18 is a perspective view of the metallic thin film;
FIG. 19A and FIG. 19B are cross sections of the metallic thin film;
FIG. 20 is a perspective view showing the welding process of the lead body and the metallic thin film;
FIG. 21A, FIG. 21B, FIG. 21C, and FIG. 21D are diagrams showing the method of fixing the lead body and the metallic thin film;
FIG. 22 is a cross section of the circuit board in which the electrochemical device is mounted on the substrate;
FIG. 23 is a diagram explaining the experimental method of the Examples;
FIG. 24 is a diagram explaining the experimental method of Comparative Example 1;
FIG. 25 is a diagram explaining the experimental method of Comparative Example 2;
FIG. 26A, FIG. 26D, and FIG. 26C are diagrams explaining the structure and mounting method of the metallic thin film of the respective Examples;
FIG. 27 is a table showing the experimental results;
FIG. 28 is a circuit diagram showing the internal structure of the electrochemical device;
FIG. 29A is an XZ cross section SEM photograph in the vicinity of the lead that is fixed to the electrode pad with a solder material, and FIG. 29B is a YZ cross section SEM photograph thereof;
FIG. 30 is a perspective view of the electrochemical device;
FIG. 31 is an arrow II-II cross section of the electrochemical device;
FIG. 32 is an arrow III-III cross section of the electrochemical device;
FIG. 33 is a perspective view of the metallic thin film;
FIG. 34A and FIG. 34B are cross sections of the metallic thin film;
FIG. 35 is a perspective view showing the welding process of the lead body and the metallic thin film;
FIG. 36Aa, FIG. 36Ab, FIG. 36Ac, FIG. 36Ad, FIG. 36Ae, FIG. 36Ba, FIG. 36Bb, and FIG. 36Bc are diagrams showing the method of fixing the lead body and the metallic thin film;
FIG. 37 is a cross section of the circuit board in which the electrochemical device is mounted on the substrate;
FIG. 38 is a diagram explaining the experimental method of the Examples;
FIG. 39 is a diagram explaining the experimental method of Comparative Example 1;
FIG. 40 is a diagram explaining the experimental method of Comparative Example 2;
FIG. 41A, FIG. 41B, FIG. 41C, and FIG. 41D are diagrams explaining the structure and mounting method of the metallic thin film of the respective Examples;

Figure 50:
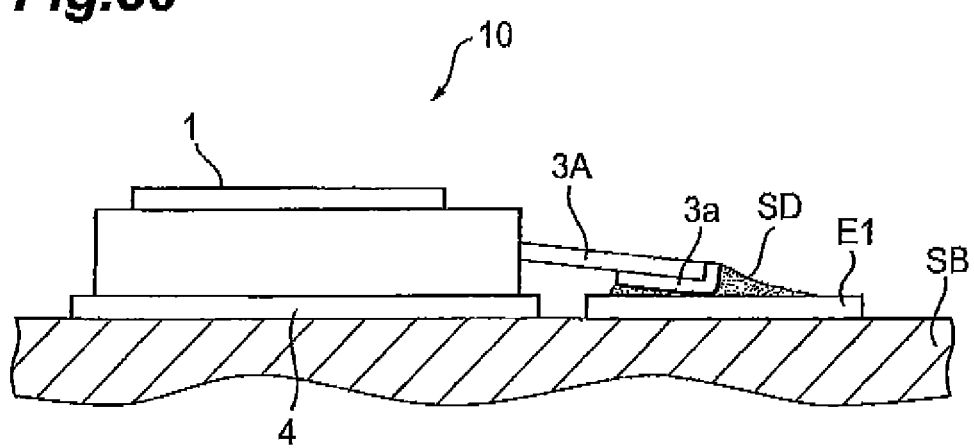
Figure 51A:
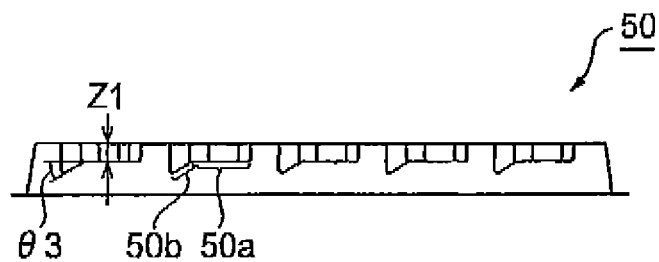
Figure 51B:
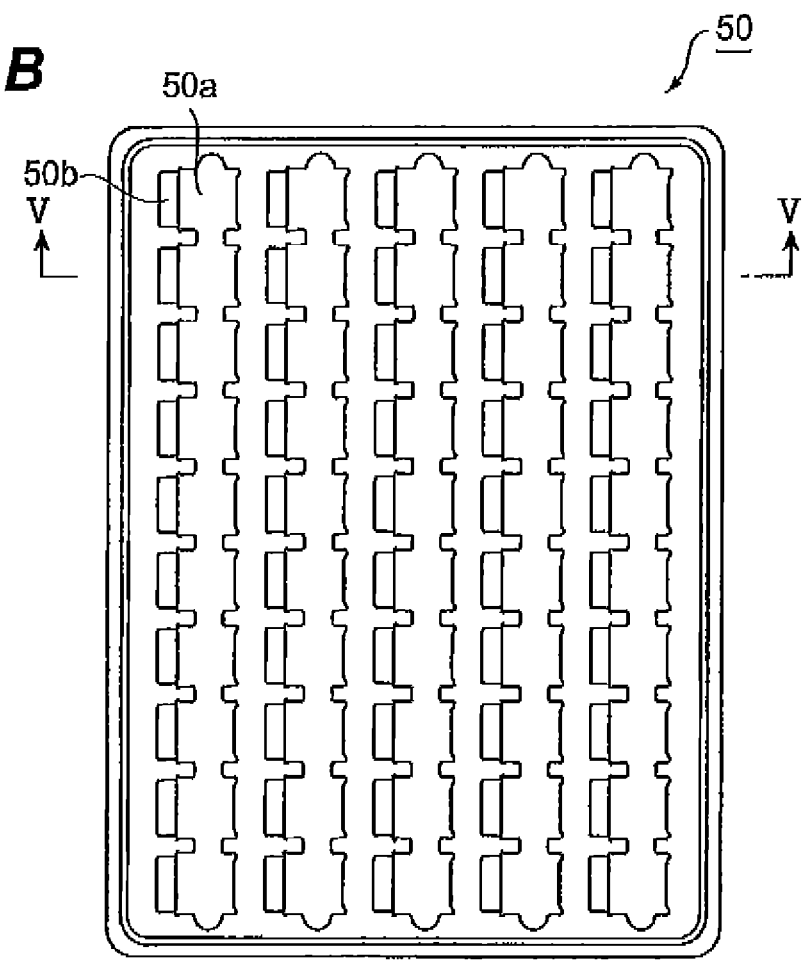
Figure 55:
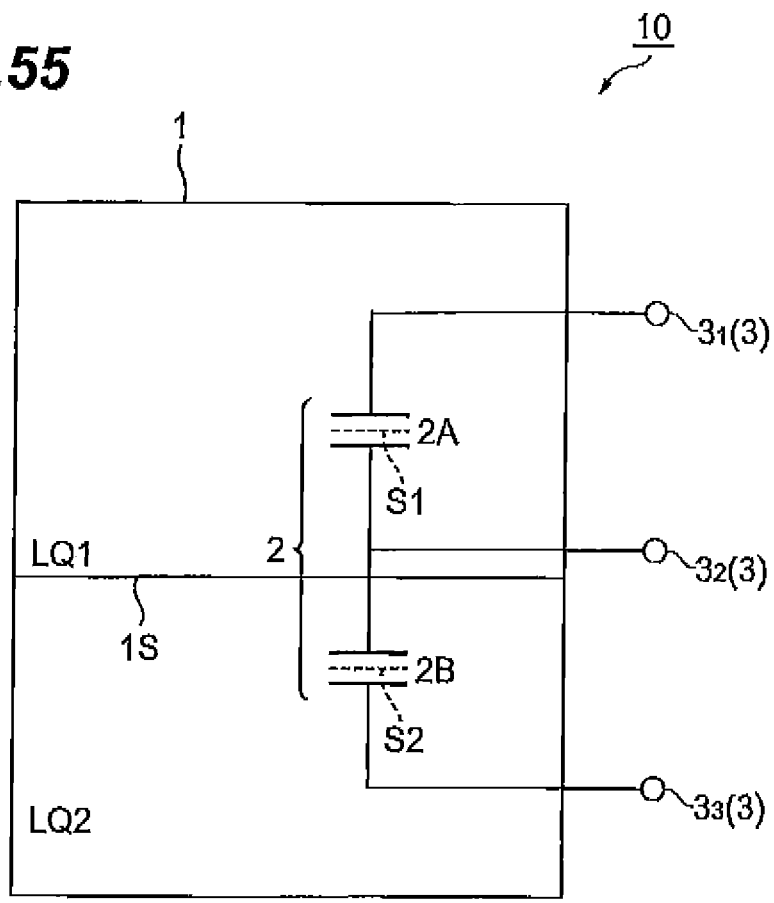

FIG. 49A, FIG. 49B, and FIG. 49C are diagram showing the method of bending the lead and the metallic thin film;

FIG. 50 is a cross section of the circuit board in which the electrochemical device is mounted on the substrate;

FIG. 51A is a cross section of the housing tray, and FIG. 51B is a plan view of the housing tray;

FIG. 52 is a diagram explaining the experimental method of the Examples;

FIG. 53 is a diagram explaining the experimental method of Comparative Example 1;

FIG. 54 is a diagram explaining the experimental method of Comparative Example 2; and FIG. 55 is a circuit diagram showing the internal structure of the electrochemical device.

DESCRIPTION OF THE PREFERRED EMBODIMENTS

The electrochemical device of embodiments according to types A to D is now explained. In the explanation of each type of electrochemical device, the same elements are given the same reference numeral and redundant explanation is omitted. Moreover, the numbers used in the respective Examples are used independently in the explanation of the respective types. The electrochemical device of type A is foremost explained.

Figure 1:
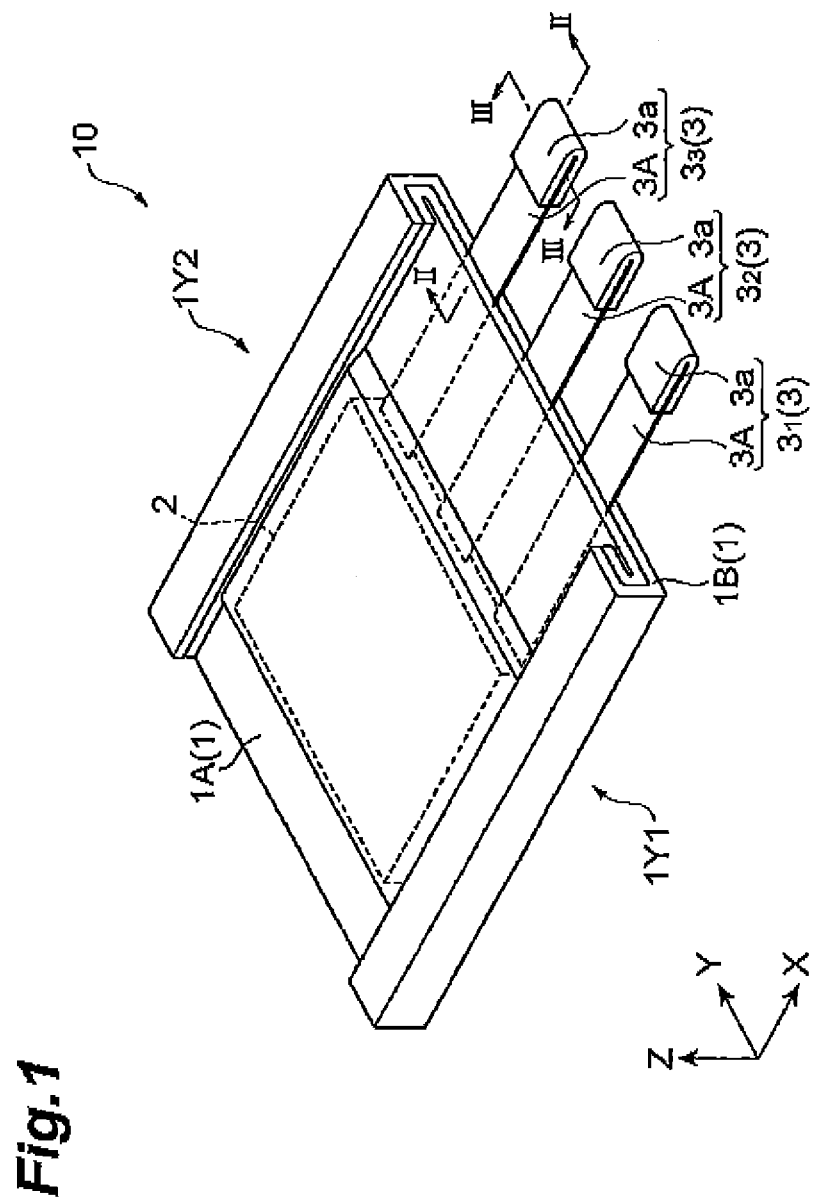
Figure 3:
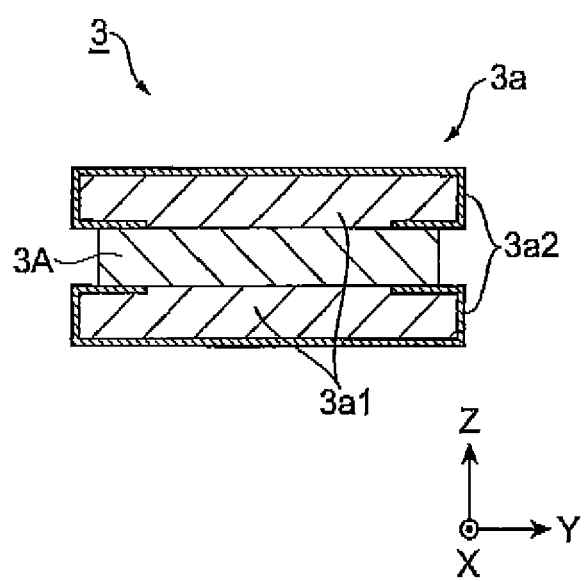

FIG. 1 is a perspective view of the electrochemical device, FIG. 2 is an arrow II-II cross section of the electrochemical device, and FIG. 3 is an arrow III-III cross section of the electrochemical device. Moreover, FIG. 8 an XZ cross section of the circuit board on which the electrochemical device is mounted.

The electrochemical device 10 includes a charger/discharger 2 housed in an outer package 1, and a plurality of leads 3 extending from the charger/discharger 2. The outer package 1 is configured by superposing a rectangular upper laminated sheet 1A and a rectangular lower laminated sheet 1B, and bonding the areas in the vicinity of the four sides of the periphery thereof. The laminated sheets 1A, 1B are respectively formed by coating an inner surface of an aluminum thin film with a resin layer. A three dimensional Cartesian coordinate system as shown in FIG. 1 is set with the thickness direction of the outer package 1 as the Z axis, the width direction as the Y axis, and the length direction as the X axis. Regions 1Y1, 1Y2 in the vicinity of opposite ends of the outer package 1 in the Y axis direction are bent inward at the boundary line along the X axis, and the mechanical strength of the outer package 1 is thereby enhanced.

An electrolytic solution and the charger/discharger 2 as a battery element are disposed within hermetically-sealed internal space of the outer package 1. Via the lead 3, an electrical charge can be accumulated in the charger/discharger 2 and the accumulated electrical charge can also be discharged therefrom. Various structures may be used for the charger/discharger 2, but capacitors connected in series are used in this example. Specifically, the electrochemical device 10 in this case configures an EDLC (Electric Double Layer Capacitor).

Figure 14:
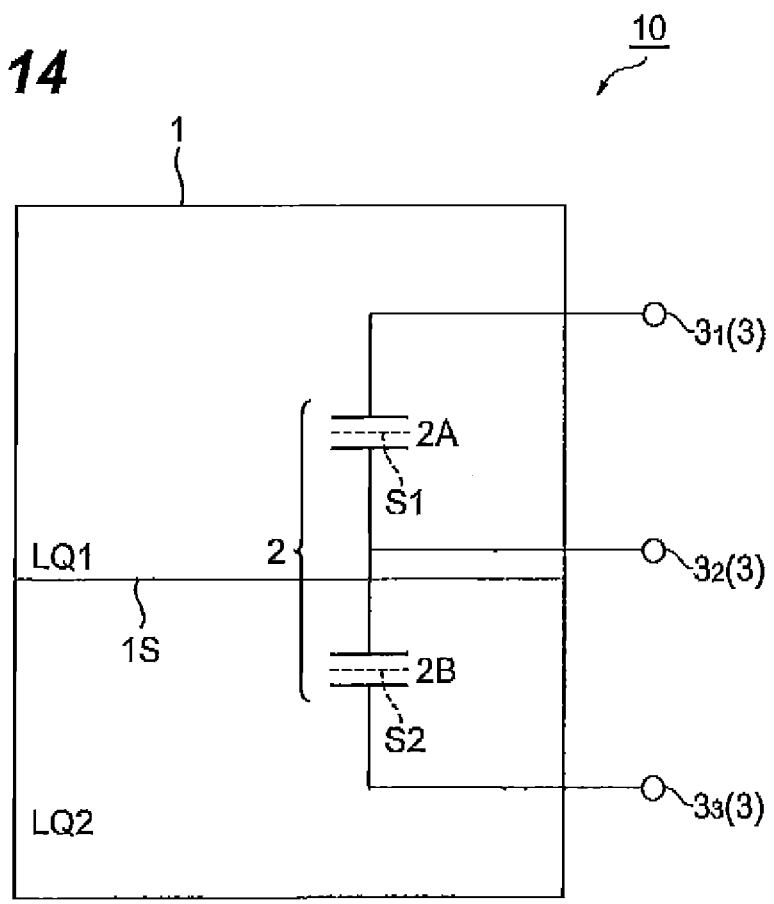

Here, the internal electrical circuit structure of the EDLC is shown in FIG. 14.

The charger/discharger 2 is configured by connecting a capacitor 2A and a capacitor 2B in series, a lead $3_2$ is electrically connected to the connection tip parts thereof, and a lead $3_1$ and a lead $3_3$ are electrically connected, respectively, to terminals which are different from the foregoing connection tip parts of the capacitor 2A and the capacitor 2B. The inside of the outer package 1 is partitioned into two storage parts with a sealant 1S made of polypropylene or the like, and the capacitor 2A and the capacitor 2B are separately housed in the respective storage parts. Electrolytic solutions LQ1, LQ2 are filled in the respective storage parts inside the outer package 1. The respective terminal electrodes configuring the capacitors 2A, 2B are configured by laminating an active material layer and a collector. Moreover, separators S1, S2 as insulating layers are respectively interposed between the respective terminal electrodes configuring the capacitors 2A, 2B. With an EDLC, electrical charges are aligned as a thin layer between the polarizing conductor and the electrolyte (solution), and electrical charge is accumulated by applying a bias therebetween. The center lead $3_2$ is used for controlling the potential in the connection tip parts of the capacitors 2A and 2B connected in series.

The active material layer is a polarizing electrode. The polarizing electrode is made of a porous material, and manufactured by mixing binder resin in activated carbon. As the binder resin, used may be a high molecular compound containing fluorine such as polytetrafluoroethylene and polyvinylidene fluoride, a rubber-based high molecular compound such as styrene-butadiene rubber, carboxymethyl cellulose, and so on. As needed, carbon black, carbon nanotubes, graphite particles or microfilaments may be added as a conductive assistant. During the manufacture process, these materials are applied to one side or both sides of the collector.

The collector is made of a metal foil. In addition to using an aluminum foil or a titanium foil with a smooth surface, these may also be used upon subjecting the surface thereof to roughening treatment by way of embossing or etching processing. Note that, as the method of manufacturing an electrode, in addition to the method of adding a conductive supplement and binder to activated carbon and forming a sheet shape and bonding this to the collector, a method of forming the activated carbon into a slurry and applying this to the collector may also be used. As the application method, used may be the applicator method, gravure method, reverse roll method, extrusion (nozzle) method, dip method, and so on.

The separators S1, S2 are formed from a nonwoven fabric or a porous film containing, for example, polyolefin resin at a mass ratio of 10% or more. The polarizing electrode and the separator can also be bonded by applying pressure to a pair of polarizing electrodes under a temperature environment which is not less than the softening temperature of the polyolefin resin. As the separator, cellulose nonwoven fabric or nonwoven fabric of aramid fiber may also be used.

As the electrolytic solution, an aqueous solution and an organic solution are known. As the solvent of an organic electrolytic solution, known are propylene carbonate, ethylene carbonate, dimethyl carbonate, methyl ethyl carbonate, diethyl carbonate, γ-butyrolactone, dimethylformamide, sulfolane, acetonitrile, propionitrile, methoxyacetonitrile and the like, and, as the solute, known are ammonium salt, amine salt, amidine salt and the like.

Returning to FIG. 1 to FIG. 3, the structure of the electrochemical device 10 is explained.

In the electrochemical device 10, the lead 3 comprises a lead body 3A containing Al, and a metallic thin film 3a fixed to the tip of the lead body 3A. The metallic thin film 3a is fixed to the tip part of the lead body 3A, and bent at a side face position of the lead body 3A as the boundary. Moreover, with the example shown in FIG. 1, the metallic thin film 3a covers the upper and lower faces (XY plane) and the side face (YZ plane) of the lead body 3A. In addition, as shown in FIG. 2, predetermined areas (R3U, R3L) of the metallic thin film 3a are welded to the lead body 3A. Note that, although Al is the main component in the lead body 3A, trace amounts of impurities may be contained. The content rate of Al in the lead body 3A is at least 50 mass % or more, and is preferably 95 mass % or more when giving consideration to the electrical conductivity and the resistance properties against the electrolytic solution.

The metallic thin film 3a includes a thin film body 3a1 containing Ni, and a plating layer 3a2 containing Sn and covering at least an outer surface of the bent thin film body 3a1. The predetermined areas to be welded are R3U and R3L. The region to be welded is not the entire area of the metallic thin film 3a, and is only a partial area. Specifically, a specific area (an exposed area which is not covered by the plating layer 3a2 and which includes the predetermined areas R3U, R3L) of the inner surface of the bent thin film body 3a1 and the surface (XY plane) of the lead body 3A are in direct contact without intervention of the plating layer 3a2, and the exposed specific area and the surface of the lead body 3A are welded in the predetermined areas R3U, R3L.

A small space S exists between the inner surface in the vicinity of the bending axis of the metallic thin film 3a, and the lead body 3A, and some of the solder material enters the space S and the connection strength can be increased thereby.

The content rate of Ni in the thin film body 3a1 is at least 50 mass % or more and preferably 95 mass % or more when giving consideration to the point that the adhesion with Al is performed firmly. Moreover, the content rate of Sn in the plating layer 3a2 is decided in consideration of the affinity with the solder material and other matters, but with the electrochemical device of this example, the plating layer 3a2 contains 98±1 (mass %) of Sn and 2±1 (mass %) of Cu.±1 (mass %) is a tolerable error. In the foregoing case, there is an ameliorating effect in the solder wettability and the non-growth of whiskers.

The surface of the metallic thin film 3a includes a plating layer 3a2 containing Sn, and the metallic thin film 3a and the electrode pad E1 are fixed firmly via the solder material SD since the wettability with the solder material SD (refer to FIG. 8) is high. The solder material SD of FIG. 8 is in contact with both the plating layer 3a2 and the electrode pad E1. Here, since Ni is contained in the thin film body 3a1 on which the plating layer 3a2 shown in FIG. 2 and FIG. 3 is formed, Ni and Sn are bonded firmly.

Moreover, since the solder material SD of FIG. 8 can crawl up (remain on the upper face when the solder material is caused to drip from above) to the upper face (XY plane in the positive direction of the Z axis) of the outer surface of the bent metallic thin film 3a, the fixation strength between the electrode pad E1 and the metallic thin film 3a can be further increased. Specifically, Al possesses properties of repelling the melted solder material, and, when the side face of the Al lead body 3A is exposed, such exposed face becomes an obstacle and the solder material SD is unable to crawl up any higher, and the solder material SD cannot be applied in the form of being pressed from the upper side. However, with the structure according to the foregoing embodiment, since the Al side face of the lead body 3A is not exposed, the foregoing drawback can be resolved, and a firm fixed state can be formed.

When referring to FIG. 2, although the area in which the plating layer 3a2 of the metallic thin film 3a is not formed (area long the center line CL in the longitudinal direction before bending (refer to FIG. 4)) is welded to the lead body 3A containing Al, since Ni and Al can be welded firmly, the metallic thin film 3a and the lead body 3A are also fixed firmly. Accordingly, it is possible to significantly increase the fixation strength between the electrode pad E1 (FIG. 8) and the lead 3.

Moreover, with the electrochemical device 10 of this example, the metallic thin film 3a is welded to both the upper and lower faces of the lead body 3A as shown in FIG. 2. Thus, since the metallic thin film 3a and the lead body 3A are welded at both the upper and lower faces, the fixation strength thereof can be enhanced.

In addition, when referring to FIG. 2, the dimension Xa of the bent metallic thin film 3a in the longitudinal direction (X axis direction) of the lead is preferably 1 mm or more. If the dimension Xa is less than 1 mm, the bond strength with the electrode pad based on soldering tends to deteriorate, and bond strength required for the connection can be obtained if the dimension Xa is 1 mm or more, especially if it is 2 mm or more Note that the foregoing dimension is preferably 5 mm or less, and sufficient connection strength can be obtained in the foregoing case. Moreover, the ratio ra (=XA/Xa) of the dimension Xa to the dimension XA of the lead 3 from the boundary position with the outer package 1 to the tip position of the lead 3 in the X axis direction is preferably 1.2 or more. If the ratio ra of the dimension is less than 1.2, the lead 3 may come in contact with the outer package and damage the resin layer of the outer package surface, and this tends to increase the short circuit failure rate.

Figure 4:
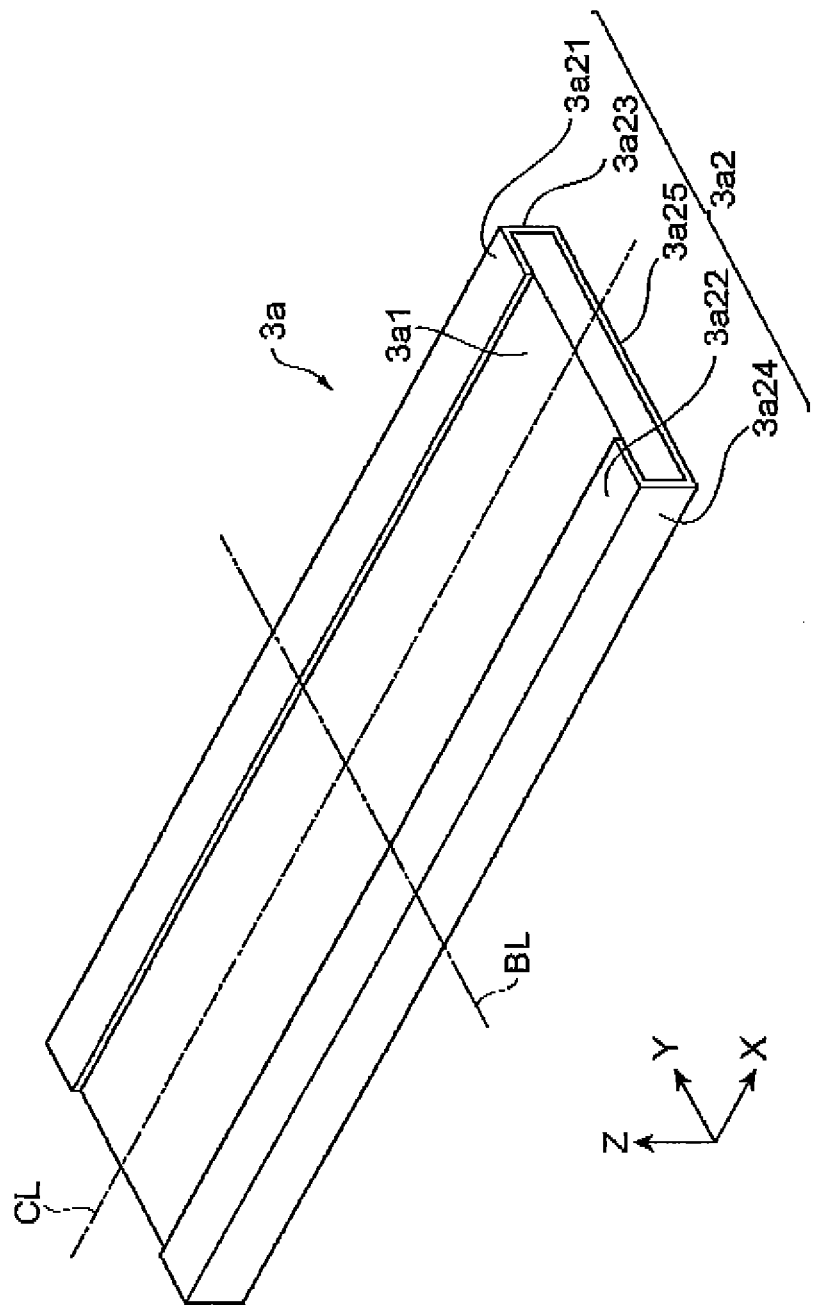

FIG. 4 is a perspective view of the metallic thin film 3a before bending.

To explain the plating layer 3a2 (including the plating layers 3a21, 3a22, 3a23, 3a24, 3a25), strip-shaped plating layers 3a21, 3a22 are formed along the longitudinal direction of the thin film body 3a1 on the inner surface of the thin film body 3a1 (after bending) in the vicinity of the opposite end positions of the bent metallic thin film 3a in the bending axis BL (Y axis) direction (areas in which the width of the metallic thin film 3a in the bending axis BL direction from the respective side faces is within the range of 1% to 20%).

Figure 5A:
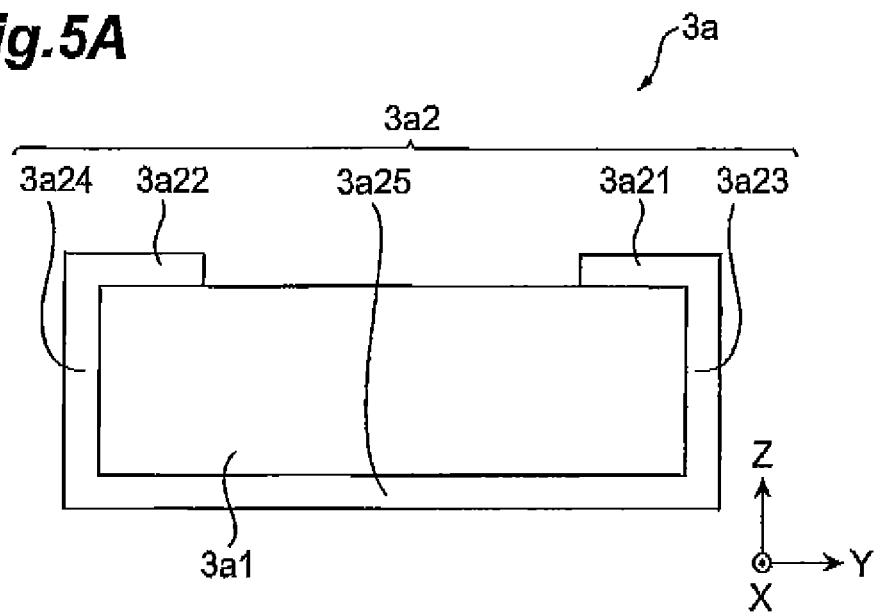
Figure 5B:
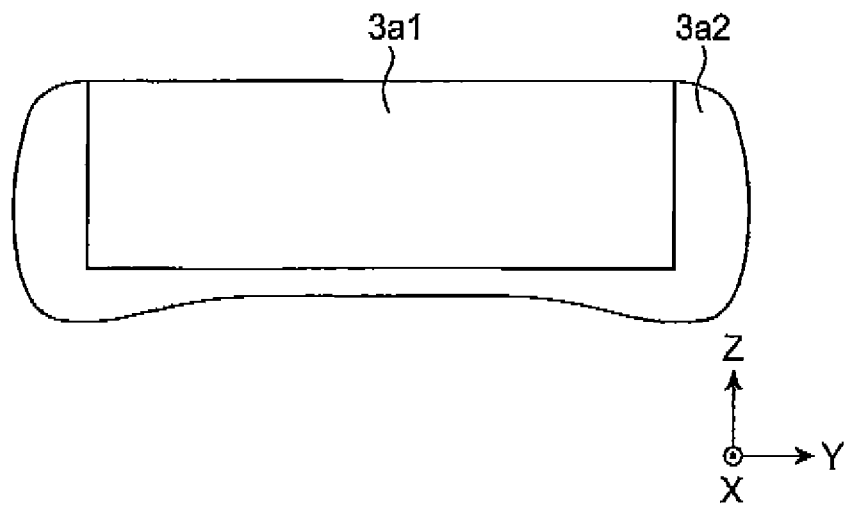

FIG. 5A shows the YZ cross section of the metallic thin film 3a. As a result of forming the plating layers 3a21, 3a22 in the vicinity of the opposite end positions (opposite end positions of the lead in the width direction) in the bending axis BL (Y axis) direction as shown in FIG. 4, the contour of the cross section shape of the plating layer 3a2 (cross section shape that is perpendicular to the longitudinal direction of the lead (YZ cross section)) acquires linearity in comparison to the case (B) of not forming the same. In FIG. 5B, the plating layers 3a21, 3a22 corresponding to FIG. 5A are not formed, and the plating layer in the vicinity of the opposite end positions is rounded and thickened. Meanwhile, with the shape of FIG. 5A, the plating layers 3a23, 3a24 of the side face have a uniform thickness and the contour thereof possesses linearity in the YZ cross section, and are roughly orthogonal to the contour of the plating layer 3a25 on the rear face side. Accordingly, with the shape of FIG. 5A, the product deviation can be reduced since variation in the thickness of the plating layer 3a2 will decrease, and it is thereby possible to provide an electrochemical device of stable quality.

The formation of this kind of plating layer can be performed using methods which are generally well known. The method of forming a plating layer can be generally classified into alkaline, acidic and neutral plating baths.

An alkaline plating bath is configured from potassium stannate or sodium stannate, and potassium hydroxide or sodium hydroxide. When electrodeposition is performed from quadrivalent tin and reaction occurs at a temperature of roughly 70° C., a stable plating layer is formed. Note that the experiments of the Examples described later adopted an alkaline plating bath using an aqueous solution of potassium stannate and potassium hydroxide as the plating solution.

An acidic plating bath is configured from tin sulfate, tin fluoroborate or the like.

Tin chloride is used for a neutral plating bath.

Depending on the degree of adhesion that is required, there are cases of forming copper or nickel plating in a thickness of 1 to 10 μm as the plating surface treatment. As measures against whiskers, there are cases where, after the plating process, melting/heating treatment is preformed or heating is performed at approximately 180° C. for approximately 1 hour.

Moreover, the thickness (average value) of the plating layer 3a2 is 0.5 μm or more and 10 μm or less. Specifically, if the thickness is less than 0.5 μm, defects (pinholes) may arise in the plating layer, and, if the thickness exceeds 10 μm, it tends to interfere with the welding. If the thickness of the Sn plated layer 3a2 is roughly 2 μm, then the solder wettability becomes favorable. The solder wettability is defined, for example, based on the standard (JESD22-B102E) of the reliability test of individual semiconductor electronic components conducted by the standardization organization Solid State Technology Association (JEDEC). With a tin plating layer formed on a thin film prepared under the foregoing conditions, a solder layer can be formed on 95% or more of the solder dipping area based on the following conditions; for instance, soldering temperature of 245° C., dip speed of 1.8 mm/sec, dip time of 3 seconds, and dip depth of 2 mm.

Moreover, in cases where the thickness of the Ni thin film body 3a1 is approximately 100 μm, if the thickness of the Sn plated layer 3a2 exceeds 10 μm, the bending portion is subject to stress and there are case where cracks occur at the interface of the Ni thin film body 3a1 and the Sn plated layer 3a2. These cracks tend to deteriorate the bond strength. Moreover, whiskers tend to arise when much stress remains in the Sn plated layer 3a2, and, consequently, a short circuit tends to occur in the vicinity of the terminal. As a result of mounting the metallic thin film 3a including the Sn plated layer 3a2 on the Al lead body 3A, the solder wettability (fillet formability) can be improved significantly.

In addition, the thickness of the thin film body 3a1 is preferably 50 μm or more and 500 μm or less. If the thickness of the thin film body 3a1 falls below 50 μm, in the case of forming the foregoing plating layer structure, an adhesive tape is affixed to the non-plated area (area along the center line CL in FIG. 4) of the thin film body 3a1, plating is subsequently performed, and the adhesive tape is peeled thereafter at an appropriate timing, but the thin film body 3a1 oscillates during the foregoing process and wrinkles, kinks, crimps and the like tend to form on the thin film body, and, since such defects cannot be controlled, an error occurs in the quality of the product. Moreover, if the thickness of the thin film body 3a1 exceeds 500 μm, this is undesirable since a phenomenon occurs where bonding with the lead becomes difficult. The present invention can inhibit the foregoing defects by setting the thickness of the thin film body to be within the foregoing range.

As described above, since the bonding (ultrasonic fusion) of the Ni tab (metallic thin film) of the Sn plated surface and the Al lead body 3A is difficult, plate processing is not performed to the bonding plane. Although it is advantageous to cover the entire side face of the metallic thin film 3a with the Sn plated layer in terms of forming a fillet, a certain level of effect can be yielded even if the Ni substrate is exposed. The Sn plate processing is performed in succession and a required amount (for example, roughly 20 mm) is used by being cut before being bonded to the Al lead body 3A. Thus, although the Sn plated layer does not exist in the cut plane, there is no problem since this portion does not affect the formation of a fillet.

FIG. 8 is the XZ cross section of the circuit board which is configured by the foregoing electrochemical device 10 being mounted on a substrate. In order to clarify the features, the portion of the outer package 1 is shown as a side face and not as a cross section.

This circuit board comprises a substrate SB comprising an electrode pad E1 and on which the electrochemical device 10 is mounted. The main material of the substrate SB is an insulating material, and the electrode pad E1 is formed on the surface thereof. Various electronic components can be mounted on the substrate SB, but this example only shows the portion of the electrochemical device 10, which is the feature of this example.

This circuit board comprises a double-sided adhesive tape 4 which is interposed between the rear face of the outer package 1 and the substrate SB, and a solder material SD which is interposed between the electrode pad E1 and the metallic thin film 3a, and which reaches an outer upper face of the metallic thin film 3a.

In the foregoing case, as described above, since the lead 3 and the electrode pad E1 are firmly fixed and the rear face of the outer package 1 and the substrate SB are also firmly fixed with the double-sided adhesive tape 4, obtained is a circuit board that is resistant to oscillation.

Moreover, with this circuit board, the solder material SD contains Sn and Cu. Since this kind of material has favorable affinity with Sn contained in the plating layer 3a2 (refer to FIG. 4), the wettability of the solder material SD will increase. However, since Cu is contained, the melting point of the solder decreases, and effects are yielded in that the solder workability is improved and the solder wettability is improved. Moreover, the solder material more preferably contains trace amounts of Ag. In the foregoing case, an effect is yielded in that the durability after the solder welding will improve. The ratio (mass percent ratio) of the respective elements in the solder material SD in this example is as shown below, and a variation of ±1 (mass %) is tolerated in the respective numerical values (provided, however, that the ratio of Cu>0 mass %).

Sn:Cu:Ag=96.5 (mass %):0.5 (mass %):3 (mass %)

The method of assembling the foregoing lead is now explained.

Figure 6:
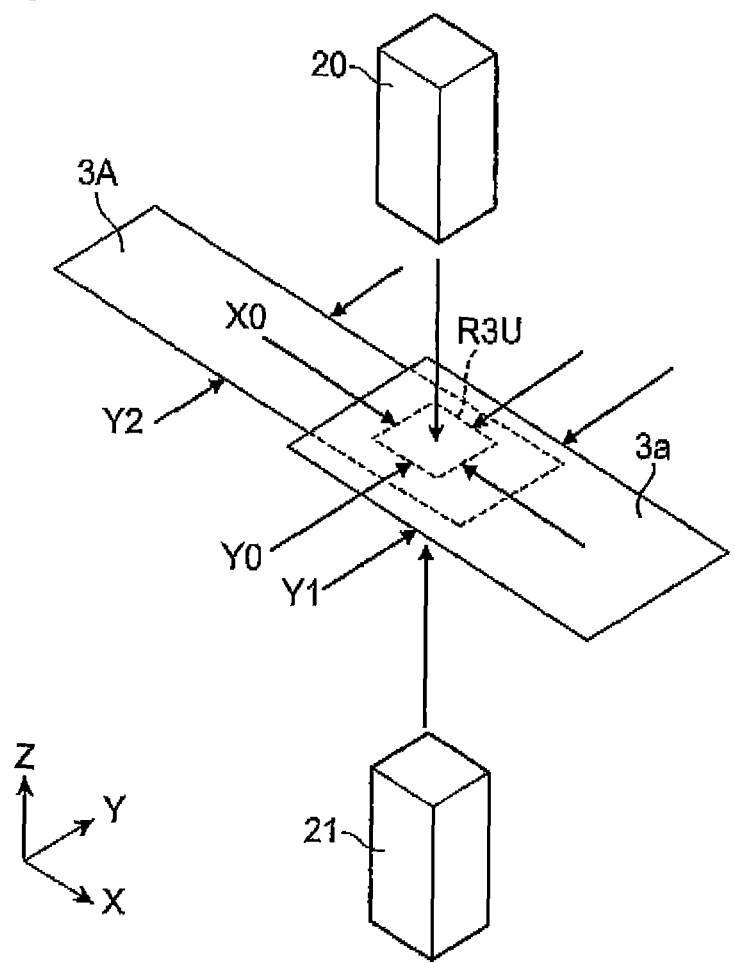
Figure 12A:
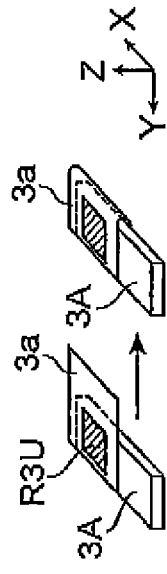
Figure 12B:
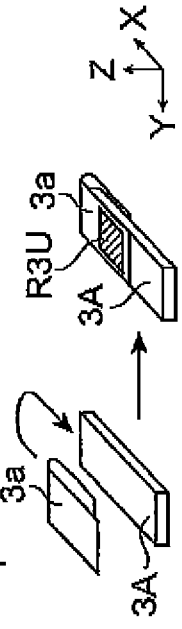
Figure 12C:
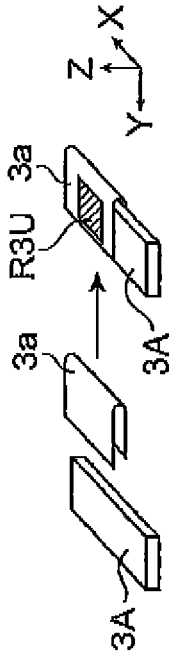
Figure 12D:
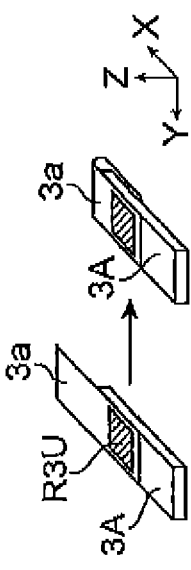
Figure 12E:
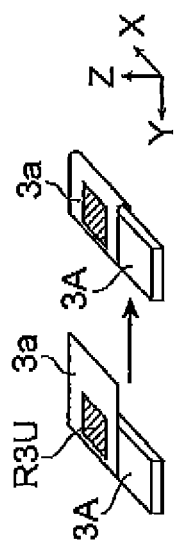
Figure 12F:
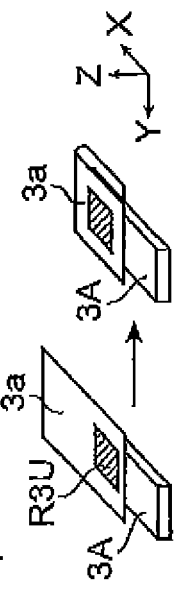

FIG. 6 is a perspective view showing the welding process of the lead body and the metallic thin film.

The lead body 3A and the metallic thin film 3a are prepared, and areas are partially superposed so that the longitudinal directions thereof coincide with the X axis. The width Y2 of the lead body 3A in the Y axis direction, the width Y1 of the metallic thin film 3a, and the width Y0 of the welding area R3U are constant along the X axis, but the width Y0 of the welding area R3U is smaller than the width Y2 of the lead body 3A, and, as a general rule, the welding area R3U does not overlap with the plating layers 3a21, 3a22 (refer to FIG. 4) positioned at the opposite ends in the Y axis direction.

The width Y2 of the lead body 3A in the Y axis direction is smaller than the width Y1 of the metallic thin film 3a, and, although the width Y2 of the lead body 3A is shorn to be smaller than the width. Y1 of the metallic thin film 3a in FIG. 6, these widths may also be the same. Ultrasonic vibrator heads 20, 21 for performing ultrasonic welding are positioned at the vertical position in the thickness direction, and, by oscillating an oscillator that is mechanically connected to at least one of such ultrasonic vibrator heads 20, 21, the welding area R3U that comes into contact with the ultrasonic vibrator heads 20, 21 will melt, and the lead body 3A made of Al and the lower face exposed area (Ni) of the metallic thin film 3a become fused.

FIG. 7 is a diagram showing the method of fixing the lead body and the metallic thin film.

As the foregoing fixing method, considered may be the method shown in FIG. 7Aa to FIG. 7Ae (hereinafter referred to as the "bend-type manufacturing method") and the method shown in FIG. 7Ba to FIG. 7Bc (hereinafter referred to as the "cover-type manufacturing method").

The method (A) is foremost explained. The process shown in FIG. 6 is illustrated in FIG. 7Aa. In this process, the lead body 3A and the metallic thin film 3a are subject to ultrasonic welding and thereby physically and electrically connected. Next, as shown in FIG. 7Ab, the lead body 3A and the metallic thin film 3a are pinched with jigs 23, 22, and, as shown with the arrow of FIG. 7Ab, the metallic thin film 3a that is protruding from the jigs is bent with the Y axis as the bending axis. The positive direction end of the X axis of the jigs 23, 22 is parallel to the Y axis, and these positive direction ends coincide with the position of the positive direction end of the X axis of the lead body 3A. The cross section shape of the lower jig 23 is a right triangle in the XZ plane, and its inclined face is inclined so as to form an acute angle relative to the X axis (angle of the jig is 90 degrees or less (particularly around 30 degrees)).

Accordingly, when the metallic thin film 3a is bent by being pressed against the inclined face of the jig 23, as shown in FIG. 7Ac, the metallic thin film 3a is bent with the Y axis as the bending axis. Next, as shown in FIG. 7Ad, by removing the lower jig 23 and pressing the floating metallic thin film 3a in the direction (Z axis positive direction) of the arrow in FIG. 7Ad, the metallic thin film 3a will become completely bent and contact the rear face of the lead body 3A. Finally, as shown in FIG. 7Ae, the lead body 3A and the metallic thin film 3a are subject to ultrasonic fusion once again. This ultrasonic fusion process is the same as the process shown in FIG. 6 and FIG. 7Aa excluding the point that the metallic thin film 3a is bent. Based on the foregoing process, the lower welding area R3L (refer to FIG. 2) is formed, the thin film body 3a1 of the metallic thin film 3a and the lead body 3A are welded, and these become physically and electrically connected.

Note that, in the foregoing process, although the bending axis of the metallic thin film 3a is parallel to the Y axis in FIG. 7, this may also be parallel to the X axis as described later.

The method of FIG. 7Ba to FIG. 7Bc is now explained. With this method, foremost, as shown in FIG. 7Ba, the metallic thin film 3a is preliminarily bent into a U-shape (or V-shape, or U-shape with straight angles) so that the plane with the exposed area where the plating layer is not formed is on the inward side in the metallic thin film 3a. Next, as shown in FIG. 7Bb, the bent metallic thin film 3a is placed over the tip of the lead body 3A and pinched so that the metallic thin film 3a covers the upper and lower faces and the side face of the lead body 3A. The bending axis of the metallic thin film 3a is parallel to the Y axis in FIG. 7Bb, but this may also be parallel to the X axis as described later. Finally, as shown in FIG. 7Bc, ultrasonic fusion is performed according to the same method shown in FIG. 7Ae. Based on the foregoing process, the upper and lower welding areas R3U, R3L (refer to FIG. 2) are formed, the thin film body 3a1 of the metallic thin film 3a and the lead body 3A are welded at both the upper and lower positions, and these become physically and electrically connected.

Experiments were conducted for measuring the mounting strength regarding the foregoing electrochemical device.

In this example, the EDLC was manufactured according to the following procedures. Foremost, activated carbon and a conductive assistant, a binder (PVDF: polyvinylidene fluoride) and a solvent (NMP: N-methylpyrrolidone) were mixed to prepare paint, and this was applied to the collector foil (aluminum foil) and dried, and an electrode sheet to become the electrode terminal of the capacitor was thereby obtained. This electrode sheet was punched out into a size of 12 mm×17 mm, and laminated so that the electrode surfaces face each other via a separator. An Al lead (aluminum: thickness 100 μm) was ultrasonic-welded to the electrode extraction part of the respective foils to obtain a laminate with an aluminum lead. Two such laminates were placed in an aluminum laminated foil configuring the outer package via PP (polypropylene) and three sides were sealed, and, after pouring in an electrolytic solution, the final one side was sealed to obtain an EDLC. The Al lead tip was prepared as with the following example. The evaluation was performed by disposing a 5 mm×3 mm electrode pad E1 on a substrate SB made of glass epoxy (Flame Retardant Type 4) (1.6 mm thickness) and connecting the lead tip part of the EDLC to the solder material SD, and measuring the strength thereof by conducting a horizontal tensile strength test.

FIG. 9 is a diagram explaining the experimental method of the Examples.

The lead 3 of the electrochemical device 10 was disposed on the electrode pad E2 of the circuit board SE, and the solder material SD was melted and caused to drip onto the lead 3 and subsequently cooled to fix the same. Note that the electrochemical device 10 was pulled in the arrow direction (negative direction of the X axis) of FIG. 9 to measure the tensile strength in the horizontal direction without using the adhesive tape shown in FIG. 8.

FIG. 10 is a diagram explaining the experimental method of Comparative Example 1.

With Comparative Example 1, in comparison to the Examples, a metallic thin film 3b in which a non-bent Ni thin film body was subject to Sn plating was used in substitute for the bent metallic thin film 3a, and this was connected to the lower face of the lead body 3A based on ultrasonic fusion as with the foregoing method, and the product thereof was used. The solder material SD is interposed between the metallic thin film 3b and the electrode pad E1, but it was not able to crawl up the exposed side face of the lead body 3A made of aluminum, and, when the melted solder material SD was caused to drip from above, the solder material SD moved to the lower side of the lead body 3A and then solidified. This electrochemical device 10 was also pulled in the arrow direction (negative direction of the X axis) of FIG. 10 to measure the tensile strength in the horizontal direction.

FIG. 11 is a diagram explaining the experimental method of Comparative Example 2.

With Comparative Example 2, in comparison to Comparative Example 1, the tip of the metallic thin film 3b is mounted on the tip of the lead body 3A so as to protrude therefrom, and a melted solder ball 3c was caused to drip onto the tip of the metallic thin film 3b and subsequently cooled and fixed, and the solder ball 3c and the electrode pad E1 were fixed with the solder material SD. The solder material SD can be positioned between the solder ball 3c and the electrode pad E1 and on the upper face of the solder ball 3c, but it could not crawl up the exposed side face of the metallic thin film 3b, and, when the melted solder material SD was caused to drip from above, the solder material SD became collected in the vicinity of the solder ball 3c and then solidified. This electrochemical device 10 was also pulled in the arrow direction (negative direction of the X axis) of FIG. 11 to measure the tensile strength in the horizontal direction.

FIG. 12 is a diagram explaining the structure and mounting method of the metallic thin film of the respective Examples.

EXAMPLE 1

In Example 1 (Example 1-1 to Example 1-7), the width Y2 of the lead body 3A and the width Y1 of the metallic thin film 3a (refer to FIG. 6) are the same, the bending axis of the metallic thin film 3a is parallel to the Y axis, and the metallic thin film 3a is covering the side face of the lead body 3A of the tip in the X axis direction in the lead tip part. The respective dimensions were as follows with reference to FIG. 2 and FIG. 6.

X0=2 mm
Y0=2 mm
Y1=3 mm
Y2=3 mm
XA=5 mm
Xa=3 mm

Note that the thickness of the thin film body 3a1 is 100 μm, and the thickness of the Sn plated layer 3a2 is 0.3 μm (Example 1-1), 0.5 μm (Example 1-2), 2 μm (Example 1-3), 5 μm (Example 1-4), 7 μm (Example 1-5), 10 μm (Example 1-6), and 10.5 μm (Example 1-7). Note that Ea 2000 manufactured by Branson was used for the ultrasonic fusion (welding energy=12.0 J, welding time=0.1 sec), and ultrasonic fusion was performed respectively from above and below before and after the bending of the metallic thin film.

This method is the method of mounting the metallic thin film 3a on the Al lead body 3A by disposing the metallic thin film 3a so that it partially does not overlap with the tip of the Al lead body 3A, thereafter connecting these components, bending such non-overlapping portion so as to encompass the Al lead body 3A, and once again connecting to the Al lead body 3A the metallic thin film 3a of the face that is not connected to the Al lead body 3A.

EXAMPLE 2

The width Y1 of the metallic thin film before bending 3a is greater than the width Y2 of the lead body 3A, the bending axis of the metallic thin film 3a is parallel to the X axis, and the metallic thin film 3a is covering one side face of the lead body 3A along the Y axis direction in the lead tip part. X0=2 mm, Y0=2 mm, Y1=3.5 mm, Y2=3 mm, XA=5 mm, and Xa=1.5 mm. The other conditions are the same as Example 1-3, but the area that is not formed with the plating layer (area in the vicinity of the center line CL; FIG. 4) was formed to extend in the Y axis direction.

EXAMPLE 3

The width Y1 of the metallic thin film before bending 3a is greater than the width Y2 of the lead body 3A, the bending axis of the metallic thin film 3a is parallel to the Y axis, and the metallic thin film 3a is covering the side face of the lead body 3A of the tip in the X axis direction in the lead tip part. X0=2 mm, Y0=2 mm, Y1=3.5 mm, Y2=3 mm, XA=5 mm, and Xa=3 mm. The other conditions are the same as Example 1-3.

EXAMPLE 4

The width Y1 of the metallic thin film before bending 3a is greater than the width Y2 of the lead body 3A, the bending axis of the metallic thin film 3a is parallel to the X axis, and the metallic thin film 3a is covering one side face of the lead body 3A along the Y axis direction in the lead tip part, but the tip of the metallic thin film 3a is protruding farther than the lead body 3A along the positive direction of the X axis.

X0=2 mm
Y0=2 mm
Y1=3.5 mm
Y2=3mm
XA=5.5 mm
Xa=3.5 mm
Dimension protruding in the X axis direction=0.5 mm
The other conditions are the same as Example 2.

EXAMPLE 5

The structure is the same as the structure shown in Example 1, but Examples 5 and 6 are different in that the cover-type manufacturing method was used rather than the bend-type manufacturing method used in Examples 1 to 4. Specifically, with the Y axis as the bending axis, the metallic thin film 3a that was preliminarily bent into a U-shape was placed over the lead body 3A from the tip direction, and ultrasonic fusion was thereafter similarly performed from above and below as described above so as to cover the side face of the lead body 3A of the tip of the X axis direction with the metallic thin film 3a. X0=2 mm, Y0=2 mm, Y1=3 mm, Y2=3 mm, XA=5 mm, and Xa=3 mm. The other conditions are the same as Example 1-3. The method of Examples 5 and 6 is the method of mounting the metallic thin film 3a on the Al lead body 3A by placing the bent metallic thin film 3a over the Al lead body 3A with the face including an area to which Sn plating was not performed in advance on the inward side, and thereafter connecting the Al lead body and the metallic thin film 3a from above and below at once.

EXAMPLE 6

The structure is the same as the structure shown in Example 2, but in this example the cover-type manufacturing method is used. Specifically, with the X axis as the bending axis, the metallic thin film 3a that was preliminarily bent into a U-shape was placed over the lead body 3A from the width direction, and ultrasonic fusion was thereafter similarly performed from above and below as described above so as to cover one side face of the lead body 3A along the Y axis direction with the metallic thin film 3a. X0=2 mm, Y0=2 mm, Y1=3.5 mm, Y2=3 mm, XA=5 mm, and Xa=1.5 mm. The other conditions are the same as Example 2.

FIG. 13 is a table showing the experimental results. The number of samples n is 100 samples, and the average value (N) and the standard deviation (N) of the horizontal tensile strength are shown.

In Examples 1 to 6, the lead did not rupture or come off even when force of 25 N was applied in the horizontal direction. Moreover, as shown in Example 1-1 to Example 1-7, even when the plating thickness was changed within the range of 0.3 μm or mare and 10.5 μm or less, there was no change in the tensile strength in the horizontal direction. Note that 25 N is the measurement limit of the measuring device. Meanwhile, with Comparative Examples 1 and 2, the lead came off torn the electrode pad E1 when force of 7.8 N and force of 17.3 N were applied, respectively. There was also variation in Comparative Examples 1 and 2.

With respect to the results concerning the status of connection of the lead, in Example 1-1, 94 samples were non-defective among the 100 samples, but 6 samples contained parts where the solder wettability was insufficient (evaluation result of status of connection: Δ). In Example 1-7, 95 samples were non-defective among the 100 samples, but 5 samples contained parts with cracks at the interface of the thin film body 3a1 made of Ni foil and the Sn plated layer 3a2 (evaluation result of status of connection: Δ). In Comparative Example 1, 98 samples among the 100 samples contained parts where the solder wettability was inferior (evaluation result of status of connection: ×). In Comparative Example 2, 80 samples among the 100 samples contained parts where the solder wettability was inferior (evaluation result of status of connection: ×). In other Examples 1-2 to 1-6 and Examples 2 to 6, all samples were non-defective, and no parts could be acknowledged where the solder wettability was insufficient or parts with cracks as those described above (evaluation result of status of connection: ○).

Note that the expression "solder wettability was insufficient" specifically refers to a state where, after the melted solder material SD is caused to drip from above, it does not sufficiently spread to the upper face of the metallic thin film 3a, and only covers 50% or less of the upper face. This is caused by the defects (pinholes) of the plating layer, and, in Example 1-1, numerous defects existed in the plating layer. The expression "solder wettability was inferior" specifically refers to a state where, after the melted solder material SD is caused to drip from above, it does not sufficiently spread to the upper face of the metallic thin film 3a, and only covers 25% or less of the upper face, or does not cover the upper face at all. In Comparative Example 1, the upper face of the lead is aluminum, and the solder material SD that was caused to drip repelled and did not remain on the upper face. In Comparative Example 2, the solder material SD solidified in the vicinity of the solder ball 3c, but since it did not spread fluently to the upper face of the lead 3b, the status of connection was inferior. Moreover, the expression "with cracks at the interface" specifically refers to a state where one to several cracks with a length of roughly 100 μm and a width of roughly 10 μm were observed at the interface of the thin film body 3a1 and the Sn plated layer 3a2. In particular, the generation of cracks is noticeable at the bent portion of the metallic thin film 3a.

Upon considering these results, with the structure of Comparative Example 1, it is considered that the solder material was repelled by Al and unable to form a sufficient fillet, and the reliability is insufficient. Meanwhile, with the structure of Examples 1 to 6 in which the metallic thin film (Ni tab) was bent and formed on the Al lead body, it was possible to form a clean fillet from the upper face of the metallic thin film to the electrode pad and obtain sufficient connection strength, and sufficient reliability was thereby obtained.

In cases where the metallic thin film 3a was mounted on the tip part of the lead body 3A, if the width of the metallic thin film 3a is greater than the lead body 3A as with Examples 2, 3, 4, and 6, not only will the volume of the solder material (fillet) SD increase, it becomes easier to form a fillet on the side face portion of the width direction. As a result of a fillet being formed at the three locations (three directions) of the tip part in the X axis direction, side face portion in the Y axis direction, and the lower face region of the lead, the tensile strength and torsional strength in the respective directions will increase. Since the width of the metallic thin film 3a is greater than the width of the lead body 3A, it becomes easier for the solder material to crawl onto the metallic thin film 3a of the portion protruding from the lead body 3A in the lateral direction, and the tensile strength and the torsional strength will thereby increase.

In cases where the metallic thin film 3a is mounted on the side face portion of the lead body 3A, if the metallic thin film 3a is protruding farther than the lead body 3A as with Example 4, it becomes easier to form a fillet on the tip part thereof. Thus, since a fillet is formed in the foregoing three directions, the tensile strength and torsional strength in the respective directions will increase.

As described above, according to the structure of the respective Examples, the structure becomes resistant to the anticipated load (pulling and twisting) that will be applied to the EDLC after the lead is bonded.

With the ultrasonic fusion of the lead body 3A and the metallic thin fin 3a, preferably the upper metallic thin film 3a and the lower lead body 3A are connected firmly. When handling a high current (for example, 1 ampere or higher), the contact resistance between the lead body 3A and the metallic thin film 3a will generate an extremely significant loss. Thus, the lead body 3A and the metallic thin film 3a need to be firmly fused from above and below so as to reduce the contact resistance thereof as much as possible.

Moreover, with Comparative Example 2, since the solder ball as the preliminary soldering is uneven, the fillet that is formed also becomes uneven (in certain cases only the bottom face), variation arises in the connection strength. Consequently, there is a possibility that problems may arise in the connection life in terms of long-term reliability. However, with the structure of Examples 1 to 6, stable connection strength can be ensured since it is possible to form a fillet on the plated surface. Accordingly, with the structure of the Examples, the connection life in terms of long-term reliability can be significantly improved.

As explained above, since a thin EDLC using a laminated outer package is demanded of solder connectability to a printed board, and a lead of the EDLC needs to satisfy both the resistance properties and electrical conductivity relative to the electrolytic solution, Al with inferior solder wettability was used, and it was not possible to improve the connection strength in this embodiment, it was possible to improve the fixation strength by using a bent metallic thin film. Since this method adopts processes with, superior reproducibility such as plating and fusion, automation can be realized easily, and this is also desirable in terms of productivity. As electronic components having this kind of a flat lead terminal shape, lithium ion batteries and electrolytic capacitors are know in addition to EDLC, and the present invention can also be applied to these components.

The electrochemical device of type B is now explained.

In cases of the foregoing conventional technology, with a lead made of aluminum, there is a problem in that the fixation strength between the electrode pad and the lead deteriorates since the wettability relative to the solder material is low.

The electrochemical device of type B was devised in view of the foregoing problem, and the object of this embodiment is to provide an electrochemical device and a circuit board capable of improving the fixation strength between the electrode pad and the lead.

In order to achieve the foregoing object, the electrochemical device of type B is an electrochemical device including a charger/discharger housed in an outer package, and a lead extending from the charger/discharger, wherein the lead has: a lead body containing Al; and a metallic thin film which is provided to a tip part of the lead body, and is bent at a side face position of the lead body as a boundary, and which covers upper and lower faces and a side face of the lead body, and in which a predetermined area is welded to the lead body, the metallic thin film includes: a thin film body containing Ni, and a plating layer containing Sn and covering at least an outer surface of the bent thin film body, and a specific area of an inner surface of the bent thin film body and a upper face of the lead body are directly in contact and welded in the predetermined area without the plating layer being disposed therebetween, and a lower face of the lead body is not welded to the thin film body. Note that, in cases of mounting the electrochemical device on a circuit board, the face positioned on the circuit board side in the lead body is referred to as the lower face, and the face that is on the opposite side is referred to as the upper face.

Since the surface of the metallic thin film includes a plating layer containing Sn and the wettability relative to the solder material is high, the metallic thin film and the electrode pad are firmly fixed via the solder material. Here, since Ni is contained in the thin film body on which the plating layer is formed, Ni and Sn are bonded firmly. Moreover, since the solder material can crawl up to the upper face of the outer surface of the bent metallic thin film, the fixation strength between the electrode pad and the metallic thin film can be further increased. The area where the plating layer of the metallic thin film is not formed is welded to the lead body containing Al, but since Ni and Al can be firmly welded, the metallic thin film and the lead body are also firmly fixed. Accordingly, it is possible to significantly improve the fixation strength between the electrode pad and the lead.

Note that, in the welding of metals, a concave-convex surface or uneven rough surface is formed in the welding area. The thin film body is welded only at the upper face of the lead body, and irregularities are formed on the upper face. However, since welding is not performed to the lower face of the lead body, the flatness of the thin film body positioned on the lower face side of the lead body is maintained. When the thin film body is flat as described above, the capillary action functions effectively, and it is easy for the solder material to enter the space between the thin film body and the electrode pad that is disposed thereunder. Accordingly, the resistance between the thin film body and the electrode pad will decrease. Moreover, the lower face of the lead body and the thin film body are not welded, and, since they are slightly separated, a small amount of the solder material also enters into such space. Accordingly, the resistance between the thin film body and the lead body will decrease, and the fixation strength is also enhanced.

Moreover, with the electrochemical device of type B, the plating layer is formed along a longitudinal direction of the thin film body on an inner surface of the thin film body in the vicinity of opposite end positions of the bent metallic thin film in a bending axis direction.

As a result of forming the plating layer in the vicinity of such opposite end positions (e.g.: opposite end positions of the lead in the width direction), the contour of the cross section shape of the plating layer (e.g.: cross section shape that is perpendicular to the longitudinal direction of the lead) will acquire linearity. In other words, the product deviation can be reduced since variation in the thickness of the plating layer will decrease, and it is thereby possible to provide an electrochemical device of stable quality.

Moreover, with the electrochemical device of the present invention, a thickness of the plating layer is 0.5 µm or more and 10 µm or less. Specifically, if the thickness is less than 0.5 µm, defects may arise in the plating layer, and, if the thickness exceeds 10 µm, it tends to interfere with the welding.

Moreover, with the electrochemical device of the present invention, a thickness of the thin film body is 50 µm or more and 500 µm or less. If the thickness of the thin film body falls below 50 µm, in the case of forming the foregoing plating layer structure, an adhesive tape is affixed to the non-plated area of the thin film body, plating is subsequently performed, and the adhesive tape is peeled thereafter at an appropriate timing, but the thin film body oscillates during the foregoing process and wrinkles, kinks, crimps and the like tend to form on the thin film body, and, since such defects cannot be controlled, an error occurs in the quality of the product. Moreover, if the thickness of the thin film body exceeds 500 µm, this is undesirable since a phenomenon occurs where bonding with the lead becomes difficult. The present invention can inhibit the foregoing defects by setting the thickness of the thin film body to be within the foregoing range.

Moreover, with the electrochemical device of the present invention, a dimension of the bent metallic thin film in a longitudinal direction of the lead is 1 mm or more.

If the foregoing dimension is less than 1 mm, the bond strength with the electrode pad based on soldering tends to deteriorate, and bond strength can be obtained if the dimension is 1 mm or more, especially if it is 2 mm or more. Note that the foregoing dimension is preferably 5 mm or less, and sufficient connection strength can be obtained in the foregoing case.

Moreover, with the electrochemical device of the present invention, the plating layer contains 98±1 (mass %) of Sn and 2±1 (mass %) of Cu.±1 (mass) is a tolerable error.

In the foregoing case, an effect is yielded in that the melting point of the solder decreases during solder welding, and bonding can be performed easily.

Moreover, when the width of the metallic thin film is greater than the width of the lead body, it becomes easier for the solder material to crawl onto the metallic thin film of the portion protruding from the lead body, and the tensile strength and the torsional strength will thereby increase.

Moreover, the circuit board of the present invention comprises any one of the foregoing electrochemical devices, a substrate on which the electrochemical device is mounted and which comprises an electrode pad, a double-sided adhesive tape which is interposed between a rear face of the outer package and the substrate, and a solder material which is interposed between the electrode pad and the metallic thin film, and which reaches an outer upper face of the metallic thin film.

In the foregoing case, since the lead and the electrode pad are firmly fixed and the rear face of the outer package and the substrate are also firmly fixed with the double-sided adhesive tape, obtained is a circuit board that is resistant to oscillation.

Moreover, with the circuit board of the present invention, the solder material contains Sn and Cu. In the case of this kind of material, since the affinity with Sn contained in the plating layer is favorable, the wettability of the solder material will increase. However, since Cu is contained, the melting point of the solder decreases during solder welding, and an effect is yielded in that bonding can be performed easily. Moreover, the solder material preferably contains trace amounts of Ag. In the foregoing case, an effect is yielded in that the durability after the solder welding will improve.

According to the electrochemical device and the circuit board of the present invention, superior reliability is yielded since the fixation strength between the electrode pad and the lead can be improved.

The electrochemical device of type B is now explained in detail.

Figure 15:
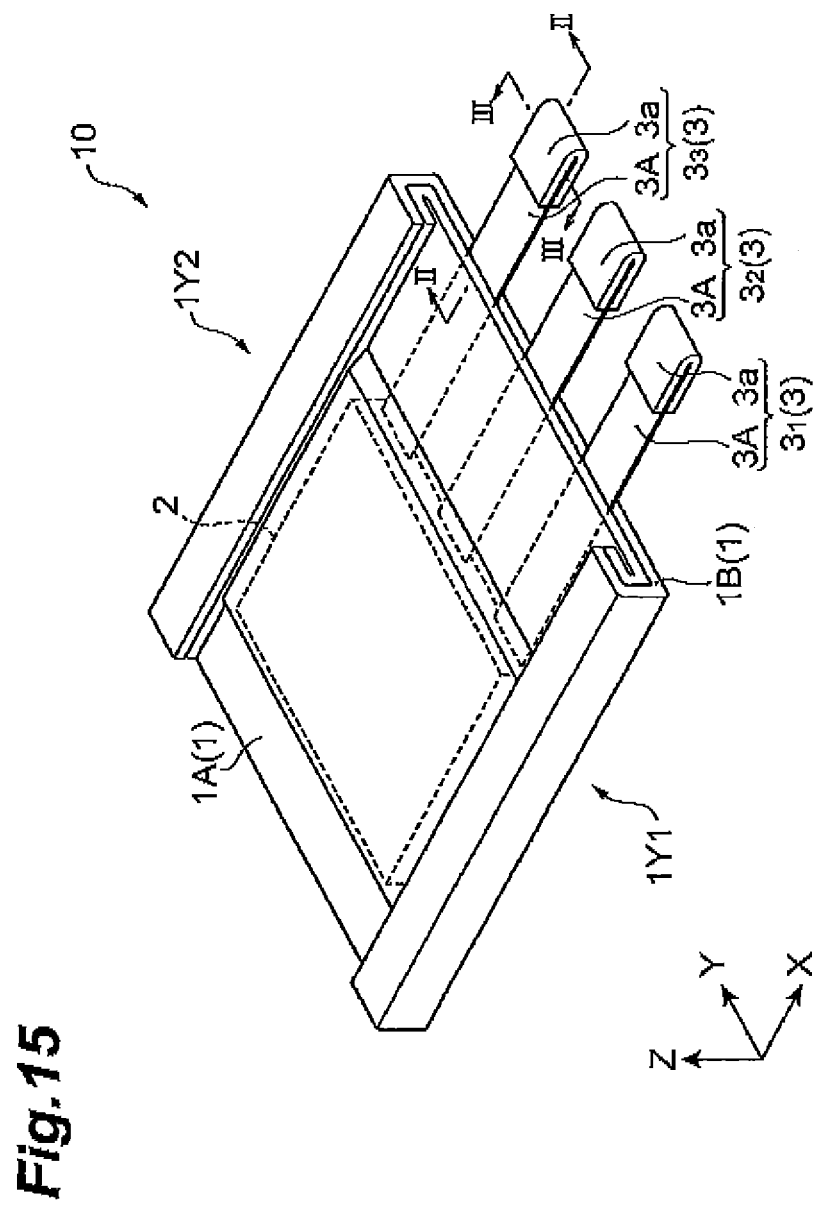
Figure 16:
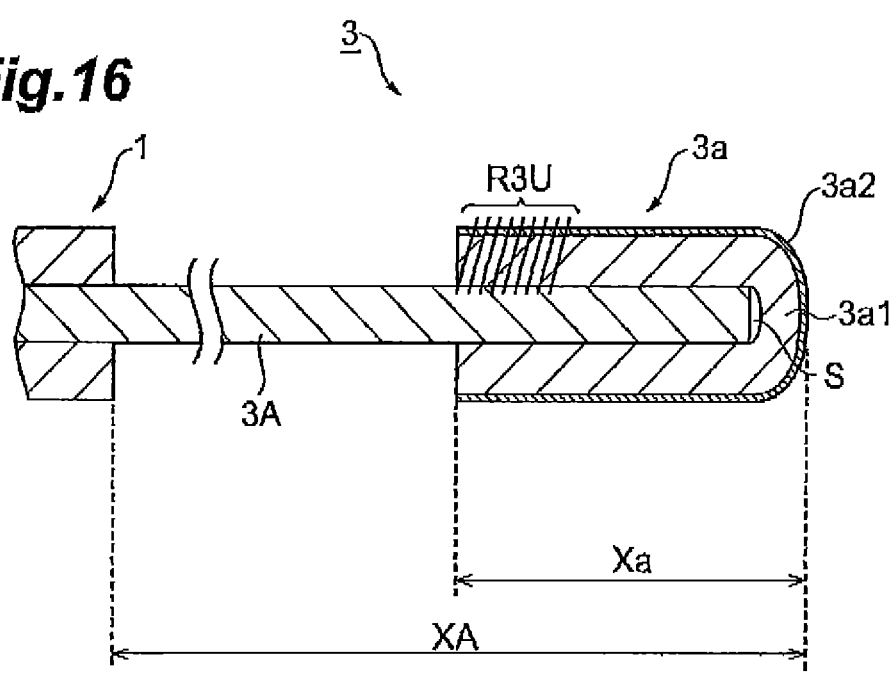
Figure 17:
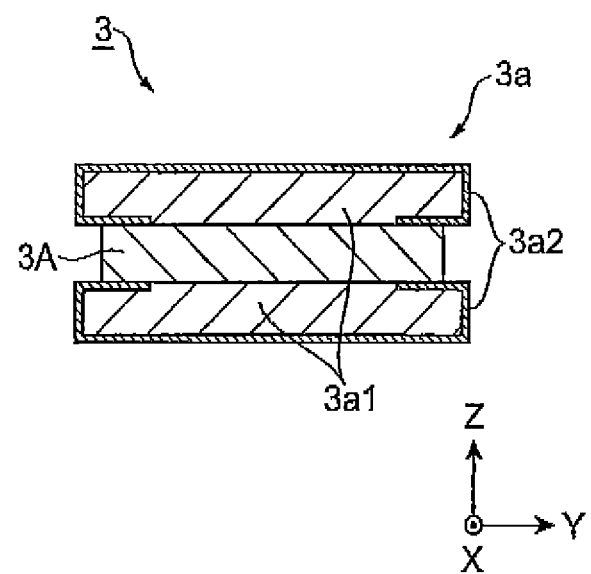

FIG. 15 is a perspective view of the electrochemical device, FIG. 16 is an arrow II-II cross section of the electrochemical device, and FIG. 17 is an arrow III-III cross section of the electrochemical device. Moreover, FIG. 22 an XZ cross section of the circuit board on which the electrochemical device is mounted.

The electrochemical device 10 includes a charger/discharger 2 housed in an outer package 1, and a plurality of leads 3 extending from the charger/discharger 2. The outer package 1 is configured by superposing a rectangular upper laminated sheet 1A and a rectangular lower laminated sheet 1B, and bonding the areas in the vicinity of the four sides of the periphery thereof The laminated sheets 1A, 1B are respectively formed by coating an inner surface of an aluminum thin film with a resin layer. A three dimensional Cartesian coordinate system as shown in FIG. 15 is set with the thickness direction of the outer package 1 as the Z axis, the width direction as the Y axis, and the length direction as the X axis. Regions 1Y1, 1Y2 in the vicinity of opposite ends of the outer package 1 in the Y axis direction are bent inward at the boundary line along the X axis, and the mechanical strength of the outer package 1 is thereby enhanced.

An electrolytic solution and the charger/discharger 2 as a battery element are disposed within hermetically-sealed internal space of the outer package 1. Via the lead 3, an electrical charge can be accumulated in the charger/discharger 2 and the accumulated electrical charge can also be discharged therefrom. Various structures may be used for the charger/discharger 2, but capacitors connected in series are used in this example. Specifically, the electrochemical device 10 in this case configures an EDLC (Electric Double Layer Capacitor).

Figure 28:
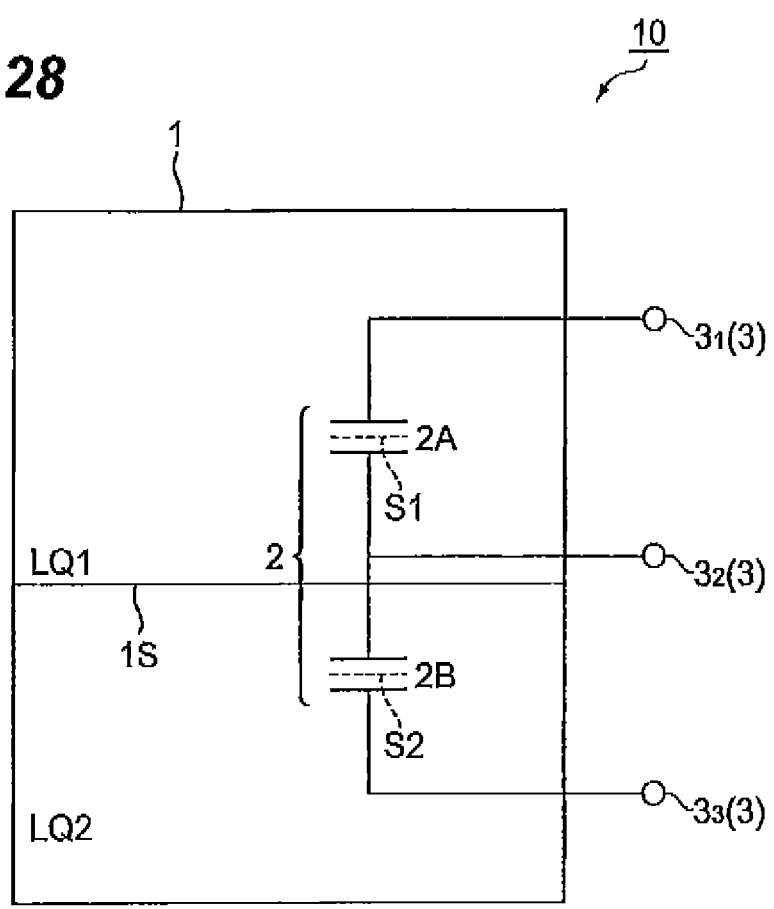

Here, the internal electrical circuit structure of the EDLC is shown in FIG. 28.

The charger/discharger 2 is configured by connecting a capacitor 2A and a capacitor 2B in series, a lead $3_2$ is electrically connected to the connection tip parts thereof, and a lead $3_1$ and a lead $3_3$ are electrically connected, respectively, to terminals which are different from the foregoing connection tip parts of the capacitor 2A and the capacitor 2B. The inside of the outer package 1 is partitioned into two storage parts with a sealant 1S made of polypropylene or the like, and the capacitor 2A and the capacitor 2B are separately housed in the respective storage parts. Electrolytic solutions LQ1, LQ2 are filled in the respective storage parts inside the outer package 1. The respective terminal electrodes configuring the capacitors 2A, 2B are configured by laminating an active material layer and a collector. Moreover, separators S1, S2 as insulating layers are respectively interposed between the respective terminal electrodes configuring the capacitors 2A, 2B. With an EDLC, electrical charges are aligned as a thin layer between the polarizing conductor and the electrolyte (solution), and electrical charge is accumulated by applying a bias therebetween. The center lead $3_2$ is used for controlling the potential in the connection tip parts of the capacitors 2A and 2B connected in series.

The active material layer is a polarizing electrode. The polarizing electrode is made of a porous material, and manufactured by mixing binder resin in activated carbon. As the binder resin, used may be a high molecular compound containing fluorine such as polytetrafluoroethylene and polyvinylidene fluoride, a rubber-based high molecular compound such as styrene-butadiene rubber, carboxymethyl cellulose, and so on. As needed, carbon black, carbon nanotubes, graphite particles or microfilaments may be added as a conductive assistant. During the manufacture process, these materials are applied to one side or both sides of the collector.

The collector is made of a metal foil. In addition to using an aluminum foil or a titanium foil with a smooth surface, these may also be used upon subjecting the surface thereof to roughening treatment by way of embossing or etching processing. Note that, as the method of manufacturing an electrode, in addition to the method of adding a conductive supplement and binder to activated carbon and forming a sheet shape and bonding this to the collector, a method of forming the activated carbon into a slurry and applying this to the collector may also be used. As the application method, used may be the applicator method, gravure method, reverse roll method, extrusion (nozzle) method, dip method, and so on.

The separators S1, S2 are formed from a nonwoven fabric or a porous film containing, for example, polyolefin resin at a mass ratio of 10% or more. The polarizing electrode and the separator can also be bonded by applying pressure to a pair of polarizing electrodes under a temperature environment which is not less than the softening temperature of the polyolefin resin. As the separator, cellulose nonwoven fabric or nonwoven fabric of aramid fiber may also be used.

As the electrolytic solution, an aqueous solution and an organic solution are known. As the solvent of an organic electrolytic solution, known are propylene carbonate, ethylene carbonate, dimethyl carbonate, methyl ethyl carbonate, diethyl carbonate, γ-butyrolactone, dimethylformamide, sulfolane, acetonitrile, propionitrile, methoxyacetonitrile and the like, and, as the solute, known are ammonium salt, amine salt, amidine salt and the like.

Returning to FIG. 15 to FIG. 17, the structure of the electrochemical device 10 is explained.

In the electrochemical device 10, the lead 3 comprises a lead body 3A containing Al, and a metallic thin film $3a$ fixed to the tip of the lead body 3A. The metallic thin film $3a$ is fixed to the tip part of the lead body 3A, and bent at a side face position of the lead body 3A as the boundary. Moreover, with the example shown in FIG. 15, the metallic thin film $3a$ covers the upper and lower faces (XY plane) and the side face (YZ plane) of the lead body 3A. In addition, as shown in FIG. 16, a predetermined area R3U of the metallic thin film $3a$ is welded to the upper face of the lead body 3A. Note that, although Al is the main component in the lead body 3A, trace amounts of impurities may be contained. The content rate of Al in the lead body 3A is at least 50 mass % or more, and is preferably 95 mass % or more when giving consideration to the electrical conductivity and the resistance properties against the electrolytic solution.

The metallic thin film $3a$ includes a thin film body $3a1$ containing Ni, and a plating layer $3a2$ containing Sn and covering at least an outer surface of the bent thin film body $3a1$. The predetermined area to be welded is R3U, and the area facing R3U is not welded. The region to be welded is not the entire area of the metallic thin film $3a$, and is only a partial area. Specifically, a specific area (an exposed area which is not covered by the plating layer $3a2$ and which includes the predetermined area R3U of the upper face) of the inner surface of the bent thin film body $3a1$ and the surface (XY plane) of the lead body 3A are in direct contact without intervention of the plating layer $3a2$, and the exposed specific area and the surface of the lead body 3A are welded in the predetermined area R3U.

A small space S exists between the inner surface in the vicinity of the bending axis of the metallic thin film $3a$, and the lead body 3A, and some of the solder material enters the space S and the connection strength can be increased thereby.

The content rate of Ni in the thin film body 3a1 is at least 50 mass % or more and preferably 95 mass % or more when giving consideration to the point that the adhesion with Al is performed firmly. Moreover, the content rate of Sn in the plating layer 3a2 is decided in consideration of the affinity with the solder material and other matters, but with the electrochemical device of this example, the plating layer 3a2 contains 98±1 (mass %) of Sn and 2±1 (mass %) of Cu.±1 (mass %) is a tolerable error. In the foregoing case, there is an ameliorating effect in the solder wettability and the non-growth of whiskers.

Figure 22:
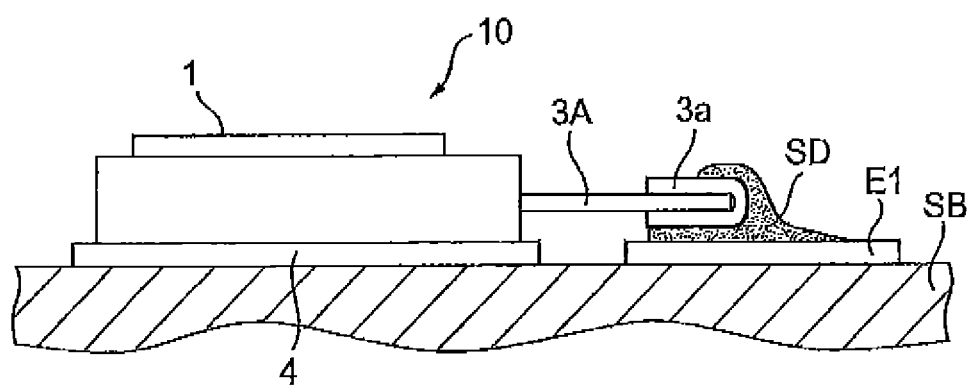

The surface of the metallic thin film 3a includes a plating layer 3a2 containing Sn, and the metallic thin film 3a and the electrode pad E1 are fixed firmly via the solder material SD since the wettability with the solder material SD (refer to FIG. 22) is high. The solder material SD of FIG. 22 is in contact with both the plating layer 3a2 and the electrode pad E1. Here, since Ni is contained in the thin film body 3a1 on which the plating layer 3a2 shown in FIG. 16 and FIG. 17 is formed, Ni and Sn are bonded firmly.

Moreover, since the solder material SD of FIG. 22 can crawl up (remain on the upper face when the solder material is caused to drip from above) to the upper face (XY plane in the positive direction of the Z axis) of the outer surface of the bent metallic thin film 3a, the fixation strength between the electrode pad E1 and the metallic thin film 3a can be further increased. Specifically, Al possesses properties of repelling the melted solder material, and, when the side face of the Al lead body 3A is exposed, such exposed face becomes an obstacle and the solder material SD is unable to crawl up any higher, and the solder material SD cannot be applied in the form of being pressed from the upper side. However, with the structure according to the foregoing embodiment, since the Al side face of the lead body 3A is not exposed, the foregoing drawback can be resolved, and a firm fixed state can be formed.

When referring to FIG. 16, although the area in which the plating layer 3a2 of the metallic thin film 3a is not formed (area long the center line CL in the longitudinal direction before bending (refer to FIG. 18)) is welded to the lead body 3A containing Al, since Ni and Al can be welded firmly, the metallic thin film 3a and the lead body 3A are also fixed firmly. Accordingly, it is possible to significantly increase the fixation strength between the electrode pad E1 (FIG. 22) and the lead 3.

Moreover, with the electrochemical device 10 of this example, the metallic thin film 3a is welded to only the upper face of the lead body 3A as shown in FIG. 16.

Figure 29A:
Figure 29B:

Note that, in the welding of metals, a concave-convex surface or uneven rough surface is formed in the welding area. The thin film body 3a is welded only at the upper face of the lead body 3A, and irregularities are formed on the upper face of the lead body 3A (refer to the SEM (scanning electron microscope) photograph of FIG. 29A). Note that the surface of the thin film body 3a before treatment is flat. Meanwhile, since welding is not performed to the lower face of the lead body 3A, the flatness of the thin film body 3a positioned on the lower face side of the lead body 3A is maintained (refer to FIG. 29A and FIG. 29B).

When the thin film body 3a is flat as described above, the capillary action functions effectively, and it is easy for the solder material to enter the space between the thin film body and the electrode pad (E1: refer to FIG. 22) that is disposed thereunder. Accordingly, the resistance between the thin film body 3a and the electrode pad E1 will decrease. Moreover, the lower face of the lead body 3A and the thin film body 3a are not welded, and, since they are slightly separated, a small amount of the solder material also enters into such space (refer to FIG. 29B). Accordingly, the resistance between the thin film body 3a and the lead body 3A will decrease, and the fixation strength is also enhanced.

In addition, when referring to FIG. 16, the dimension Xa of the bent metallic thin film 3a in the longitudinal direction (X axis direction) of the lead is preferably 1 mm or more. If the dimension Xa is less than 1 mm, the bond strength with the electrode pad based on soldering tends to deteriorate, and bond strength required for the connection can be obtained if the dimension Xa is 1 mm or more, especially if it is 2 mm or more. Note that the foregoing dimension is preferably 5 mm or less, and sufficient connection strength can be obtained in the foregoing case. Moreover, the ratio ra (=XA/Xa) of the dimension Xa to the dimension XA of the lead 3 from the boundary position with the outer package 1 to the tip position of the lead 3 in the X axis direction is preferably 1.2 or more. If the ratio ra of the dimension is less than 1.2, the lead 3 may come in contact with the outer package and damage the resin layer of the outer package surface, and this tends to increase the short circuit failure rate.

Figure 18:
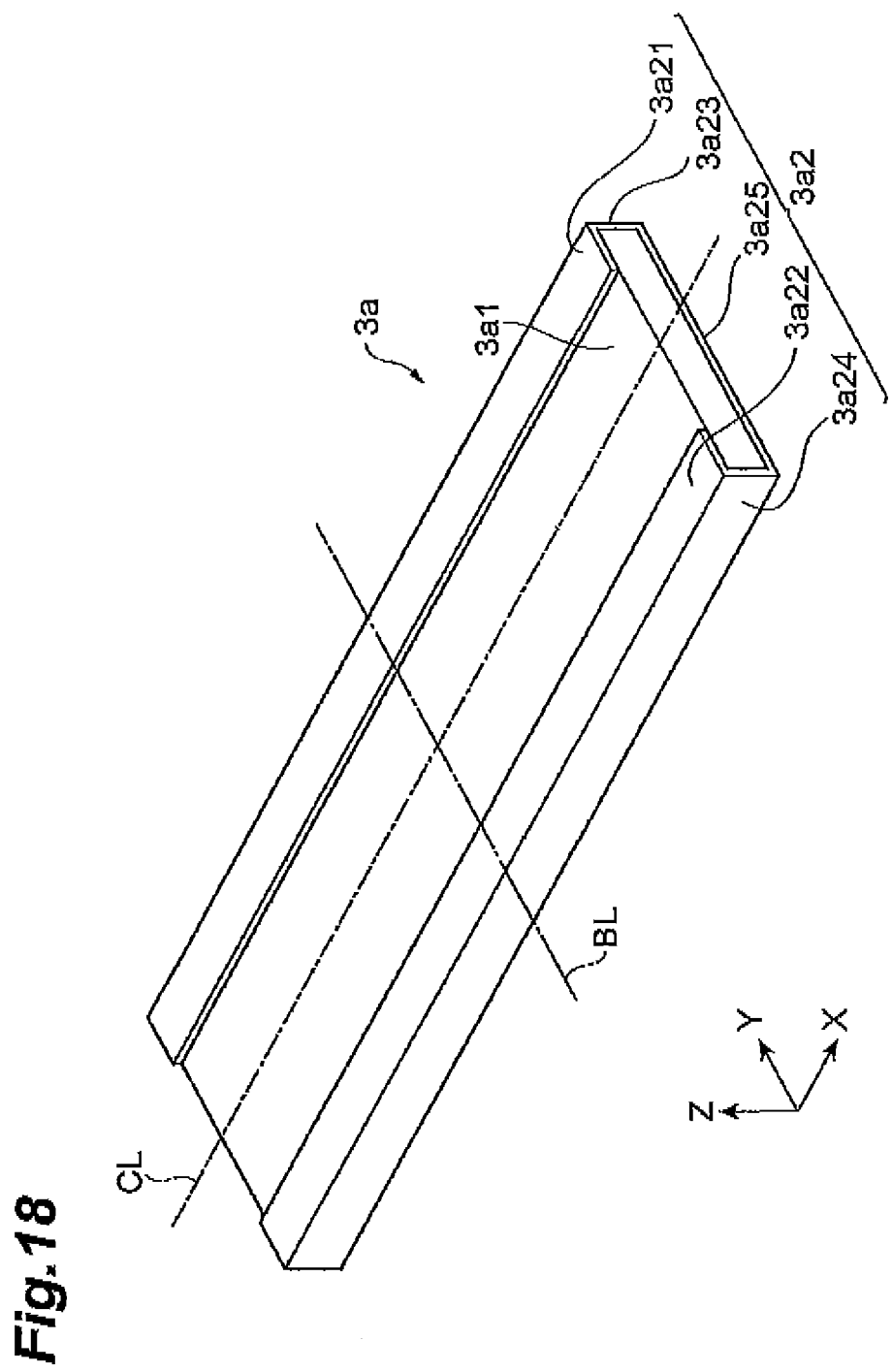

FIG. 18 is a perspective view of the metallic thin film 3a before bending.

To explain the plating layer 3a2 (including the plating layers 3a21, 3a22, 3a23, 3a24, 3a25), strip-shaped plating layers 3a21, 3a22 are formed along the longitudinal direction of the thin film body 3a1 on the inner surface of the thin film body 3a1 (after bending) in the vicinity of the opposite end positions of the bent metallic thin film 3a in the bending axis BL (Y axis) direction (areas in which the width of the metallic thin film 3a in the bending axis BL direction from the respective side faces is within the range of 1% to 20%).

Figure 19A:
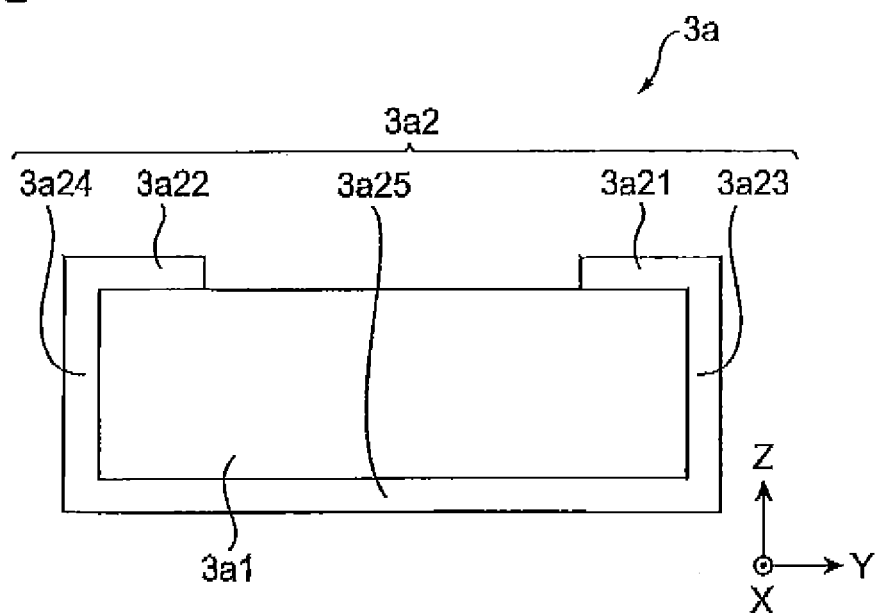
Figure 19B:
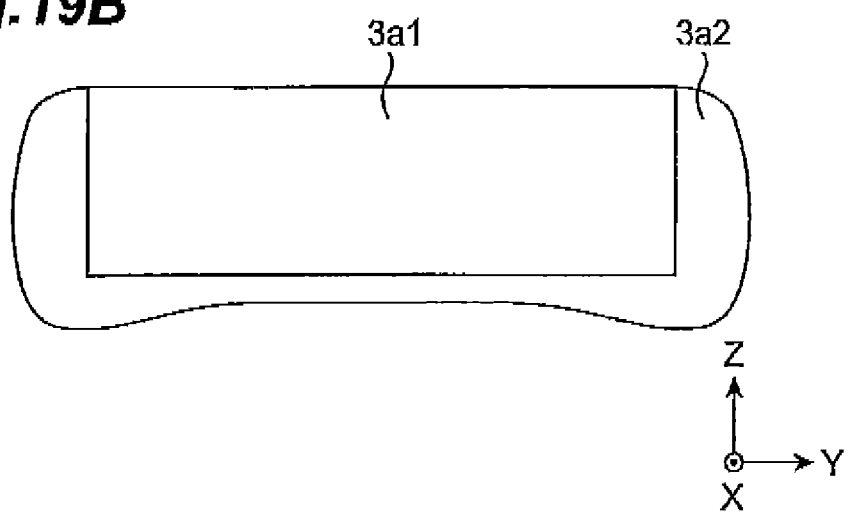

FIG. 19A shows the YZ cross section of the metallic thin film 3a. As a result of forming the plating layers 3a21, 3a22 in the vicinity of the opposite end positions (opposite end positions of the lead in the width direction) in the bending axis BL (Y axis) direction as shown in FIG. 18, the contour of the cross section shape of the plating layer 3a2 (cross section shape that is perpendicular to the longitudinal direction of the lead (YZ cross section)) acquires linearity in comparison to the case (B) of not forming the same. In FIG. 19B, the plating layers 3a21, 3a22 corresponding to FIG. 19A are not formed, and the plating layer in the vicinity of the opposite end positions is rounded and thickened. Meanwhile, with the shape of FIG. 19A, the plating layers 3a23, 3a24 of the side face have a uniform thickness and the contour thereof possesses linearity in the YZ cross section, and are roughly orthogonal to the contour of the plating layer 3a25 on the rear face side. Accordingly, with the shape of FIG. 19A, the product deviation can be reduced since variation in the thickness of the plating layer 3a2 will decrease, and it is thereby possible to provide an electrochemical device of stable quality.

The formation of this kind of plating layer can be performed using methods which are generally well known. The method of forming a plating layer can be generally classified into alkaline, acidic and neutral plating baths.

An alkaline plating bath is configured from potassium stannate or sodium stannate, and potassium hydroxide or sodium hydroxide. When electrodeposition is performed from quadrivalent tin and reaction occurs at a temperature of roughly 70° C., a stable plating layer is formed. Note that the experiments of the Examples described later adopted an alkaline plating bath using an aqueous solution of potassium stannate and potassium hydroxide as the plating solution.

An acidic plating bath, is configured from tin sulfate, tin fluoroborate or the like.

Tin chloride is used for a neutral plating bath.

Depending on the degree of adhesion that is required, there are cases of forming copper or nickel plating in a thickness of 1 to 10 μm as the plating surface treatment. As measures against whiskers, there are cases where, after the plating process, melting/heating treatment is preformed or heating is performed at approximately 180° C. for approximately 1 hour.

Moreover, the thickness (average value) of the plating layer $3a2$ is 0.5 μm or more and 10 μm or less. Specifically, if the thickness is less than 0.5 μm, defects (pinholes) may arise in the plating layer, and if the thickness exceeds 10 μm, it tends to interfere with the welding. If the thickness of the Sn plated layer $3a2$ is roughly 2 μm, then the solder wettability becomes favorable. The solder wettability is defined, for example, based on the standard (JESD22-B102E) of the reliability test of individual semiconductor electronic components conducted by the standardization organization Solid State Technology Association (JEDEC). With a tin plating layer formed on a thin film prepared under the foregoing conditions, a solder layer can be formed on 95% or more of the solder dipping area based on the following conditions; for instance, soldering temperature of 245° C., dip speed of 1.8 mm/sec, dip time of 3 seconds, and dip depth of 2 mm.

Moreover, in cases where the thickness of the Ni thin film body $3a1$ is approximately 100 μm, if the thickness of the Sn plated layer $3a2$ exceeds 10 μm, the bending portion is subject to stress and there are case where cracks occur at the interface of the Ni thin film body $3a1$ and the Sn plated layer $3a2$. These cracks tend to deteriorate the bond strength. Moreover, whiskers tend to arise when much stress remains in the Sn plated layer $3a2$, and, consequently, a short circuit tends to occur in the vicinity of the terminal. As a result of mounting the metallic thin film $3a$ including the Sn plated layer $3a2$ on the Al lead body $3A$, the solder wettability (fillet formability) can be improved significantly.

In addition, the thickness of the thin film body $3a1$ is preferably 50 μm or more and 500 μm or less. If the thickness of the thin film body $3a1$ falls below 50 μm, in the case of forming the foregoing plating layer structure, an adhesive tape is affixed to the non-plated area (area along the center line CL in FIG. 18) of the thin film body $3a1$, plating is subsequently performed, and the adhesive tape is peeled thereafter at an appropriate timing, but the thin film body $3a1$ oscillates during the foregoing process and wrinkles, kinks, crimps and the like tend to four on the thin film body, and, since such defects cannot be controlled, an error occurs in the quality of the product. Moreover, if the thickness of the thin film body $3a1$ exceeds 500 μm, this is undesirable since a phenomenon occurs where bonding with the lead becomes difficult. The present invention can inhibit the foregoing defects by setting the thickness of the thin film body to be within the foregoing range.

As described above, since the bonding (ultrasonic fusion) of the Ni tab (metallic thin film) of the Sn plated surface and the Al lead body $3A$ is difficult, plate processing is not performed to the bonding plane. Although it is advantageous to cover the entire side face of the metallic thin film $3a$ with the Sn plated layer in terms of forming a fillet, a certain level of effect can be yielded even if the Ni substrate is exposed. The Sn plate processing is performed in succession and a required amount (for example, roughly 20 mm) is used by being cut before being bonded to the Al lead body $3A$. Thus, although the Sn plated layer does not exist in the cut plane, there is no problem since this portion does not affect the formation of a fillet.

FIG. 22 is the XZ cross section of the circuit board which is configured by the foregoing electrochemical device 10 being mounted on a substrate. In order to clarify the features, the portion of the outer package 1 is shown as a side face and not as a cross section.

This circuit board comprises a substrate SB comprising an electrode pad E1 and on which the electrochemical device 10 is mounted. The main material of the substrate SB is an insulating material, and the electrode pad E1 is formed on the surface thereof. Various electronic components can be mounted on the substrate SB, but this example only shows the portion of the electrochemical device 10, which is the feature of this example.

This circuit board comprises a double-sided adhesive tape 4 which is interposed between the rear face of the outer package 1 and the substrate SB, and a solder material SD which is interposed between the electrode pad E1 and the metallic thin film $3a$, and which reaches an outer upper face of the metallic thin film $3a$.

In the foregoing case, as described above, since the lead 3 and the electrode pad E1 are firmly fixed and the rear face of the outer package 1 and the substrate SB are also firmly fixed with the double-sided adhesive tape 4, obtained is a circuit board that is resistant to oscillation.

Moreover, with this circuit board, the solder material SD contains Sn and Cu. Since this kind of material has favorable affinity with Sn contained in the plating layer $3a2$ (refer to FIG. 18), the wettability of the solder material SD will increase. However, since Cu is contained, the melting point of the solder decreases, and effects are yielded in that the solder workability is improved and the solder wettability is improved. Moreover, the solder material more preferably contains trace amounts of Ag. In the foregoing case, an effect is yielded in that the durability after the solder welding will improve. The ratio (mass percent ratio) of the respective elements in the solder material SD in this example is as shown below, and a variation of ±1 (mass %) is tolerated in the respective numerical values (provided, however, that the ratio of Cu>0 mass %).

Sn:Cu:Ag=96.5 (mass %):0.5 (mass %):3 (mass %)

The method of assembling the foregoing lead is now explained.

Figure 20:
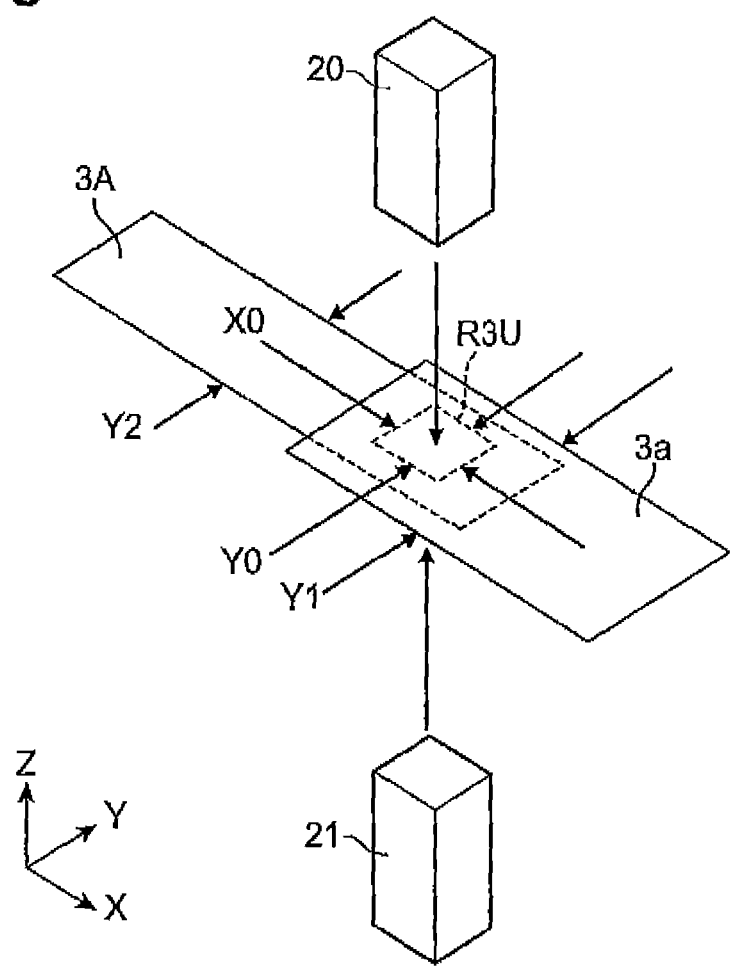

FIG. 20 is a perspective view showing the welding process of the lead body and the metallic thin film.

The lead body $3A$ and the metallic thin film $3a$ are prepared, and areas are partially superposed so that the longitudinal directions thereof coincide with the X axis. The width Y2 of the lead body $3A$ in the Y axis direction, the width Y1 of the metallic thin film $3a$, and the width Y0 of the welding area R3U are constant along the X axis, but the width Y0 of the welding area R3U is smaller than the width Y2 of the lead body $3A$, and, as a general rule, the welding area R3U does not overlap with the plating layers $3a21$, $3a22$ (refer to FIG. 18) positioned at the opposite ends in the Y axis direction.

The width Y2 of the lead body $3A$ in the Y axis direction is smaller than the width Y1 of the metallic thin film $3a$, and, although the width Y2 of the lead body $3A$ is shown to be smaller than the width Y1 of the metallic thin film $3a$ in FIG. 20, these widths may also be the same. Ultrasonic vibrator heads 20, 21 for performing ultrasonic welding are positioned at the vertical position in the thickness direction, and, by oscillating an oscillator that is mechanically connected to at least one of such ultrasonic vibrator heads 20, 21, the welding area R3U that comes into contact with the ultrasonic vibrator heads 20, 21 will melt, and the lead body 3A made of Al and the lower face exposed area (Ni) of the metallic thin film 3a become fused.

FIG. 21A to FIG. 21D are diagrams showing the method of fixing the lead body and the metallic thin film.

As the foregoing fixing method, considered may be the method shown in FIG. 21A to FIG. 21D.

Figure 21:
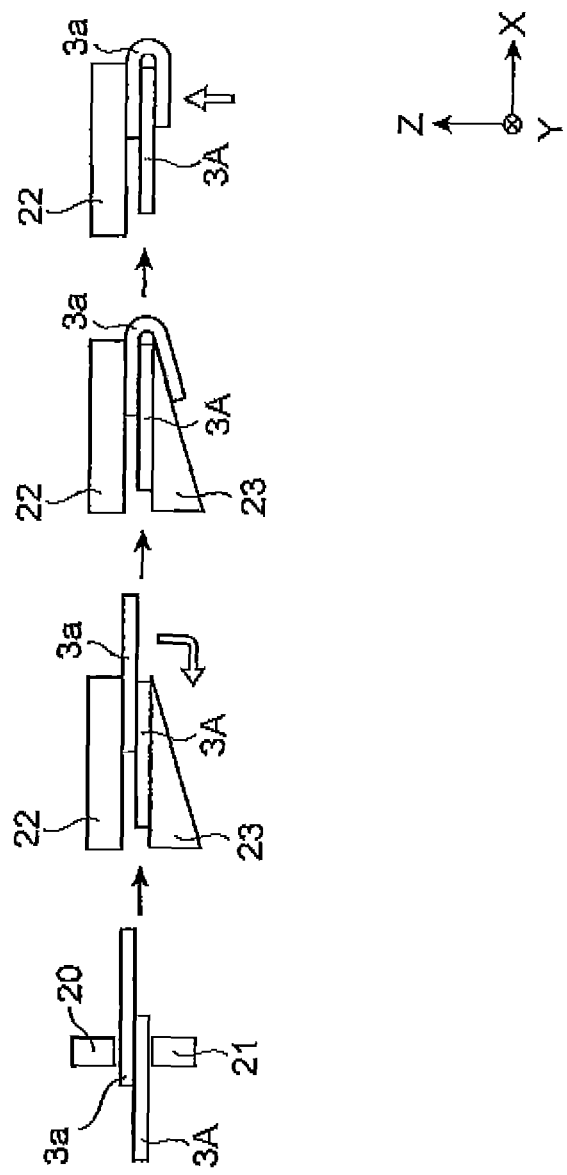

Foremost, the process shown in FIG. 20 is illustrated in FIG. 21A. In this process, the upper face of the lead body 3A and the metallic thin film 3a are subject to ultrasonic welding and thereby physically and electrically connected. Next, as shown in FIG. 21B, the lead body 3A and the metallic thin film 3a are pinched with jigs 23, 22, and, as shown with the arrow in this figure, the metallic thin film 3a that is protruding from the jigs is bent with the Y axis as the bending axis. The positive direction end of the X axis of the jigs 23, 22 is parallel to the Y axis, and these positive direction ends coincide with the position of the positive direction end of the X axis of the lead body 3A. The cross section shape of the lower jig 23 is a right triangle in the XZ plane, and its inclined face is inclined so as to form an acute angle relative to the X axis (angle of the jig is 90 degrees or less (particularly around 30 degrees)).

Accordingly, when the metallic thin film 3a is bent by being pressed against the inclined face of the jig 23, as shown in FIG. 21C, the metallic thin film 3a is bent with the Y axis as the bending axis. Next, as shown in FIG. 21D, by removing the lower jig 23 and pressing the floating metallic thin film 3a in the direction (Z axis positive direction) of the arrow in FIG. 21D, the metallic thin film 3a will become completely bent and contact the rear face of the lead body 3A. Note that the lower face of the lead body 3A and the metallic thin film 3a are not welded.

Note that, in the foregoing process, although the bending axis of the metallic thin film 3a is parallel to the Y axis in the figure, this may also be parallel to the X axis as described later.

Experiments were conducted for measuring the mounting strength regarding the foregoing electrochemical device.

In this example, the EDLC was manufactured according to the following procedures. Foremost, activated carbon and a conductive assistant, a binder (PVDF: polyvinylidene fluoride) and a solvent (NMP: N-methylpyrrolidone) were mixed to prepare paint, and this was applied to the collector foil (aluminum foil) and dried, and an electrode sheet to become the electrode terminal of the capacitor was thereby obtained. This electrode sheet was punched out into a size of 12 mm×17 mm, and laminated so that the electrode surfaces face each other via a separator. An Al lead (aluminum: thickness 100 μm) was ultrasonic-welded to the electrode extraction part of the respective foils to obtain a laminate with an aluminum lead. Two such laminates were placed in an aluminum laminated foil configuring the outer package via PP (polypropylene) and three sides were sealed, and, after pouring in an electrolytic solution, the final one side was sealed to obtain an EDLC. The Al lead tip was prepared as with the following example. The evaluation was performed by disposing a 5 mm×3 mm electrode pad E1 on a substrate SB made of glass epoxy (Flame Retardant Type 4) (1.6 mm thickness) and connecting the lead tip part of the EDLC to the solder material SD, and measuring the strength thereof by conducting a horizontal tensile strength test.

FIG. 23 is a diagram explaining the experimental method of the Examples.

The lead 3 of the electrochemical device 10 was disposed on the electrode pad E2 of the circuit board SB, and the solder material SD was melted and caused to drip onto the lead 3 and subsequently cooled to fix the same. Note that the electrochemical device 10 was pulled in the arrow direction (negative direction of the X axis) in the figure to measure the tensile strength in the horizontal direction without using the adhesive tape shown in FIG. 22.

FIG. 24 is a diagram explaining the experimental method of Comparative Example 1.

With Comparative Example 1, in comparison to the Examples, a metallic thin film 3b in which a non-bent Ni thin film body was subject to Sn plating was used in substitute for the bent metallic thin film 3a, and this was connected to the lower face of the lead body 3A based on ultrasonic fusion as with the foregoing method, and the product thereof was used. The solder material SD is interposed between the metallic thin film 3b and the electrode pad E1, but it was not able to crawl up the exposed side face of the lead body 3A made of aluminum, and, when the melted solder material SD was caused to drip from above, the solder material SD moved to the lower side of the lead body 3A and then solidified. This electrochemical device 10 was also pulled in the arrow direction (negative direction of the X axis) of FIG. 24 to measure the tensile strength in the horizontal direction.

FIG. 25 is a diagram explaining the experimental method of Comparative Example 2.

With Comparative Example 2, in comparison to Comparative Example 1, the tip of the metallic thin film 3b is mounted on the tip of the lead body 3A so as to protrude therefrom, and a melted solder ball 3c was caused to drip onto the tip of the metallic thin film 3b and subsequently cooled and fixed, and the solder ball 3c and the electrode pad E1 were fixed with the solder material SD. The solder material SD can be positioned between the solder ball 3c and the electrode pad E1 and on the upper face of the solder ball 3c, but it could not crawl up the exposed side face of the metallic thin film 3b, and, when the melted solder material SI) was caused to drip from above, the solder material SD became collected in the vicinity of the solder ball 3c and then solidified. This electrochemical device 10 was also pulled in the arrow direction (negative direction of the X axis) of FIG. 25 to measure the tensile strength in the horizontal direction.

FIG. 26 is a diagram explaining the structure and mounting method of the metallic thin film of the respective Examples.

EXAMPLE 1

In Example 1 (Example 1-1 to Example 1-7), the width Y2 of the lead body 3A and the width Y1 of the metallic thin film 3a (refer to FIG. 20) are the same, the bending axis of the metallic thin film 3a is parallel to the Y axis, and the metallic thin film 3a is covering the side face of the lead body 3A of the tip in the X axis direction in the lead tip part. The respective dimensions were as follows with reference to FIG. 16 and FIG. 20.

X0=2 mm
Y0=2 mm
Y1=3 mm
Y2=3 mm
XA=5 mm
Xa=3 mm

Note that the thickness of the thin film body 3a1 is 100 μm, and the thickness of the Sn plated layer 3a2 is 0.3 μm (Example 1-1), 0.5 μm (Example 1-2), 2 μm, (Example 1-3), 5 μm (Example 1-4), 7 μm (Example 1-5), 10 μm (Example 1-6), and 10.5 μm (Example 1-7).

Note that Ea 2000 manufactured by Branson was used for the ultrasonic fusion (welding energy=12.0 J, welding time=0.1 sec), and ultrasonic fusion was performed respectively from above and below before and after the bending of the metallic thin film.

This method is the method of mounting the metallic thin film 3a on the Al lead body 3A by disposing the metallic thin film 3a so that it partially does not overlap with the tip of the Al lead body 3A, thereafter connecting these components, bending such non-overlapping portion so as to encompass the Al lead body 3A, and once again connecting to the Al lead body 3A the metallic thin film 3a of the face that is not connected to the Al lead body 3A.

EXAMPLE 2

The width Y1 of the metallic thin, film before bending 3a is greater than the width Y2 of the lead body 3A, the bending axis of the metallic thin film 3a is parallel to the X axis, and the metallic thin film 3a is covering one side face of the lead body 3A along the Y axis direction in the lead tip part. X0=2 mm, Y0=2 mm, Y1=3.5 mm, Y2=3 mm, XA=5 mm, and Xa=1.5 mm. The other conditions are the same as Example 1-3, but the area that is not formed with the plating layer (area in the vicinity of the center line CL; FIG. 18) was formed to extend in the Y axis direction.

EXAMPLE 3

The width Y1 of the metallic thin film before bending 3a is greater than the width Y2 of the lead body 3A, the bending axis of the metallic thin film 3a is parallel to the Y axis, and the metallic thin film 3a is covering the side face of the lead body 3A of the tip in the X axis direction in the lead tip part. X0=2 mm, Y0=2 mm, Y1=3.5 mm, Y2=3 mm, XA=5 mm, and Xa=3 mm. The other conditions are the same as Example 1-3.

FIG. 27 is a table showing the experimental results. The number of samples n is 100 samples, and the average value (N) and the standard deviation (N) of the horizontal tensile strength are shown, In Examples 1 to 3, the lead did not rupture or come off even when force of 25 N was applied in the horizontal direction. Moreover, as shown in Example 1-1 to Example 1-7, even when the plating thickness was changed within the range of 0.3 µm or more and 10.5 µm or less, there was no change in the tensile strength in the horizontal direction. Note that 25 N is the measurement limit of the measuring device. Meanwhile, with Comparative Examples 1 and 2, the lead came off from the electrode pad E1 when force of 7.8 N and force of 17.3 N were applied, respectively. There was also variation in Comparative Examples 1 and 2.

With respect to the results concerning the status of connection of the lead, in Example 1-1, 94 samples were non-defective among the 100 samples, but 6 samples contained parts where the solder wettability was insufficient (evaluation result of status of connection: Δ).

In Example 1-7, 95 samples were non-defective among the 100 samples, but 5 samples contained parts with cracks at the interface of the thin film body 3a1 made of Ni foil and the Sn plated layer 3a2 (evaluation result of status of connection: Δ). In Comparative Example 1, 98 samples among the 100 samples contained parts where the solder wettability was inferior (evaluation result of status of connection: ×). In Comparative Example 2, 80 samples among the 100 samples contained parts where the solder wettability was inferior (evaluation result of status of connection: ×). In other Examples 1-2 to 1-6 and Examples 2 and 3, all samples were non-defective, and no parts could be acknowledged where the solder wettability was insufficient or parts with cracks as those described above (evaluation result of status of connection: ○).

Note that the expression "solder wettability was insufficient" specifically refers to a state where, after the melted solder material SD is caused to drip from above, it does not sufficiently spread to the upper face of the metallic thin film 3a, and only covers 50% or less of the upper face. This is caused by the defects (pinholes) of the plating layer, and, in Example 1-1, numerous defects existed in the plating layer. The expression "solder wettability was inferior" specifically refers to a state where, after the melted solder material SD is caused to drip from above, it does not sufficiently spread to the upper face of the metallic thin film 3a, and only covers 25% or less of the upper face,-or does not cover the upper face at all. In Comparative Example 1, the upper face of the lead is aluminum, and the solder material SD that was caused to drip repelled and did not remain on the upper face. In Comparative Example 2, the solder material SD solidified in the vicinity of the solder ball 3c, but since it did not spread fluently to the upper face of the lead 3, the status of connection was inferior. Moreover, the expression "with cracks at the interface" specifically refers to a state where one to several cracks with a length of roughly 100 µm and a width of roughly 10 µm were observed at the interface of the thin film body 3a1 and the Sn plated layer 3a2. In particular, the generation of cracks is noticeable at the bent portion of the metallic thin film 3a.

Upon considering these results, with the structure of Comparative Example 1, it is considered that the solder material was repelled by Al and unable to form a sufficient fillet, and the reliability is insufficient. Meanwhile, with the structure of Examples 1 to 3 in which the metallic thin film (Ni tab) was bent and formed on the Al lead body, it was possible to form a clean fillet from the upper face of the metallic thin film to the electrode pad and obtain sufficient connection strength, and sufficient reliability was thereby obtained.

In cases where the metallic thin film 3a was mounted on the tip part of the lead body 3A, if the width of the metallic thin film 3a. is greater than the lead body 3A as with Examples 2 and 3, not only will the volume of the solder material (fillet) SD increase, it becomes easier to form a fillet on the side face portion of the width direction. As a result of a fillet being formed at the 3 locations (3 directions) of the tip part in the X axis direction, side face portion in the Y axis direction, and the lower face region of the lead, the tensile strength and torsional strength in, the respective directions will increase. Since the width of the metallic thin film 3a is greater than the width of the lead body 3A, it becomes easier for the solder material to crawl onto the metallic thin film 3a of the portion protruding from the lead body 3A in the lateral direction, and the tensile strength and the torsional strength will thereby increase.

As described above, according to the structure of the respective Examples, the structure becomes resistant to the anticipated load (pulling and twisting) that will be applied to the EDLC after the lead is bonded.

Moreover, with Comparative Example 2, since the solder ball as the preliminary soldering is uneven, the fillet that is formed also becomes uneven (in certain cases only the bottom face), variation arises in the connection strength. Consequently, there is a possibility that problems may arise in the connection life in terms of long-term reliability. However, with the structure of Examples 1 to 3, stable connection strength can be ensured since it is possible to form a fillet on the plated surface. Accordingly, with the structure of the Examples, the connection life in terms of long-term reliability can be significantly improved.

As explained above, since a thin EDLC using a laminated outer package is demanded of solder connectability to a printed board, and a lead of the EDLC needs to satisfy both the resistance properties and electrical conductivity relative to the electrolytic solution, Al with inferior solder wettability was used, and it was not possible to improve the connection strength. In this embodiment, it was possible to improve the fixation strength by using a bent metallic thin film. Since this method adopts processes with superior reproducibility such as plating and fusion, automation can be realized easily, and this is also desirable in terms of productivity. As electronic components having this kind of a flat lead terminal shape, lithium ion batteries and electrolytic capacitors are know in addition to EDLC, and the present invention can also be applied to these components.

The electrochemical device of type C is now explained.

In cases of the foregoing conventional technology, with a lead made of aluminum, there is a problem in that the fixation strength between the electrode pad and the lead deteriorates since the wettability relative to the solder material is low.

The electrochemical device of type C was devised in view of the foregoing problem, and the object of this embodiment is to provide an electrochemical device and a circuit board capable of improving the fixation strength between the electrode pad and the lead and also possessing superior connection reliability.

In order to achieve the foregoing object, the electrochemical device of type C is an electrochemical device including a charger/discharger housed in an outer package, and a lead extending from the charger/discharger, wherein the lead has: a lead body containing Al; and a metallic thin film which is provided to a tip part of the lead body, and which is bent into a curved shape at a side face position of the lead body as a boundary so as to form a gap between a side face of the lead body and the metallic thin film, and moreover which covers upper and lower faces and a side face of the lead body, and in which a predetermined area is welded to the lead body, the metallic thin film includes: a thin film body containing Ni; arid a plating layer containing Sn and covering at least an outer surface of the bent thin film body, and a specific area of an inner surface of the bent thin film body and a surface of the lead body are directly in contact and welded in the predetermined area without the plating layer being disposed therebetween.

Since the surface of the metallic thin film includes a plating layer containing Sn and the wettability relative to the solder material is high, the metallic thin film and the electrode pad are firmly fixed via the solder material. Here, since Ni is contained in the thin film body on which the plating layer is formed, Ni and Sn are bonded firmly. Moreover, since the solder material can crawl up to the upper face of the outer surface of the bent metallic thin film, the fixation strength between the electrode pad and the metallic thin film can be further increased. The area where the plating layer of the metallic thin film is not formed is welded to the lead body containing Al, but since Ni and Al can be firmly welded, the metallic thin film and the lead body are also thinly fixed. Accordingly, it is possible to significantly improve the fixation strength between the electrode pad and the lead.

Moreover, the metallic thin film is bent into a curved shape. Accordingly, as a result of the bent portion of the metallic thin film being formed in a rounded shape, in comparison to cases where it is bent at a right angle, for example, stress will not be concentrated at a specific location of the plating layer formed on the metallic thin film surface since no corner is formed at the bent portion, and damage to the plating layer is alleviated and the solder wettability is thereby maintained. Consequently, the connection strength between the electrode pad and the lead which are connected via the solder material will stabilize and the connection reliability will also improve. In addition, as a result of a gap being formed between the metallic thin film and the side face of the lead body, the solder material will enter such gap and the solder material will at least become adhered to the plating layer of the metallic thin film that faces the gap. Consequently, the connection strength and the connection reliability between the electrode pad and the lead which are connected via the solder material will improve.

Moreover, with the electrochemical device of the present invention, a distance of the gap between the metallic thin film and the side face of the lead body is 0.1 mm or more and 2 mm or less. If the distance of the gap is within the foregoing range, it becomes easier for the solder material to enter the gap, and the connection strength and the connection reliability between the electrode pad and the lead are effectively enhanced.

Moreover, with the electrochemical device of the present invention, the metallic thin film is welded to one or both of the upper and lower faces of the lead body. In particular, by welding the metallic thin film and the lead body at both the upper and lower faces, the fixation strength thereof can be enhanced.

Moreover, with the electrochemical device of the present invention, the plating layer is formed along a direction that is perpendicular to a bending axis direction of the thin film body on an inner surface of the thin film body in the vicinity of opposite end positions of the bent metallic thin film in the bending aids direction As a result of forming the plating layer in the vicinity of such opposite end positions, the contour of the cross section shape of the plating layer will acquire linearity. In other words, the product deviation can be reduced since variation in the thickness of the plating layer will decrease, and it is thereby possible to provide an electrochemical device of stable quality.

Moreover, with the electrochemical device of the present invention, a thickness of the plating layer is 0.5 μm or more and 10 μm or less. Specifically, if the thickness is less than 0.5 μm, defects may arise in the plating layer, and, if the thickness exceeds 10 μm, it tends to interfere with the welding.

Moreover, with the electrochemical device of the present invention, a thickness of the thin film body is 50 μm or more and 500 μm or less. If the thickness of the thin film body falls below 50 μm, in the case of forming the foregoing plating layer structure, an adhesive tape is affixed to the non-plated area of the thin film body, plating is subsequently performed, and the adhesive tape is peeled thereafter at an appropriate timing, but the thin film body oscillates during the foregoing process and wrinkles, kinks, crimps and the like tend to form on the thin film body, and, since such defects cannot be controlled, an error occurs in the quality of the product. Moreover, if the thickness of the thin film body exceeds 500 μm, this is undesirable since the bonding with the lead tends to become difficult. The present invention can inhibit the foregoing defects by setting the thickness of the thin film body to be within the foregoing range.

Moreover, with the electrochemical device of the present invention, a dimension of the bent metallic thin film in a longitudinal direction of the lead is 1 mm or more.

If the foregoing dimension is less than 1 mm, the bond strength with the electrode pad based on soldering tends to deteriorate, and sufficient bond strength can be obtained if the dimension is 1 mm or more, especially if it is 2 mm or more. Note that the foregoing dimension is preferably 5 mm or less, and sufficient bond strength can be obtained in the foregoing case.

Moreover, with the electrochemical device of the present invention, the plating layer contains 98±1 (mass %) of Sn and 2±1 (mass %) of Cu.±1 (mass %) is a tolerable error.

In the foregoing case, an effect is yielded in that the melting point of the solder decreases during solder welding, and bonding can be performed easily.

Moreover, when the width of the metallic thin film is greater than the width of the lead body, it becomes easier for the solder material to crawl onto the metallic thin film of the portion protruding from the lead body, and the tensile strength and the torsional strength will thereby increase.

Moreover, the circuit board of the present invention comprises any one of the foregoing electrochemical devices, a substrate on which the electrochemical device is mounted and which comprises an electrode pad, a double-sided adhesive tape which is interposed between a rear face of the outer package and the substrate, and a solder material which is interposed between the electrode pad and the metallic thin film, and which reaches an outer surface of the metallic thin film.

In the foregoing case, since the lead and the electrode pad are firmly fixed and the rear face of the outer package and the substrate are also firmly fixed with the double-sided adhesive tape, obtained is a circuit board that is resistant to oscillation.

Moreover, with the circuit board of the present invention, the solder material contains Sn and Cu. In the case of this kind of material, since the affinity with Sn contained in the plating layer is favorable, the wettability of the solder material will increase. However, since Cu is contained, the melting point of the solder decreases during solder welding, and an effect is yielded in that bonding can be performed easily. Moreover, the solder material preferably contains trace amounts of Ag. In the foregoing case, an effect is yielded in that the durability after the solder welding will improve.

According to the electrochemical device and the circuit board of the present invention, the fixation strength between the electrode pad and the lead can be improved, and superior connection reliability is thereby yielded.

The electrochemical device of type C is now explained in detail.

Figure 30:
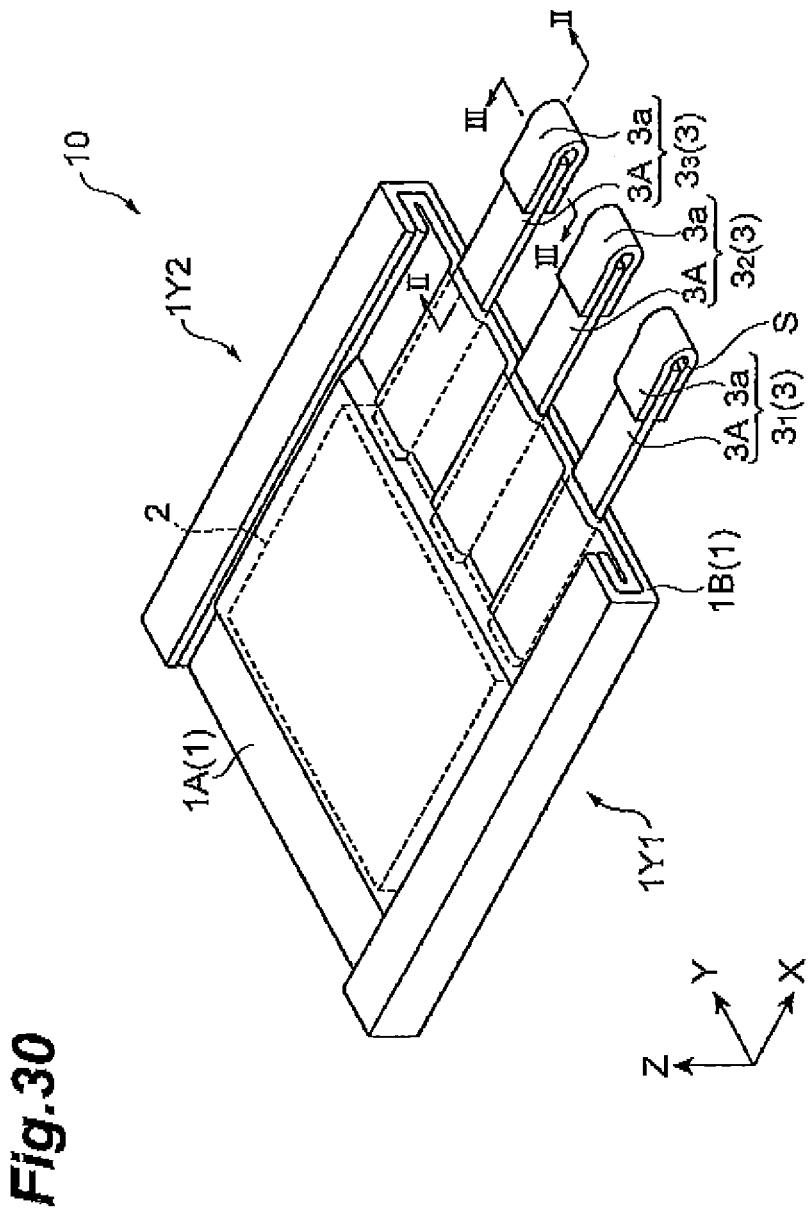
Figure 32:
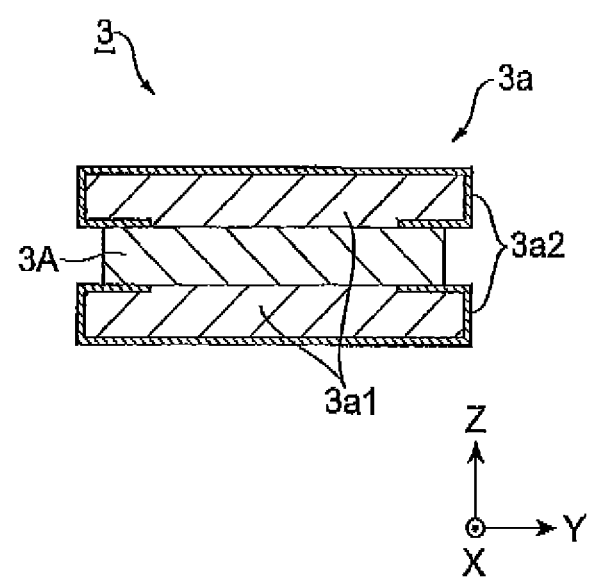

FIG. 30 is a perspective view of the electrochemical device, FIG. 31 is an arrow II-II cross section of the electrochemical device, and FIG. 32 is an arrow III-III cross section of the electrochemical device. Moreover, FIG. 37 an XZ cross section of the circuit board on which the electrochemical device is mounted.

The electrochemical device 10 includes a charger/discharger 2 housed in an outer package 1, and a plurality of leads 3 extending from the charger/discharger 2. The otter package 1 is configured by superposing a rectangular upper laminated sheet 1A and a rectangular lower laminated sheet 1B, and bonding the areas in the vicinity of the four sides of the periphery thereof. The laminated sheets 1A, 1B are respectively formed by coating an inner surface of an aluminum thin film with a resin layer. A three dimensional Cartesian coordinate system as shown in FIG. 30 is set with the thickness direction of the outer package 1 as the Z axis, the width direction as the Y axis, and the length direction as the X axis. Regions 1Y1, 1Y2 in the vicinity of opposite ends of the outer package 1 in the Y axis direction are bent inward at the boundary line along the X axis, and the mechanical strength of the outer package 1 is thereby enhanced.

An electrolytic solution and the charger/discharger 2 are disposed within hermetically-sealed internal space of the outer package 1. Via the lead 3, an electrical charge can be accumulated in the charger/discharger 2 and the accumulated electrical charge can also be discharged therefrom. Various structures may be used for the charger/discharger 2, but capacitors connected in series are used in this example. Specifically, the electrochemical device 10 in this case configures an EDLC (Electric Double Layer Capacitor).

Figure 42:
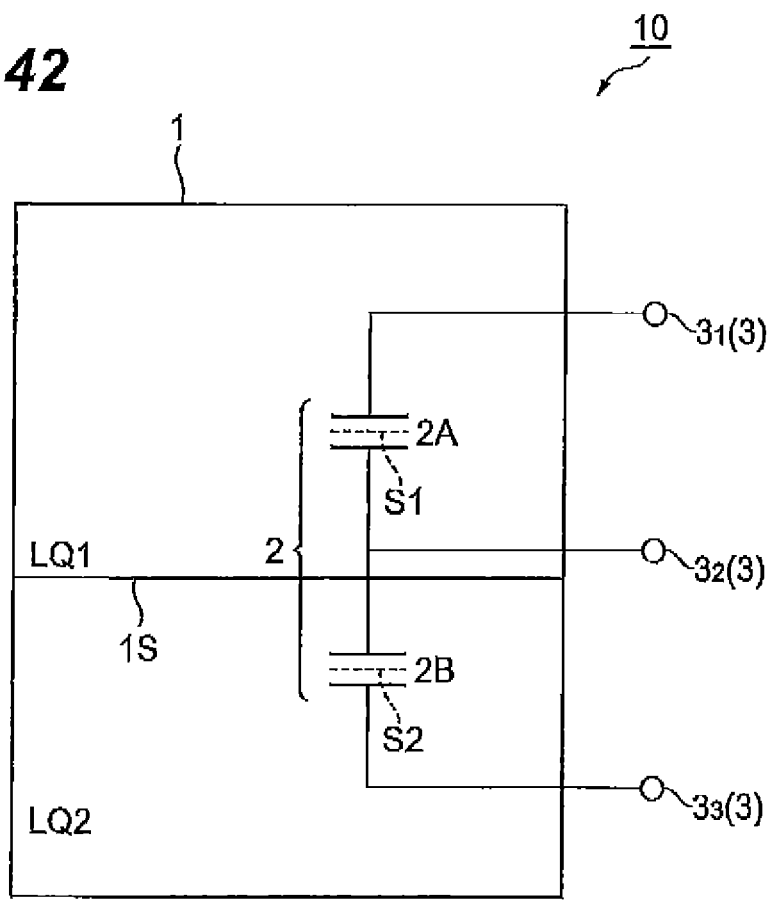
FIG. 42 is a circuit diagram showing the internal structure of the electrochemical device.

Here, the internal electrical circuit structure of the EDLC is shown in FIG. 42.

The charger/discharger 2 is configured by connecting a capacitor 2A and a capacitor 2B in series, a lead $3_2$ is electrically connected to the connection tip parts thereof, and a lead $3_1$ and a lead $3_3$ are electrically connected, respectively, to terminals which are different from the foregoing connection tip parts of the capacitor 2A and the capacitor 2B. The inside of the outer package 1 is partitioned into two storage parts with a sealant 1S made of polypropylene or the like, and the capacitor 2A and the capacitor 2B are separately housed in the respective storage parts. Electrolytic solutions LQ1, LQ2 are filled in the respective storage parts inside the outer package 1. The respective terminal electrodes configuring the capacitors 2A, 2B are configured by laminating an active material layer and a collector. Moreover, separators S1, S2 as insulating layers are respectively interposed between the respective terminal electrodes configuring the capacitors 2A, 2B. With an EDLC, electrical charges are aligned as a thin layer between the polarizing conductor and the electrolyte (solution), and electrical charge is accumulated by applying a bias therebetween. The center lead $3_2$ is used for controlling the potential in the connection tip parts of the capacitors 2A and 2B connected in series.

The active material layer is a polarizing electrode. The polarizing electrode is made of a porous material, and manufactured by mixing binder resin in activated carbon. As the binder resin, used may be a high molecular compound containing fluorine such as polytetrafluoroethylene and polyvinylidene fluoride, a rubber-based high molecular compound such as styrene-butadiene rubber, carboxymethyl cellulose, and so on. As needed, carbon black, carbon nanotubes, graphite particles or microfilaments may be added as a conductive assistant. During the manufacture process, these materials are applied to one side or both sides of the collector.

The collector is made of a metal foil. In addition to using an aluminum foil or a titanium foil with a smooth surface, these may also be used upon subjecting the surface thereof to roughening treatment by way of embossing or etching processing. Note that, as the method of manufacturing an electrode, in addition to the method of adding a conductive supplement and binder to activated carbon and forming a sheet shape and bonding this to the collector, a method of forming the activated carbon into a slurry and applying this to the collector may also be used. As the application method, used may be the applicator method, gravure method, reverse roll method, extrusion (nozzle) method, dip method, and so on.

The separators S1, S2 are formed from a nonwoven fabric or a porous film containing, for example, polyolefin resin at a mass ratio of 10% or more. The polarizing electrode and the separator can also be bonded by applying pressure to a pair of polarizing electrodes under a temperature environment which is not less than the softening temperature of the polyolefin resin. As the separator, cellulose nonwoven fabric or nonwoven fabric of aramid fiber may also be used.

As the electrolytic solutions LQ1, LQ2, an aqueous solution and an organic solution are known. As the solvent of an organic electrolytic solution, known are propylene carbonate, ethylene carbonate, dimethyl carbonate, ethyl methyl carbonate, diethyl carbonate, γ-butyrolactone, dimethylformamide, sulfolane, acetonitrile, propionitrile, methoxyacetonitrile and the like, and, as the solute, known are ammonium salt, amine salt, amidine salt and the like.

Returning to FIG. 30 to FIG. 32, the structure of the electrochemical device 10 is explained.

In the electrochemical device 10, the lead 3 comprises a lead body 3A containing Al, and a metallic thin film 3a fixed to the tip of the lead body 3A. The metallic thin film 3a is fixed to the tip part of the lead body 3A, and bent at a side face position of the lead body 3A as the boundary. Moreover, with the example shown in FIG. 30, the metallic thin film 3a covers the upper and lower faces (XY plane) and the side face (YZ plane) of the lead body 3A. In addition, as shown in FIG. 31, predetermined areas (R3U, R3L) of the metallic thin film 3a are welded to the lead body 3A. Note that although Al is the main component in the lead body 3A, trace amounts of impurities may be contained. The content rate of Al in the lead body 3A is at least 50 mass % or more, and is preferably 95 mass % or more when giving consideration to the electrical conductivity and the resistance properties against the electrolytic solution.

The metallic thin film 3a includes a thin film body 3a1 containing Ni, and a plating layer 3a2 containing Sn and covering at least an outer surface of the bent thin film body 34. The predetermined areas to be welded are R3U and R3L. The region to be welded is not the entire area of the metallic thin film 3a, and is only a partial area. Specifically, a specific area (an exposed area which is not covered by the plating layer 3a2 and which includes the predetermined areas R3U, R3L) of the inner surface of the bent thin film body 3a1 and the surface (XY plane) of the lead body 3A are in direct contact without intervention of the plating layer 3a2, and the exposed specific area and the surface of the lead body 3A are welded in the predetermined areas R3U, R3L.

The bent portion of the metallic thin film 3a is of a curved shape. The curvature of the bent portion does not need to be constant. Moreover, the bent portion may extent in the positive direction and/or the negative direction of the Z axis.

A gap S exists between the inner surface in the vicinity of the bending axis of the metallic thin film 3a, and the lead body 3A. The solder material enters the gap S and the connection strength and connection reliability can be increased thereby. The distance DS of the gap S is preferably 0.1 mm or more and 2 mm or less, and more preferably 0.2 mm or more and 1.0 mm or less. If the distance DS of the gap S is less than 0.1 mm, it becomes difficult for the solder material to enter the gap S, and if the distance DS exceeds 2 mm, the width of the metallic thin film 3a protruding from the side face position of the lead body 3A will increase, the protruding metallic thin film 3a becomes crushed, and portions where the solder material cannot enter tend to arise.

The content rate of Ni in the thin film body 3a1 is at least 50 mass % or more, and preferably 95 mass % or more when giving consideration to the point that the adhesion with Al is performed firmly. Moreover, the content rate of Sn in the plating layer 3a2 is decided in consideration of the affinity with the solder material and other matters, but with the electrochemical device of this example, the plating layer 3a2 contains 98±1 (mass %) of Sn and 2±1 (mass %) of Cu.±1 (mass %) is a tolerable error. In the foregoing case, there is an effect of improving the solder wettability and inhibiting the growth of whiskers.

Figure 37:
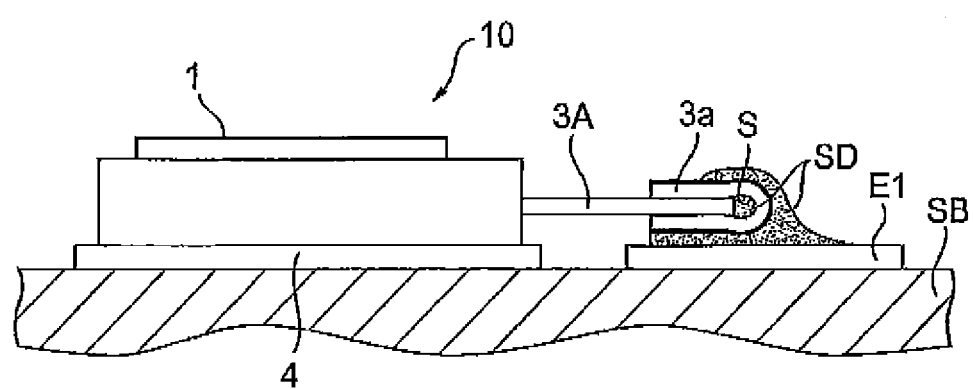

The surface of the metallic thin film 3a includes a plating layer 3a2 containing Sn, and the metallic thin film 3a and the electrode pad E1 are fixed firmly via the solder material SD since the wettability with the solder material SD (refer to FIG. 37) is high. The solder material SD of FIG. 37 is in contact with both the plating layer 3a2 and the electrode pad E1. Here, since Ni is contained in the thin film body 3a1 on which the plating layer 3a2 shown in FIG. 31 and FIG. 32 is formed, Ni and Sn are bonded firmly.

Moreover, since the solder material SD of FIG. 37 can crawl up (remain on the upper face when the solder material is caused to drip from above) to the upper face (XY plane in the positive direction of the Z axis) of the outer surface of the bent metallic thin film 3a, the fixation strength between the electrode pad E1 and the metallic thin film 3a can be further increased. Specifically, Al possesses properties of repelling the melted solder material, and, when the side face of the Al lead body 3A is exposed, such exposed face becomes an obstacle and the solder material SD is unable to crawl up any higher, and the solder material SD cannot be applied in the fowl of being pressed from the upper side. However, with the structure according to the foregoing embodiment, since the Al side face of the lead body 3A is not exposed, the foregoing drawback can be resolved, and a firm fixed state can be formed.

When referring to FIG. 31, although the area in which the plating layer 3a2 of the metallic thin film 3a is not formed (area long the center line CL in the longitudinal direction before bending (direction that is perpendicular to the bending axis) (refer to FIG. 33)) is welded to the lead body 3A containing Al, since Ni and Al can be welded firmly, the metallic thin film 3a and the lead body 3A are also fixed firmly. Accordingly, it is possible to significantly increase the fixation strength between the electrode pad E1 (FIG. 37) and the lead 3.

Moreover, with the electrochemical, device 10 of this example, the metallic thin film 3a is welded to both the upper and lower faces of the lead body 3A as shown in FIG. 31. Thus, since the metallic thin film 3a and the lead body 3A are welded at both the upper and lower faces, the fixation strength thereof can be enhanced.

In addition, when referring to FIG. 31, the dimension Xa of the bent metallic thin film 3a in the longitudinal direction (X axis direction) of the lead is preferably 1 mm or more. If the dimension Xa is less than 1 mm, the bond strength with the electrode pad based on soldering tends to deteriorate, and sufficient bond strength can be obtained if the dimension Xa is 1 mm or more, especially if it is 2 mm or more. Note that the foregoing dimension is preferably 5 mm or less, and sufficient bond strength can be obtained in the foregoing case. Moreover, the ratio ra (XA/Xa) of the dimension Xa to the dimension XA of the lead 3 from the boundary position with the outer package 1 to the tip position of the lead 3 in the X axis direction is preferably 1.2 or more. If the ratio ra of the dimension is less than 1.2, the lead 3 may come in contact with the outer package and damage the resin layer of the outer package surface, and this tends to increase the short circuit failure rate.

Figure 33:
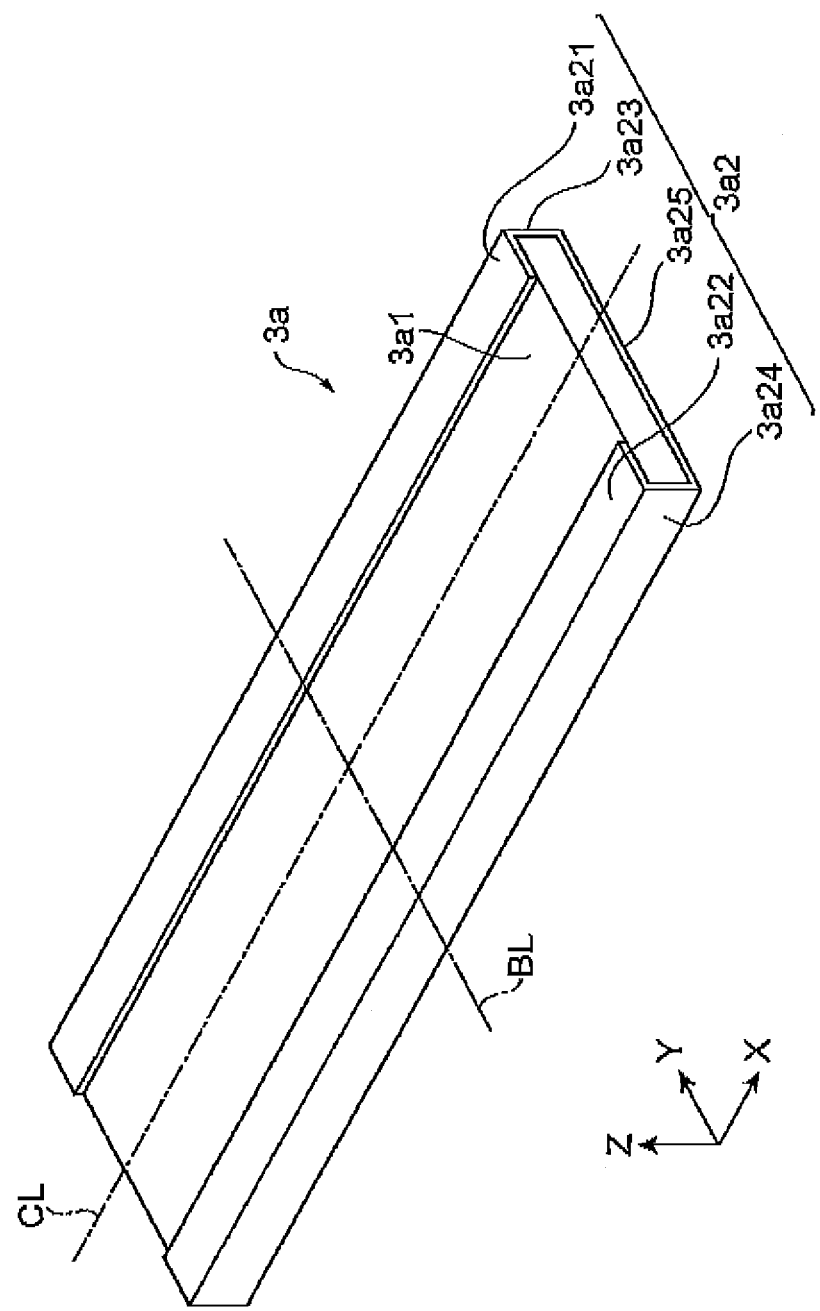

FIG. 33 is a perspective view of the metallic thin film 3a before bending.

With the plating layer 3a2 (including the plating layers 3a21, 3a22, 3a23, 3a24, 3a25), strip-shaped plating layers 3a21, 3a22 are formed along the longitudinal direction (direction that is perpendicular to the bending axis) of the thin film body 3a1 on the inner surface of the thin film body 3a1 (after bending) in the vicinity of the opposite end positions of the bent metallic thin film 3a in the bending axis BL (Y axis) direction (areas in which the width of the metallic thin film 3a in the bending axis BL direction from the respective side faces is within the range of 1% or more to 20% or less).

Figure 34A:
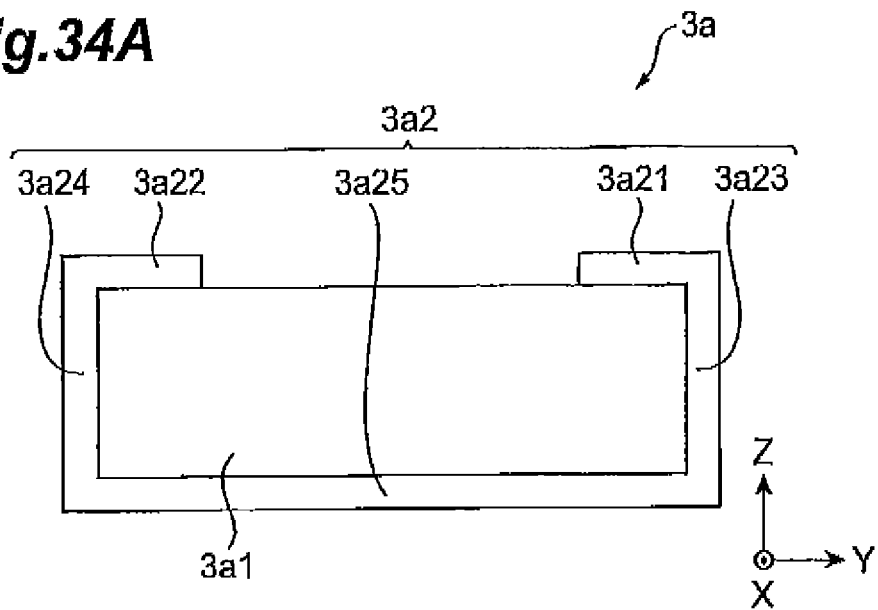
Figure 34B:
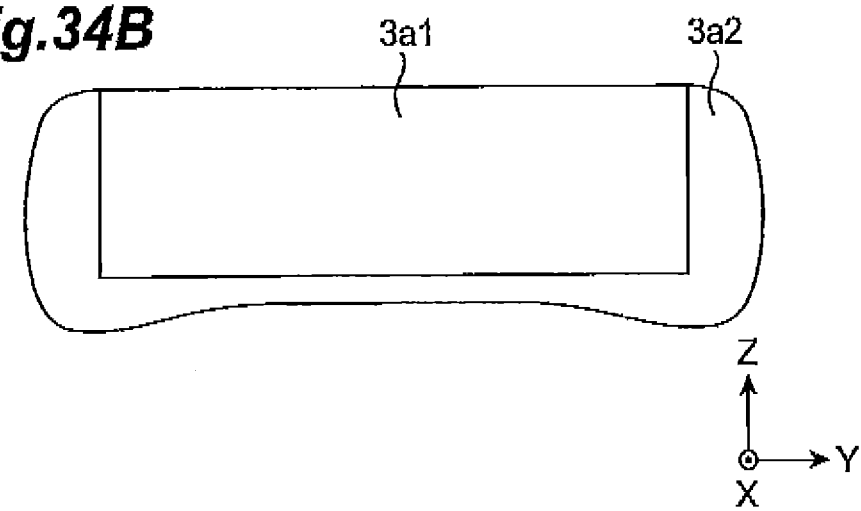

FIG. 34A shows the YZ cross section of the metallic thin film 3a. As a result of forming the plating layers 3a21, 3a22 in the vicinity of the opposite end positions (opposite end positions of the lead in the width direction) in the bending axis BL (Y axis) direction as shown in FIG. 33, the contour of the cross section shape of the plating layer 3a2 (cross section shape that is perpendicular to the longitudinal direction of the lead (YZ cross section)) acquires linearity in comparison to the case (B) of not forming the same. In FIG. 34B, the plating layers 3a21, 3a22 corresponding to FIG. 34A are not formed, and the plating layer in the vicinity of the opposite end positions is rounded and thickened. Meanwhile, with the shape of FIG. 34A, the plating layers 3a23, 3a24 of the side face have a uniform thickness and the contour thereof possesses linearity in the YZ cross section, and are roughly orthogonal to the contour of the plating layer 3a25 on the rear face side. Accordingly, with the shape of FIG. 34A, the product deviation can be reduced since variation in the thickness of the plating layer 3a2 will decrease, and it is thereby possible to provide an electrochemical device of stable quality.

The formation of this kind of plating layer can be performed using methods which are generally well known. The method of forming a plating layer can be generally classified into alkaline, acidic and neutral plating baths.

An alkaline plating bath is configured from potassium stannate or sodium stannate, and potassium hydroxide or sodium hydroxide. When electrodeposition is performed from quadrivalent tin and reaction occurs at a temperature of roughly 70° C., a stable plating layer is formed. Note that the experiments of the Examples described later adopted an alkaline plating bath using an aqueous solution of potassium stannate and potassium hydroxide as the plating solution.

An acidic plating bath is configured from tin sulfate, tin fluoroborate or the like.

Tin chloride is used for a neutral plating bath.

Depending on the degree of adhesion that is required, there are cases of forming copper or nickel plating in a thickness of 1 to 10 µm as the plating surface treatment. As measures against whiskers, there are cases where, after the plating process, melting/heating treatment is performed or heating is performed at approximately 180° C. for approximately 1 hour.

Moreover, the thickness (average value) of the plating layer 3a2 is 0.5 µm or more and 10 µm or less. Specifically, if the thickness is less than 0.5 µm, defects (pinholes) may arise in the plating layer, and, if the thickness exceeds 10 µm, it tends to interfere with the welding. If the thickness of the Sn plated layer 3a2 is roughly 2 µm, then the solder wettability becomes favorable. The solder wettability is defined, for example, based on the standard (JESD22-B102E) of the reliability test of individual semiconductor electronic components conducted by the standardization organization Solid State Technology Association (JEDEC). With a tin plating layer formed on a thin film prepared under the foregoing conditions, a solder layer can be formed on 95% or more of the solder dipping area based on the following conditions; for instance, soldering temperature of 245° C., dip speed of 1.8 mm/sec, dip time of 3 seconds, and dip depth of 2 mm.

Moreover, in cases where the thickness of the Ni thin film body 3a1 is approximately 100 µm, if the thickness of the Sn plated layer 3a2 exceeds 10 µm, the bending portion is subject to stress and there are case where cracks occur at the interface of the Ni thin film body 3a1 and the Sn plated layer 3a2. These cracks tend to deteriorate the bond strength. Moreover, whiskers tend to arise when much stress remains in the Sn plated layer 3a2, and, consequently, a short circuit tends to occur in the vicinity of the terminal. As a result of mounting the metallic thin film 3a including the Sn plated layer 3a2 on the Al lead body 3A, the solder wettability (fillet formability) can be improved significantly.

In addition, the thickness of the thin film body 3a1 is preferably 50 µm or more and 500 µm or less. If the thickness of the thin film body 3a1 falls below 50 µm, in the case of forming the foregoing plating layer structure, an adhesive tape is affixed to the non-plated area (area along the center line CL in FIG. 33) of the thin film body 3a1, plating is subsequently performed, and the adhesive tape is peeled thereafter at an appropriate timing, but the thin film body 3a1 oscillates during the foregoing process and wrinkles, kinks, crimps and the like tend to form on the thin film body, and, since such defects cannot be controlled, an error occurs in the quality of the product. Moreover, if the thickness of the thin film body 3a1 exceeds 500 µm, this is undesirable since a phenomenon occurs where bonding with the lead becomes difficult. The present invention can inhibit the foregoing defects by setting the thickness of the thin film body to be within the foregoing range.

As described above, since the bonding (ultrasonic fusion) of the Ni tab (metallic thin Elm) of the Sn plated surface and the Al lead body 3A is difficult, plate processing is not performed to the bonding plane. Although it is advantageous to cover the entire side face of the metallic thin film 3a with the Sn plated layer in terms of forming a fillet, a certain level of effect can, be yielded even if the Ni substrate is exposed. The Sn plate processing is performed in succession and a required amount (for example, roughly 20 mm) is used by being cut before being bonded to the Al lead body 3A. Thus, although the Sn plated layer does not exist in the cut plane, there is no problem since this portion does not affect the formation of a fillet.

FIG. 37 is the XZ cross section of the circuit board which is configured by the foregoing electrochemical device 10 being mounted on a substrate. In order to clarify the features, the portion of the outer package 1 is shown as a side face and not as a cross section.

This circuit board comprises the electrochemical device 10, and a substrate SB comprising an electrode pad E1 and on which the electrochemical device 10 is mounted. The main material of the substrate SB is an insulating material, and the electrode pad E1 is formed on the surface thereof. Various electronic components can be mounted on the substrate SB, but this example only shows the portion of the electrochemical device 10, which is the feature of this example.

This circuit board comprises a double-sided adhesive tape 4 which is interposed between the rear face of the outer package 1 and the substrate SB, and a solder material SD which is interposed between the electrode pad E1 and the metallic thin film 3a, and which reaches an outer surface of the metallic thin film 3a.

In the foregoing case, as described above, since the lead 3 and the electrode pad E1 are firmly fixed and the rear face of the outer package 1 and the substrate SB are also firmly fixed with the double-sided adhesive tape 4, obtained is a circuit board that is resistant to oscillation.

Moreover, with, this circuit board, the solder material SD contains Sn and Cu. Since this kind of material has favorable affinity with Sn contained in the plating layer 3a2 (refer to FIG. 33), the wettability of the solder material SD will increase. However, since Cu is contained, the melting point of the solder decreases, and effects are yielded in that the solder workability is improved and the solder wettability is improved. Moreover, the solder material more preferably contains trace amounts of Ag. In the foregoing case, an effect is yielded in that the durability after the solder welding will improve. The ratio (mass percent ratio) of the respective elements in the solder material SD in this example is as shown below, and a variation of ±1 (mass %) is tolerated in the respective numerical values (provided, however, that the ratio of Cu>0 mass %).

Sn:Cu:Ag=96.5 (mass %):0.5 (mass %):3 (mass %)

The method of assembling the foregoing lead is now explained.

Figure 35:
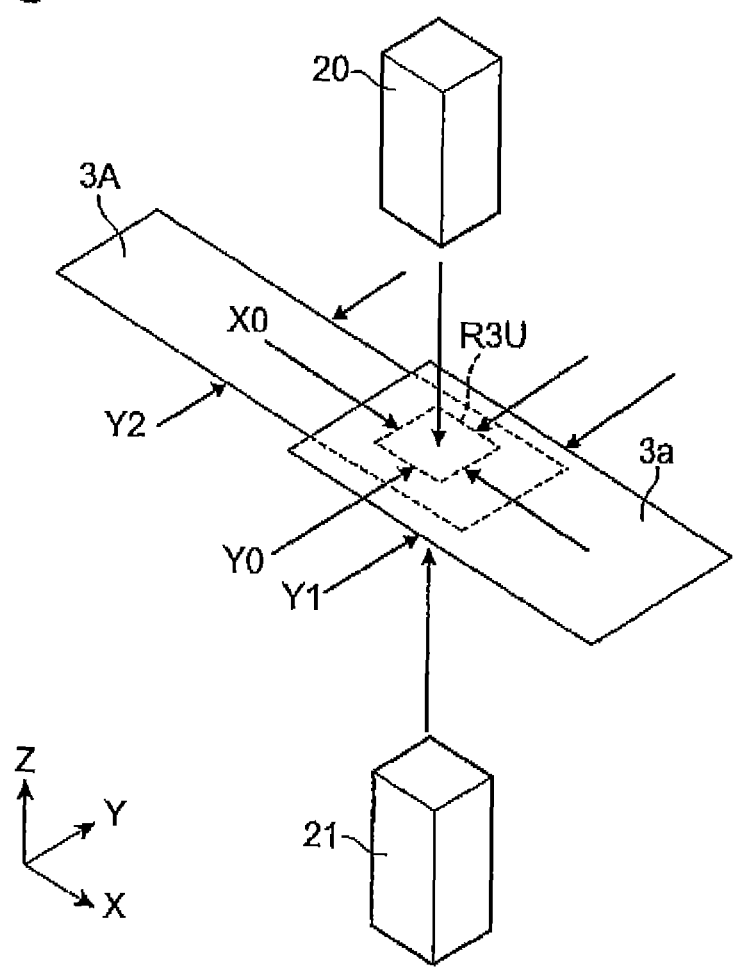

FIG. 35 is a perspective view showing the welding process of the lead body and the metallic thin film.

The lead body 3A and the metallic thin film 3a are prepared, and areas are partially superposed so that the longitudinal directions thereof coincide with the X axis. The width Y2 of the lead body 3A in the Y axis direction, the width Y1 of the metallic thin film 3a, and the width Y0 of the welding area R3U are constant along the X axis, but the width Y0 of the welding area R3U is smaller than the width Y2 of the lead body 3A, and, as a general rule, the welding area R3U does not overlap with the plating layers 3a21, 3a22 (refer to FIG. 33) positioned at the opposite ends in the Y axis direction, The width Y2 of the lead body 3A in the Y axis direction is smaller than the width Y1 of the metallic thin film 3a, and, although the width Y2 of the lead body 3A is shown to be smaller than the width Y1 of the metallic thin film 3a in FIG. 35, these widths may also be the same. Ultrasonic vibrator heads 20, 21 for performing ultrasonic welding are positioned at the vertical position in the thickness direction, and, by oscillating an oscillator that is mechanically connected to one of such ultrasonic vibrator heads 20, 21, the welding area R3U that comes into contact with the ultrasonic vibrator heads 20, 21 will melt, and the lead body 3A made of Al and the lower face exposed area (Hi) of the metallic thin film 3a become fused.

FIG. 36 is a diagram showing the method of fixing the lead body and the metallic thin film.

As the foregoing fixing method, considered may be the method shown in FIG. 36Aa to FIG. 36Ae (hereinafter referred to as the "bend-type manufacturing method") and the method shown in FIG. 36Ba to FIG. 36Be (hereinafter referred to as the "cover-type manufacturing method").

The method (A) is foremost explained. The process shown in FIG. 35 is illustrated in FIG. 36Aa. In this process, the lead body 3A and the metallic thin film 3a are subject to ultrasonic welding and thereby physically and electrically connected. Next, as shown in FIG. 36Ab, the lead body 3A and the metallic thin film 3a are pinched with jigs 23, 22, and, as shown with the arrow in the figure, the metallic thin film 3a that is protruding from the jigs is bent with the Y axis as the bending axis. The positive direction end of the X axis of the jigs 23, 22 is parallel to the Y axis, and these positive direction ends coincide with the position of the positive direction end of the X axis of the lead body 3A. The cross section shape of the lower jig 23 is a right triangle in the XZ plane, and its inclined face is inclined so as to form an acute angle relative to the X axis (angle of the jig is 90 degrees or less (particularly around 30 degrees)).

Accordingly, when the metallic thin film 3a is bent by being pressed against the inclined face of the jig 23, as shown in FIG. 36A; the metallic thin, film 3a is bent with the Y axis as the bending axis. Next, as shown in FIG. 36Ad, by removing the lower jig 23 and pressing the floating metallic thin film 3a in the direction (Z axis positive direction) of the arrow in the figure, the metallic thin film 3a will become completely bent and contact the rear face of the lead body 3A. Here, the metallic thin film 3a is bent so that the vicinity of the bending axis becomes a curved shape. Finally, the lead body 3A and the metallic thin film 3a are subject to ultrasonic fusion once again. Here, as shown in FIG. 36Ae, the strength of the fused portion can be enhanced by ultrasonic-welding the metallic thin film 3a to both the front and rear faces of the lead body 3A. This ultrasonic fusion process is the same as the process shown in FIG. 35 and FIG. 36Aa excluding the point that the metallic thin film 3a is bent. Based on the foregoing process, the lower welding area R3L (refer to FIG. 2) is formed, the thin film body 3a1 of the metallic thin film 3a and the lead body 3A are welded, and these become physically and electrically connected.

Note that, in the foregoing process, although the bending axis of the metallic thin film 3a is parallel to the Y axis in FIG. 36, this may also be parallel to the X axis as described later. Moreover, the jigs used for bending the metallic thin film 3a are not limited to those which are illustrated.

The method of FIG. 36Ba to FIG. 36Bc is now explained. With this method, foremost, as shown in FIG. 36Ba, the metallic thin film 3a is preliminarily bent so that the vicinity of the bending axis becomes a curved shape (for example, a U-shape) so that the plane with the exposed area where the plating layer is not formed is on the inward side in the metallic thin film 3a. Next, as shown in FIG. 36Bb, the bent metallic thin film 3a is placed over the tip of the lead body 3A and pinched so that the metallic thin film 3a covers the upper and lower faces and the side face of the lead body 3A. The bending axis of the metallic thin film 3a is parallel to the Y axis in FIG. 36Bb, but this may also be parallel to the X axis as described later. Finally, as shown in FIG. 36Bc, ultrasonic fusion is performed according to the same method shown in FIG. 36Ae. Based on the foregoing process, the upper and lower welding areas R3U, R3L (refer to FIG. 31) are formed, the thin film body 3a1 of the metallic thin film 3a and the lead body 3A are welded at both the upper and lower positions, and these become physically and electrically connected.

Note that, in the foregoing embodiment, a case was explained where the metallic thin film 3a is bent at the bending axis that is parallel to the Y axis so as to cover the side face (YZ plane) of the tip part of the lead body 3A in the longitudinal direction, but it is also possible to bend the metallic thin film 3a at the bending axis that is parallel to the X axis so as to cover the side face (XZ plane) of the lead body 3A along the Y axis direction.

FIG. 41 is a diagram explaining the structure and mounting method of the metallic thin film according to the respective embodiments. The structure shown in FIG. 41A is the structure of the metallic thin film explained with reference to FIGS. 1 and 2. The structure shown in FIG. 41B is the structure of bending the metallic thin film 3a at the bending axis that is parallel to the X axis. The structure shown in FIG. 41C is the structure where the width Y1 of the metallic thin film before bending 3a is greater than the width Y2 of the lead body 3A, and the metallic thin film 3a is bent at the bending axis that is parallel to the Y axis. The structure shown in FIG. 41D is the structure where the tip of the metallic thin film. 3a is protruding farther than the lead body 3A in the positive direction of the X axis, and the metallic thin film 3a is bent at the bending axis that is parallel to the X axis. Note that the distance DS of the gap S between the metallic thin film 3a and the lead body 3A is the distance along the X axis direction in the case of the structures shown in FIG. 41A and FIG. 41C, and is the distance along the Y axis direction in the case of the structures shown in FIG. 41B and FIG. 41D. Moreover, although FIG. 41 shows a case of preparing the respective structures with the method of FIG. 36Aa to FIG. 36Ae, the structures may also be prepared using the method of FIG. 36Ba to FIG. 36Bc. All of the foregoing embodiments are able to yield the effect of the present invention.

Experiments were conducted for measuring the mounting strength regarding the foregoing electrochemical device.

In this example, the EDLC was manufactured according to the following procedures. Foremost, activated carbon and a conductive assistant, a binder (PVDF: polyvinylidene fluoride) and a solvent (NMP: N-methylpyrrolidone) were mixed to prepare paint, and this was applied to the collector foil (aluminum foil) and dried, and an electrode sheet to become the electrode terminal of the capacitor was thereby obtained. This electrode sheet was punched out into a size of 12 mm×17 mm, and laminated so that the electrode surfaces face each other via a separator. An Al lead (aluminum: thickness 100 µm) was ultrasonic-welded to the electrode extraction part of the respective foils to obtain a laminate with an aluminum lead. Two such laminates were placed in an aluminum laminated foil configuring the outer package via a PP (polypropylene) sealant and three sides were sealed, and, after pouring in an electrolytic solution, the final one side was sealed to obtain an EDLC. The Al lead tip was prepared as with the following example. The evaluation was performed by disposing a 5 mm×3 mm electrode pad E1 on a substrate SB made of glass epoxy (Flame Retardant Type 4) (1.6 mm thickness) and connecting the lead tip part of the EDLC to the solder material SD, and measuring the strength thereof by conducting a horizontal tensile strength test.

Figure 38:
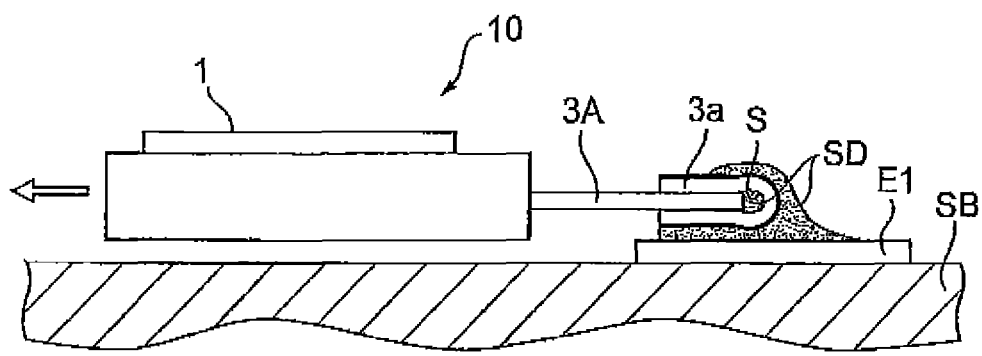
Figure 41A:
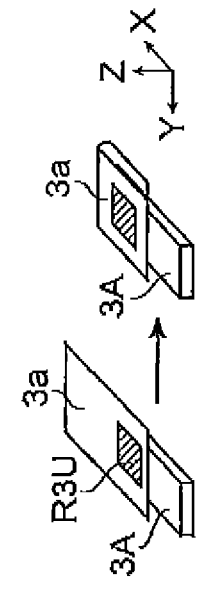
Figure 41C:
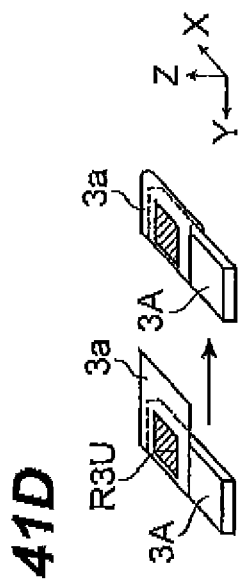
Figure 41B:
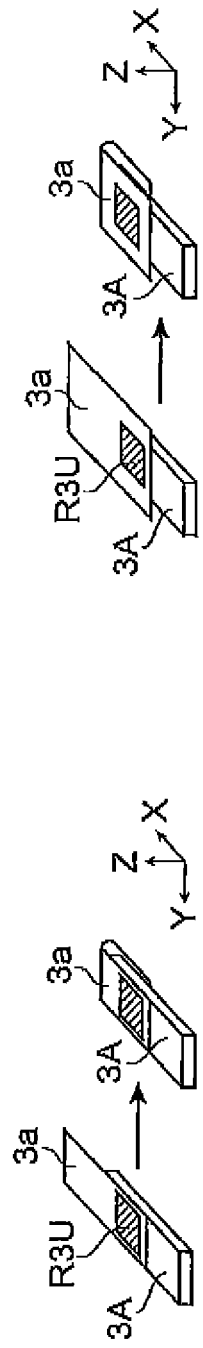
Figure 41D:
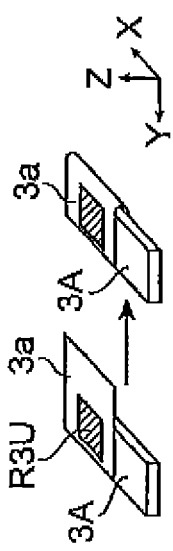

FIG. 38 is a diagram explaining the experimental method of the Examples.

The lead 3 of the electrochemical device 10 was disposed on the electrode pad E2 of the circuit board SB, and the solder material SD was melted and caused to drip onto the lead 3 and subsequently cooled to fix the same. Note that the electrochemical device 10 was pulled in the arrow direction (negative direction of the X axis) in the figure to measure the tensile strength in the horizontal direction without using the adhesive tape shown in FIG. 37.

COMPARATIVE EXAMPLE 1

FIG. 39 is a diagram explaining the experimental method of Comparative Example 1.

With Comparative Example 1, in comparison to the Examples, a metallic thin film 3b in which a non-bent Ni thin film body was subject to Sn plating was used in substitute for the bent metallic thin film 3a, and this was connected to the lower face of the lead body 3A based on ultrasonic fusion as with the foregoing method, and the product thereof was used. The solder material SD is interposed between the metallic thin film 3b and the electrode pad E1, but it was not able to crawl up the exposed side face of the lead body 3A made of aluminum, and, when the melted solder material SD was caused to drip from above, the solder material SD moved to the lower side of the lead body 3A and then solidified. This electrochemical device 10 was also pulled in the arrow direction (negative direction of the X axis) of FIG. 39 to measure the tensile strength in the horizontal direction,

COMPARATIVE EXAMPLE 2

FIG. 40 is a diagram explaining the experimental method of Comparative Example 2.

With Comparative Example 2, in comparison to Comparative Example 1, the tip of the metallic thin film 3b is mounted on the tip of the lead body 3A so as to protrude therefrom, and a melted solder ball 3c was caused to drip onto the tip of the metallic thin film 3b and subsequently cooled and fixed, and the solder ball 3c and the electrode pad E1 were fixed with the solder material SD. The solder material SD can be positioned between the solder ball 3c and the electrode pad E1 and on the upper face of the solder ball 3c, but it could not crawl up the exposed side face of the metallic thin film 3b, and, when the melted solder material SD was caused to drip from above, the solder material SD became collected in the vicinity of the solder ball 3c and then solidified. This electrochemical device 10 was also pulled in the arrow direction (negative direction of the X axis) of FIG. 40 to measure the tensile strength in the horizontal direction.

EXAMPLE 1

In Example 1 (Example 1-1 to Example 1-7), the width Y2 of the lead body 3A and the width Y1 of the metallic thin film 3a (refer to FIG. 35) are the same, the bending axis of the metallic thin film 3a is parallel to the Y axis, and the metallic thin film 3a is covering the side face of the lead body 3A of the tip in the X axis direction in the lead tip part. The respective dimensions were as follows with reference to FIG. 31 and FIG. 35.

X0=2 mm
Y0=2 mm
Y1=3 mm
Y2=3 mm
XA=5 mm
Xa□3 mm
DS=0.5 mm

Note that the thickness of the thin film body 3a1 is 100 µm, and the thickness of the Sn plated layer 3a2 is 0.3 µm (Example 1-1), 0.5 µm (Example 1-2), 2 µm (Example 1-3), 5 µm (Example 14), 7 µm (Example 1-5), 10 µm (Example 1-6), and 10.5 µm (Example 1-7). Note that Ea 2000 manufactured by Branson was used for the ultrasonic fusion (welding energy=12.0 J, welding time=0.1 sec), and ultrasonic fusion was performed respectively from above and below before and after the bending of the metallic thin film.

This method is the method of mounting the metallic thin film 3a on the Al lead body 3A by disposing the metallic thin film 3a so that it partially does not overlap with the tip of the Al lead body 3A, thereafter connecting these components, bending such non-overlapping portion so as to encompass the Al lead body 3A, and once again connecting to the Al lead body 3A the metallic thin film 3a of the face that is not connected to the Al lead body 3A. Note that the metallic thin film 3a was bent into a curved shape so that a gap S is formed between the metallic thin film 3a and the side face of the Al lead body 3A at the bent portion.

EXAMPLE 2

The width Y2 of the lead body 3A and the width Y1 of the metallic thin film 3a (refer to FIG. 35) are the same, the bending axis of the metallic thin film 3a is parallel to the Y axis, and the metallic thin film 3a is covering the side face of the lead body 3A of the tip in the X axis direction in the lead tip part. The respective dimensions were as follows with reference to FIG. 31 and FIG. 35, X0=2 mm
Y0=2 mm
Y1=3 mm
Y2=3 mm
XA=6.5 mm
Xa=4.5 mm
DS=2 mm Example 2 is the same as Example 1-3 other than that the distance DS of the gap S between the metallic thin film 3a and the side face of the Al lead body 3A was changed.

COMPARATIVE EXAMPLE 3

The width Y2 of the lead body 3A and the width Y1 of the metallic thin film 3a (refer to FIG. 35) are the same, the bending axis of the metallic thin film 3a is parallel to the Y axis, and the metallic thin film 3a is covering the side face of the lead body 3A of the tip in the X axis direction in the lead tip part. The respective dimensions were as follows with reference to FIG. 31 and FIG. 35.

X0=2 mm
Y0=2 mm
Y1=3 mm
Y2=3 mm
XA=5 mm
Xa=3 mm
DS=0.5 mm

In Comparative Example 3, the metallic thin film 3a was bent at a right angle (U-shape with straight angles) along the side face of the Al lead body 3A. Note that the metallic thin film 3a was bent so as to form a gap S between the metallic thin film 3a and the Al lead body 3A. The other conditions are the same as Example 1-3.

COMPARATIVE EXAMPLE 4

The width Y2 of the lead body 3A and the width Y1 of the metallic thin film 3a (refer to FIG. 35) are the same, the bending axis of the metallic thin film 3a is parallel to the Y axis, and the metallic thin film 3a is covering the side face of the lead body 3A of the tip in the X axis direction in the lead tip part. The respective dimensions were as follows with reference to FIG. 31 and FIG. 36.

X0=2 mm
Y0=2 mm
Y1=3 mm
Y2=3 mm
XA=4.5 mm
Xa=2.5 mm
DS=0 mm

Comparative Example 4 is the same as Example 1-3 other than that the gap S between the metallic thin film 3a and the side face of the Al lead body 3A was not fanned, <Measurement of Mounting Strength>

Based on the foregoing methods, the mounting strength of the EDLC of Examples 1-1 to 1-7, Example 2 and Comparative Examples 1 to 3 was measured. Table 1-1 below is a table showing the experimental results. The number of samples n is 100 samples, and the average value (N) and the standard deviation (N) of the horizontal tensile strength are shown.

In Examples 1 and 2 and Comparative Example 3, the lead did not rupture or come off even when force of 25 N was applied in the horizontal direction. Moreover, as shown in Example 1-1 to Example 1-7, even when the plating thickness was changed within the range of 0.3 μm or more and 10.5 μm or less, there was no change in the tensile strength in the horizontal direction. Note that 25 N is the measurement limit of the measuring device. Meanwhile, with Comparative Examples 1, 2 and 4, the lead came off from the electrode pad E1 when force of 7.8 N, force of 17.3 N and force of 22.7 N were applied, respectively. There was also variation in Comparative Examples 1, 2 and 4.

<Evaluation of Status of Connection of Lead>

The evaluation results of the status of connection of the lead are shown in Table 1-1 below. With respect to the results concerning the status of connection of the lead, in Example 1-1, 94 samples were non-defective among the 100 samples, but 6 samples contained parts where the solder wettability was insufficient (evaluation result of status of connection: Δ). In Example 1-7, 95 samples were non-defective among the 100 samples, but 5 samples contained parts with cracks at the interface of the thin film body 3a1 made of Ni foil and the Sn plated layer 3a2 (evaluation result of status of connection: Δ). In Comparative Example 3, 62 samples among the 100 samples were non-defective, but 38 samples contained parts where the solder wettability was insufficient (evaluation result of status of connection: Δ). In Comparative Example 1, 98 samples among the 100 samples contained parts where the solder wettability was inferior (evaluation result of status of connection: ×). In Comparative Example 2, 80 samples among the 100 samples contained parts where the solder wettability was inferior (evaluation result of status of connection: ×). In other Examples 1-2 to 1.6 and Example 2, and Comparative Example 4, all samples were non-defective, and no parts could be acknowledged where the solder wettability was insufficient or parts with cracks as those described above (evaluation result of status of connection: ○).

Note that the expression "parts where the solder wettability was insufficient" specifically refers to the parts where the plating layer becomes thin due to the variation in the plating layer thickness and the solder is easily repelled, and the expression "parts where the solder wettability is inferior" specifically refers to the parts where the plating layer was not formed and the solder could not be spread thereon. Moreover, the expression "parts with cracks at the interface" specifically refers to the parts where, after forming the plating layer, the plating layer became separated from the Ni layer. In particular, the parts with cracks at the interface tend to occur at the bent portion.

<Evaluation of Connection Reliability>

With the process of retaining the EDLC at −25° C. for 30 minutes and thereafter retaining such EDLC at 70° C. for 30 minutes as one cycle, 500 cycles were performed to the EDLC of Examples 1-1 to 1-7, Example 2 and Comparative Examples 1 to 4. Subsequently, the same experiment as the foregoing measurement of the mounting strength was performed to obtain the average value (N) of the horizontal tensile strength. The number of samples n was 100 samples. The results are shown in Table 1-1.

TABLE 1-1

|  |  | Thickness of plated layer (μm) | Average value (N) | Standard deviation (N) | Status of connection | Reliability of connection (N) |
| --- | --- | --- | --- | --- | --- | --- |
| Example 1 | Example 1-1 | 0.3 | >25 | — | Δ | 17.1 |
|  | Example 1-2 | 0.5 |  |  | ○ | 19.6 |
|  | Example 1-3 | 2 |  |  | ○ | 18.3 |
|  | Example 1-4 | 5 |  |  | ○ | 17.0 |

TABLE 1-1-continued

|  | Thickness of plated layer (μm) | Average value (N) | Standard deviation (N) | Status of connection | Reliability of connection (N) |
|---|---|---|---|---|---|
| Example 1-5 | 7 | | | ○ | 19.4 |
| Example 1-6 | 10 | | | ○ | 16.9 |
| Example 1-7 | 10.5 | | | Δ | 18.1 |
| Example 2 | 2 | >25 | — | ○ | 17.2 |
| Comparative Example 1 | 2 | 7.8 | 2.2 | x | 2.4 |
| Comparative Example 2 | — | 17.3 | 3.1 | x | 8.6 |
| Comparative Example 3 | 2 | >25 | — | Δ | 12.3 |
| Comparative Example 4 | 2 | 22.7 | 1.7 | ○ | 9.8 |

Upon considering these results, with the structure of Comparative Example 1, it is considered that the solder material was repelled by Al and unable to form a sufficient fillet, and the reliability is insufficient. Meanwhile, with the structure of Examples 1 and 2 in which the metallic thin film (Ni tab) was bent and formed on the Al lead body, it was possible to form a clean fillet from the side face of the lead body covered with the metallic thin film to the electrode pad and obtain sufficient connection strength, and sufficient reliability was thereby obtained. Moreover, according to the structure of the respective Examples, the structure becomes resistant to the anticipated load (pulling and twisting) that will be applied to the EDLC after the lead is bonded.

With the ultrasonic fusion of the lead body 3A and the metallic thin film 3a, preferably the metallic thin film 3a and the lead body 3A are connected firmly. When handling a high current (for example, 1 ampere or higher), the contact resistance between the lead body 3A and the metallic thin film 3a will generate an extremely significant loss. Thus, the lead body 3A and the metallic thin film 3a need to be firmly fused so as to reduce the contact resistance thereof as much as possible.

Moreover, with Comparative Example 2, since the solder ball as the preliminary soldering is uneven, the fillet that is formed also becomes uneven (in certain cases only the bottom face), variation arises in the connection strength. Meanwhile, with Comparative Example 4, although the solder connection strength was favorable immediately after the treatment, since a gap S was not formed and the spreading of the solder was insufficient, it lacked the function of retaining the connection strength between the lead 3 and the electrode pad E1 over a long period of time. Consequently, there is a possibility that problems may arise in the connection life in terms of long-term reliability. However, with the structure of Examples 1 and 2, stable connection strength can be ensured since it is possible to form a fillet on the plated surface. Accordingly, with the structure of the Examples, the connection life in terms of long-term reliability can be significantly improved.

Moreover, with Examples 1 and 2, the horizontal tensile strength after the cycle experiment was maintained in comparison to Comparative Examples 3 and 4, and it was confirmed that Examples 1 and 2 have superior connection reliability.

As explained above, since a thin EDLC using a laminated outer package is demanded of solder connectability to a printed board, and a lead of the EDLC needs to satisfy both the resistance properties and electrical conductivity relative to the electrolytic solution, Al with inferior solder wettability was used, and it was not possible to improve the connection strength. In this embodiment, it was possible to improve the fixation strength by using a bent metallic thin film. Since this method adopts processes with superior reproducibility such as plating and fusion, automation can be realized easily, and this is also desirable in terms of productivity. As electronic components having this kind of a flat lead terminal shape, lithium ion batteries and electrolytic capacitors are know in addition to EDLC, and the present invention can also be applied to these components.

The electrochemical device of type D is now explained.

In cases of the foregoing conventional technology, with a lead made of aluminum, there is a problem in that the fixation strength between the electrode pad and the lead deteriorates since the wettability relative to the solder material is low.

The invention of type D was devised in view of the foregoing problem, and the object of this embodiment is to provide an electrochemical device and a circuit board capable of improving the fixation strength between the electrode pad and the lead, as well as the manufacturing method thereof, a circuit board, and a housing tray for housing the foregoing electrochemical device.

In order to achieve the foregoing object, the electrochemical device of according to the present invention is an electrochemical device including a charger/discharger housed in an outer package, and a lead extending from the charger/discharger, wherein the lead comprises a lead body containing Al, and a metallic thin film which is provided to a tip part of the lead body, which is bent so as to cover a lower face and a side face of the lead body, and in which a predetermined area is welded to the lead body, wherein the metallic thin film includes a thin film body containing Ni, and a plating layer containing Sn and covering at least an outer surface of the bent thin film body, wherein a specific area of an inner surface of the bent thin film body and a surface of the lead body are directly in contact and welded in the predetermined area without the plating layer being disposed therebetween, and wherein the lead is bent so as to incline in an obliquely downward direction from a position which is in contact with the outer package.

Since the surface of the metallic thin film includes a plating layer containing Sn and the wettability relative to the solder material is high, the metallic thin film and the electrode pad are firmly fixed via the solder material. Here, since Ni is contained in the thin film body on which the plating layer is formed, Ni and Sn are bonded firmly. Moreover, since the solder material becomes adhered to the outer surface of the bent metallic thin film, the solder material crawls up to the side face portion in addition to the lower face (surface on the electrode pad side) portion that is covered by the metallic thin film of the lead body, the fixation strength between the electrode pad and the metallic thin film can be further increased. In addition, since the lead is bent so as to incline in an obliquely downward direction from a position which is in contact with the outer package (boundary position with the outer package), the lead can easily come in contact with the electrode pad and the fixation strength between the electrode pad and the metallic thin film can be further increased. The area where the plating layer of the metallic thin film is not formed is welded to the lead body containing Al, but since Ni and Al can be firmly welded, the metallic thin film and the lead body are also firmly fixed. Accordingly, it is possible to significantly improve the fixation strength between the electrode pad and the lead.

Moreover, with the electrochemical device of the present invention, the lead is bent so that its tip is positioned lower than a plane extending from a bottom face of the outer package. As a result of the lead being bent to the foregoing position, the lead can more easily come in contact with the electrode pad and the fixation strength between the electrode pad and the metallic thin film can be further increased.

Moreover, with the electrochemical device of the present invention, an inclination angle of the lead relative to a plane that is parallel to a bottom face of the outer package is 10 to 80°. As a result of the lead being bent at the foregoing inclination angle, the lead can more easily come in contact with the electrode pad and the fixation strength between the electrode pad and the metallic thin film can be further increased.

Moreover, with the electrochemical device of the present invention, the plating layer is formed along a direction that is perpendicular to a bending axis direction of the thin film body on an inner surface of the thin film body in the vicinity of opposite end positions of the bent metallic thin film in the bending axis direction.

As a result of forming the plating layer in the vicinity of such opposite end positions, the contour of the cross section shape of the plating layer will acquire linearity. In other words, the product deviation can be reduced since variation in the thickness of the plating layer will decrease, and it is thereby possible to provide an electrochemical device of stable quality. Note that, when bending the metallic thin film at multiple locations, the plating layer is formed in the vicinity of opposite end positions in one of the bending axis directions, and is preferably formed in the vicinity of the opposite end positions in a direction that is perpendicular to the longitudinal direction of the metallic thin film.

Moreover, with the electrochemical device of the present invention, a thickness of the plating layer is 0.5 µm or more and 10 µm or less. Specifically, if the thickness is less than 0.5 µm, defects may arise in the plating layer, and, if the thickness exceeds 10 µm, it tends to interfere with the welding.

Moreover, with the electrochemical device of the present invention, a thickness of the thin film body is 50 µm, or more and 500 µm or less. If the thickness of the thin film body falls below 50 µm, in the case of forming the foregoing plating layer structure, an adhesive tape is affixed to the non-plated area of the thin film body, plating is subsequently performed, and the adhesive tape is peeled thereafter at an appropriate timing, but the thin film body oscillates during the foregoing process and wrinkles, kinks, crimps and the like tend to form on the thin film body, and, since such defects cannot be controlled, an error occurs in the quality of the product. Moreover, if the thickness of the thin film body exceeds 500 µm, this is undesirable since the bonding with the lead tends to become difficult. The present invention can inhibit the foregoing defects by setting the thickness of the thin film body to be within the foregoing range.

Moreover, with the electrochemical device of the present invention, a dimension of the bent metallic thin film in a longitudinal direction of the lead is 1 mm or more.

If the foregoing dimension is less than 1 mm, the bond strength with the electrode pad based on soldering tends to deteriorate, and sufficient bond strength can be obtained if the dimension is 1 mm or more, especially if it is 2 mm or more. Note that the foregoing dimension is preferably 5 mm or less, and sufficient bond strength can be obtained in the foregoing case.

Moreover, with the electrochemical device of the present invention, the plating layer contains 98±1 (mass %) of Sn and 2±1 (mass %) of Cu.±1 (mass %) is a tolerable error.

In the foregoing case, an effect is yielded in that the melting point of the solder decreases during solder welding, and bonding can be performed easily.

Moreover, the method of manufacturing the electrochemical device according to the present invention is a method of manufacturing a electrochemical device according to any electrochemical devices above, comprising the steps of: preparing an electrochemical device, before being subjected to bending, including the charger/discharger housed in the outer package, and the lead which has the lead body and the metallic thin film before being subjected to bending provided to the tip part of the lead body, and which extends from the charger/discharger in a direction that is parallel to the bottom face of the charger/discharger; mounting the electrochemical device, before being subjected to bending, on a bending jig including a principal plane for mounting the charger/discharger housed in the outer package, an inclined plane extending at an angle from the principal plane in an obliquely downward direction, and a vertical plane extending in a direction that is perpendicular to the inclined plane; and bending the lead so that it inclines in an obliquely downward direction from a position which is in contact with the outer package by pressing the lead against the inclined plane and the vertical plane, and simultaneously bending the metallic thin film so as to cover a lower face and a side face of the lead body.

According to the foregoing manufacturing method, the bending jig of the foregoing structure can be used to simultaneously bend the lead and bend the metallic thin film, and the electrochemical device of the present invention can thereby be manufactured efficiently. In addition, as a result of performing the bending of the lead and the bending of the metallic thin film simultaneously, variation in the dimension can be reduced in comparison to performing the foregoing bending separately, and an electrochemical device with a uniform dimension can be manufactured efficiently.

Moreover, the circuit board of the present invention comprises any one of the foregoing electrochemical devices, a substrate on which the electrochemical device is mounted and which comprises an electrode pad, a double-sided adhesive tape which is interposed between a rear face of the outer package and the substrate, and a solder material which is interposed between the electrode pad and the metallic thin film, and which reaches an outer surface of the metallic thin film.

In the foregoing case, since the lead and the electrode pad are firmly fixed and the rear face of the outer package and the substrate are also firmly fixed with the double-sided adhesive tape, obtained is a circuit board that is resistant to oscillation.

Moreover, with the circuit board of the present invention, the solder material contains Sn, and Cu. In the case of this kind of material, since the affinity with Sn contained in the plating layer is favorable, the wettability of the solder material will increase. However, since Cu is contained, the melting point of the solder decreases during solder welding, and an effect is yielded in that bonding can be performed easily. Moreover, the solder material preferably contains trace amounts of Ag. In the foregoing case, an effect is yielded in that the durability after the solder welding will improve.

In addition, the housing tray of the present invention is a housing tray for housing any one of the foregoing electrochemical devices, comprising a body housing part for housing the charger/discharger housed in the outer package, and a lead housing part including an inclined plane extending at an angle from the body housing part in an obliquely downward direction.

As a result of comprising a lead housing part including an inclined plane, the foregoing housing tray can easily house the bent lead in the electrochemical device of the present invention, and is extremely effective as a tray for housing the electrochemical device of the present invention.

According to the electrochemical device and the circuit board of the present invention, the fixation strength between the electrode pad and the lead can be improved, and superior reliability is thereby yielded. Moreover, according to the manufacturing method of the electrochemical device of the present invention, the electrochemical device of the present invention can be manufactured efficiently with uniform dimension. In addition, according to the housing tray of the present invention, it is suitable for housing the electrochemical device of the present invention.

The electrochemical device of type D is now explained in detail.

Figure 43:
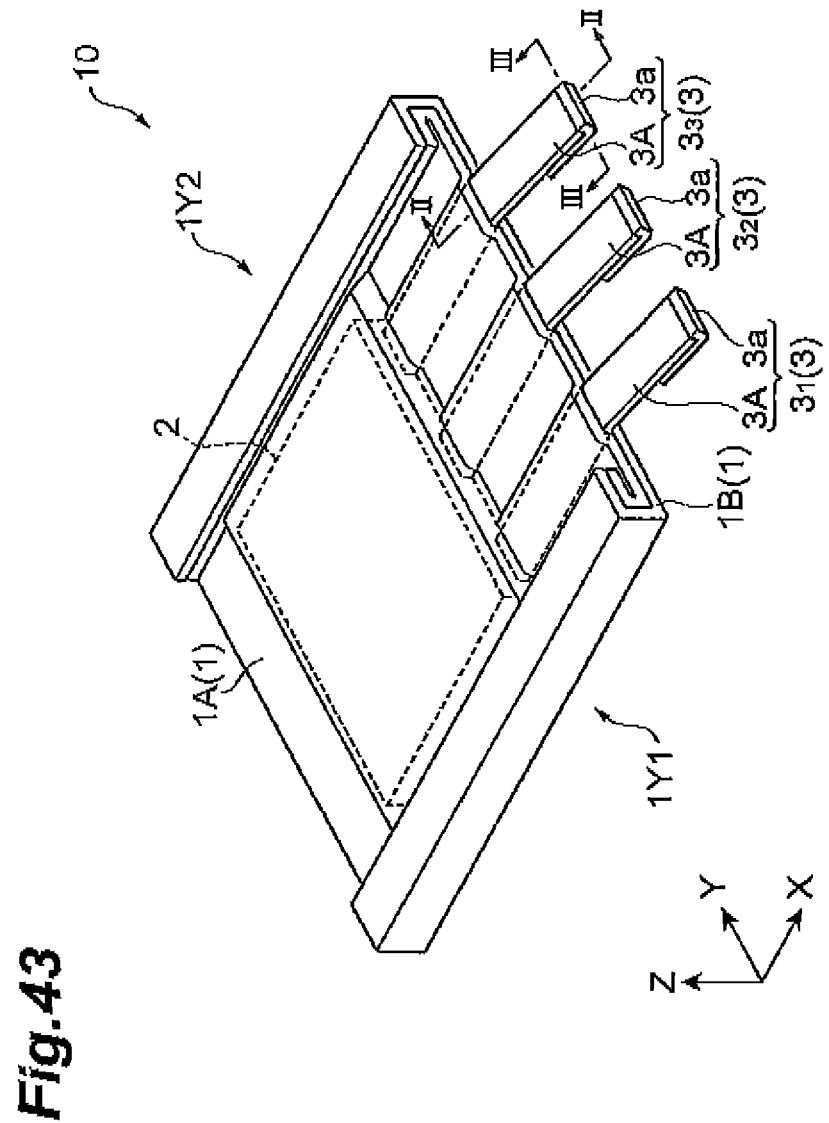
FIG. 43 is a perspective view of the electrochemical device.
Figure 44:
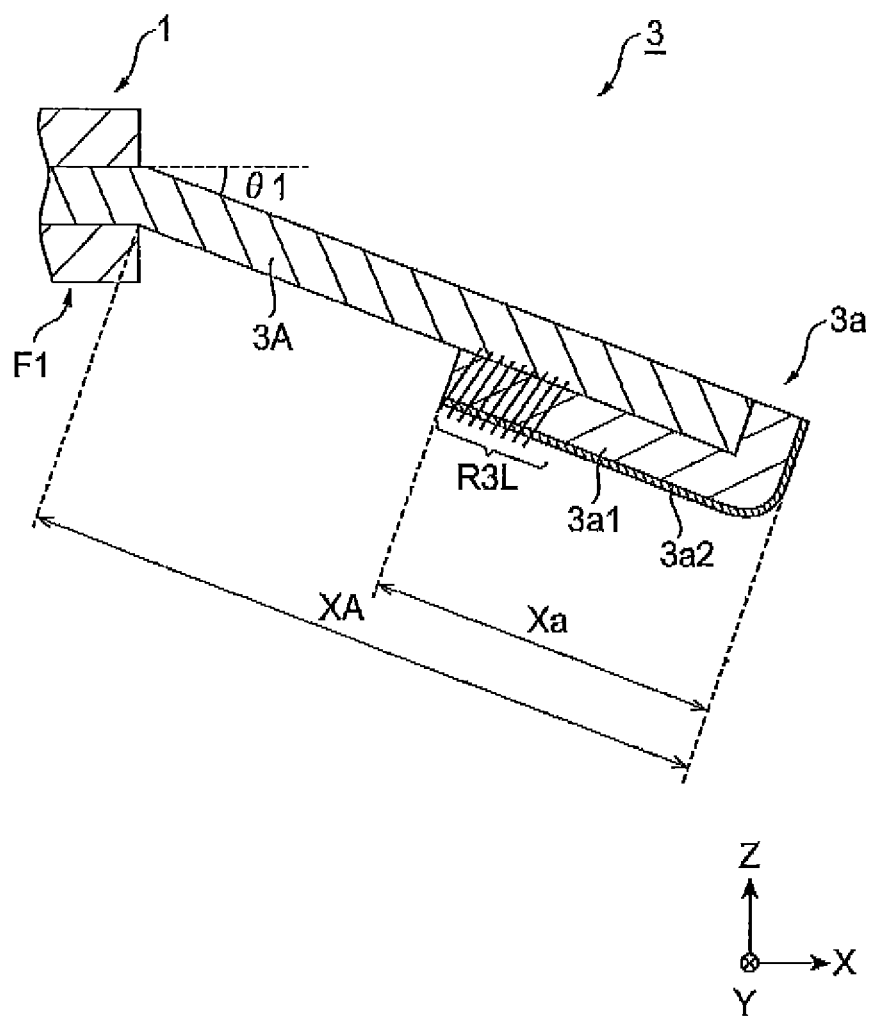
FIG. 44 is an arrow II-II cross section of the electrochemical device shown in FIG. 42.
Figure 45:
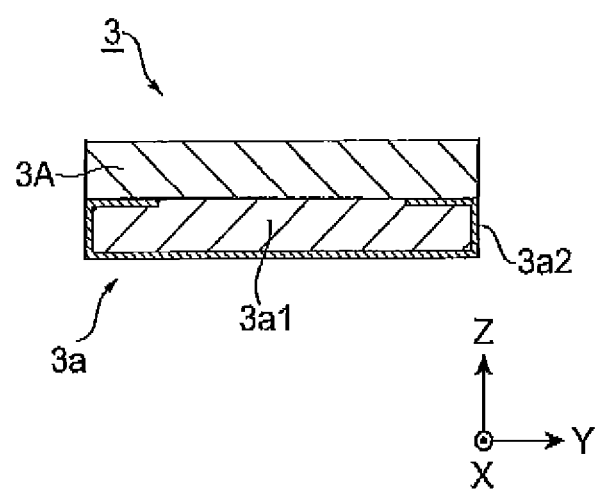
FIG. 45 is an arrow III-III cross section of the electrochemical device shown in FIG. 42.

FIG. 43 is a perspective view of the electrochemical device, FIG. 44 is an arrow II-II cross section of the electrochemical device, and FIG. 45 is an arrow III-III cross section of the electrochemical device. Moreover, FIG. 50 an XZ cross section of the circuit board on which the electrochemical device is mounted.

The electrochemical device 10 includes a charger/discharger 2 housed in an outer package 1, and a plurality of leads 3 extending from the charger/discharger 2. The outer package 1 is configured by superposing a rectangular upper laminated sheet 1A and a rectangular lower laminated sheet 1B, and bonding the areas in the vicinity of the four sides of the periphery thereof. The laminated sheets 1A, 1B are respectively formed by coating an inner surface of an aluminum thin film with a resin layer. A three dimensional Cartesian coordinate system as shown in FIG. 43 is set with the thickness direction of the outer package 1 as the Z axis, the width direction as the Y axis, and the length direction as the X axis. Regions 1Y1, 1Y2 in the vicinity of opposite ends of the outer package 1 in the Y axis direction are bent inward at the boundary line along the X axis, and the mechanical strength of the outer package 1 is thereby enhanced, An electrolytic solution and the charger/discharger 2 are disposed within hermetically-sealed internal space of the outer package 1. Via the lead 3, an electrical charge can be accumulated in the charger/discharger 2 and the accumulated electrical charge can also be discharged therefrom. Various structures may be used for the charger/discharger 2, but capacitors connected in series are used in this example. Specifically, the electrochemical device 10 in this case configures an EDLC (Electric Double Layer Capacitor).

Here, the internal electrical circuit structure of the EDLC is shown in FIG. 55.

The charger/discharger 2 is configured by connecting a capacitor 2A and a capacitor 2B in series, a lead $3_2$ is electrically connected to the connection tip parts thereof, and a lead $3_1$ and a lead $3_3$ are electrically connected, respectively, to terminals which are different from the foregoing connection tip parts of the capacitor 2A and the capacitor 2B. The inside of the outer package 1 is partitioned into two storage parts with a sealant 1S made of polypropylene or the like, and the capacitor 2A and the capacitor 2B are separately housed in the respective storage parts. Electrolytic solutions LQ1, LQ2 are filled in the respective storage parts inside the outer package 1. The respective terminal electrodes configuring the capacitors 2A, 2B are configured by laminating an active material layer and a collector. Moreover, separators S1, S2 as insulating layers are respectively interposed between the respective terminal electrodes configuring the capacitors 2A, 2B. With an EDLC, electrical charges are aligned as a thin layer between the polarizing conductor and the electrolyte (solution), and electrical charge is accumulated by applying a bias therebetween. The center lead $3_2$ is used for controlling the potential in the connection tip parts of the capacitors 2A and 2B connected in series.

The active material layer is a polarizing electrode. The polarizing electrode is made of a porous material, and manufactured by mixing binder resin in activated carbon. As the binder resin, used may be a high molecular compound containing fluorine such as polytetrafluoroethylene and polyvinylidene fluoride, a rubber-based high molecular compound such as styrene-butadiene rubber, carboxymethyl cellulose, and so on. As needed, carbon black, carbon nanotubes, graphite particles or microfilaments may be added as a conductive assistant. During the manufacture process, these materials are applied to one side or both sides of the collector.

The collector is made of a metal foil. In addition to using an aluminum foil or a titanium foil with a smooth surface, these may also be used upon subjecting the surface thereof to roughening treatment by way of embossing or etching processing. Note that, as the method of manufacturing an electrode, in addition to the method of adding a conductive supplement and binder to activated carbon and forming a sheet shape and bonding this to the collector, a method of forming the activated carbon into a slurry and applying this to the collector may also be used. As the application method, used may be the applicator method, gravure method, reverse roll method, extrusion (nozzle) method, dip method, and so on.

The separators S1, S2 are formed from a nonwoven fabric or a porous film containing, for example, polyolefin resin at a mass ratio of 10% or more. The polarizing electrode and the separator can also be bonded by applying pressure to a pair of polarizing electrodes under a temperature environment which is not less than the softening temperature of the polyolefin resin. As the separator, cellulose nonwoven fabric or nonwoven fabric of aramid fiber may also be used.

As the electrolytic solutions LQ1, LQ2, an aqueous solution and an organic solution are known. As the solvent of an organic electrolytic solution, known are propylene carbonate, ethylene carbonate, dimethyl carbonate, ethyl methyl carbonate, diethyl carbonate, γ-butyrolactone, dimethylformamide, sulfolane, acetonitrile, propionitrile, methoxyacetonitrile and the like, and, as the solute, known are ammonium salt, amine salt, amidine salt and the like, Returning to FIG. 43 to FIG. 45, the structure of the electrochemical device 10 is explained.

In the electrochemical device 10, the lead 3 comprises a lead body 3A containing Al, and a metallic thin film 3a fixed to the tip of the lead body 3A. The metallic thin film 3a is fixed to the tip part of the lead body 3A, and bent so as to cover the lower face (face on the electrode pad side) and the side face of the lead body 3A. Moreover, with the example shown in FIG. 43, the metallic thin film 3a covers the lower face and one side face of the lead body 3A. In addition, as shown in FIG. 44, a predetermined area (R3L) of the metallic thin film 3a is welded to the lead body 3A. Note that, although Al is the main component in the lead body 3A, trace amounts of impurities may be contained. The content rate of Al in the lead body 3A is at least 50 mass % or more, and is preferably 95 mass % or more when giving consideration to the electrical conductivity and the resistance properties against the electrolytic solution.

Moreover, as shown in FIG. 43 and FIG. 44, the lead 3 is bent so as to incline in an obliquely downward direction from a position which is in contact with the outer package 1 (boundary position with the outer package 1) toward the lower side of the substrate mounted with the electrochemical device 10. Preferably, the lead 3 is bent so that its tip is positioned lower than a plane extending from a bottom face F1 of the outer package 1. Here, the foregoing tip of the lead 3 refers to the lowest point of the lead 3 including the metallic thin film 3a. Moreover, preferably, the inclination angle θ1 of the lead 3 relative to the plane that is parallel to the bottom face F1 of the outer package 1 is an angle where the tip of the lead 3 is positioned lower than the plane in which the bottom face F1 of the outer package 1 is extended, and, although it is preferable to adjust this according to the dimension of the lead 3 in the longitudinal direction, the inclination angle θ1 is preferably 10 to 80°, and more preferably 20 to 70°. If the inclination angle θ1 is less than 10°, the improvement effect of the fixation strength between the lead 3 and the electrode pad tends to deteriorate, and, if this exceeds 80°, the lead is likely to deform upon pressing the lead against the electrode pad. Note that the tip of the lead 3 being positioned lower than the plane in which the bottom face F1 of the outer package 1 is extended and the value of the inclination angle θ1 of the lead 3 are those in a state before connecting the lead 3 to the electrode pad. When the lead 3 is connected to the electrode pad, the inclination angle of the lead 3 will change depending on the height of the electrode pad.

In FIG. 43 and FIG. 44, the lead 3 is bent at a position which is in contact with the outer package 1 (boundary position with the outer package 1). As described above, preferably, the lead 3 is bent in the vicinity of a position which is in contact with the outer package 1, but there is no particular limitation in this bending position. For example, the lead 3 may also be bent at a predetermined position within the outer package 1, or bent at a predetermined position between a position which is in contact with the outer package 1 and the tip of the lead 3. In addition, the lead 3 may also be bent in a curved shape.

The metallic thin film 3a includes a thin film body 3a1 containing Ni, and a plating layer 3a2 containing Sn and covering at least an outer surface of the bent thin film body 3a1. The predetermined area to be welded is R3L. The region to be welded is not the entire area of the metallic thin film 3a, and is only a partial area. Specifically, a specific area (an exposed area which is not covered by the plating layer 3a2 and which includes the predetermined area R3L) of the inner surface of the bent thin film body 3a1 and the surface of the lead body 3A are in direct contact without intervention of the plating layer 3a2, and the exposed specific area and the surface of the lead body 3A are welded in the predetermined area R3L.

The inner surface (face which is in contact with the side face of the lead body 3A) of the bent portion of the metallic thin film 3a and the lead body 3A do not need to be welded. Moreover, although FIG. 44 shows a state where the bent portion and the lead body 3A are in close contact, a small space may exist therebetween, and some solder material may enter such space.

The content rate of Ni in the thin film body 3a1 is at least 50 mass % or more, and preferably 95 mass % or more when giving consideration to the point that the adhesion with Al is performed firmly. Moreover, the content rate of Sn in the plating layer 3a2 is decided in consideration of the affinity with the solder material and other matters, but with the electrochemical device of this example, the plating layer 3a2 contains 98±1 (mass %) of Sri. and 2±1 (mass %) of Cu.±1 (mass %) is a tolerable error. In the foregoing case, there is an effect of improving the solder wettability and inhibiting the growth of whiskers.

The surface of the metallic thin film 3a includes a plating layer 3a2 containing Sn, and the metallic thin film 3a and the electrode pad E1 are fixed firmly via the solder material SD since the wettability with the solder material SD (refer to FIG. 50) is high. The solder material SD of FIG. 50 is in contact with both the plating layer 3a2 and the electrode pad E1. Here, since Ni is contained in the thin film body 3a1 on which the plating layer 3a2 shown in FIG. 44 and FIG. 45 is formed, Ni and Sn are bonded firmly.

Moreover, since the solder material SD of FIG. 50 can crawl up to the outer surface of the portion (bent portion) covering the side face of the lead body 3A of the bent metallic thin film 3a, the fixation strength between the electrode pad E1 and the metallic thin film 3a can be further increased. Specifically, Al possesses properties of repelling the melted solder material, and, when the side face of the Al lead body 3A is exposed, such exposed face becomes an obstacle and the solder material SD is unable to crawl up any higher. However, with the structure according to the foregoing embodiment, since the Al side face of the lead body 3A is covered by the metallic thin film 3a, the foregoing drawback can be resolved, and a firm fixed state can be formed.

When referring to FIG. 44, although the area in which the plating layer 3a2 of the metallic thin film 3a is not formed (area long the center line CL in the longitudinal direction before bending (direction that is perpendicular to the bending axis) (refer to FIG. 46)) is welded to the lead body 3A containing Al, since Ni and Al can be welded firmly, the metallic thin film 3a and the lead body 3A are also fixed firmly. Accordingly, it is possible to significantly increase the fixation strength between the electrode pad E1 (FIG. 50) and the lead 3.

In addition, when referring to FIG. 44, the dimension Xa of the bent metallic thin film 3a in the longitudinal direction of the lead is preferably 1 mm or more. If the dimension Xa is less than 1 mm, the bond strength with the electrode pad based on soldering tends to deteriorate, and sufficient bond strength can be obtained if the dimension Xa is 1 mm or more, especially if it is 2 mm or more. Note that the foregoing dimension is preferably 5 mm or legs, and sufficient bond strength can be obtained in the foregoing case. Moreover, the ratio ra (XA/Xa) of the dimension Xa to the dimension XA of the lead 3 from the boundary position with the outer package 1 to the tip position of the lead 3 in the longitudinal direction is preferably 1.2 or more. If the ratio ra of the dimension is less than 1.2, the lead 3 may come in contact with the outer package and damage the resin layer of the outer package surface, and this tends to increase the short circuit failure rate.

Figure 46:
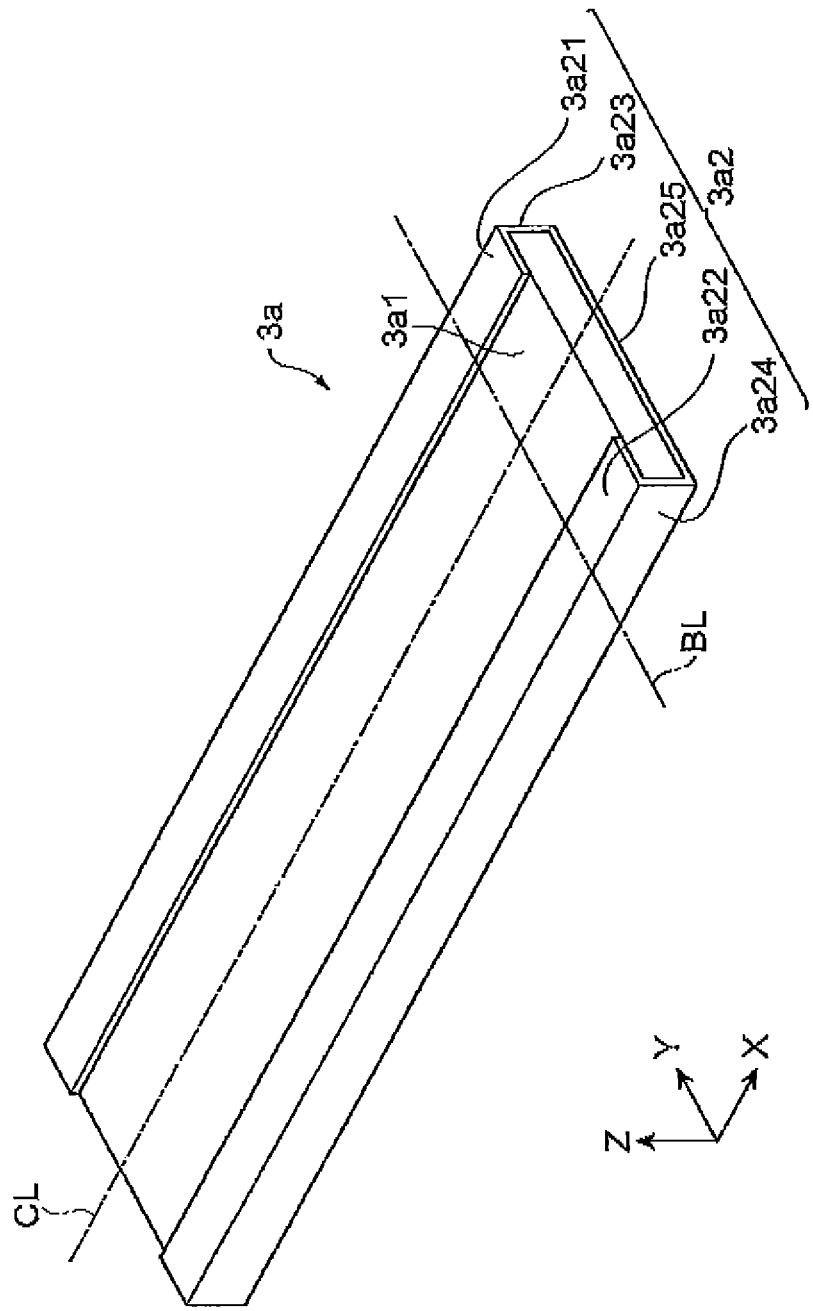
FIG. 46 is a perspective view of the metallic thin film.

FIG. 46 is a perspective view of the metallic thin film 3a before bending.

With the plating layer 3a2 (including the plating layers 3a21, 3a22, 3a23, 3a24, 3a25), strip-shaped plating layers 3a21, 3a22 are formed along the longitudinal direction (direction that is perpendicular to the bending axis) of the thin film body 3a1 on the inner surface of the thin film body 3a1 (after bending) in the vicinity of the opposite end positions of the bent metallic thin film 3a in the bending axis BL (Y axis) direction (areas in which the width of the metallic thin film 3a in the bending axis EL direction from the respective side faces is within the range of 1% or more to 20% or less).

Figure 47A:
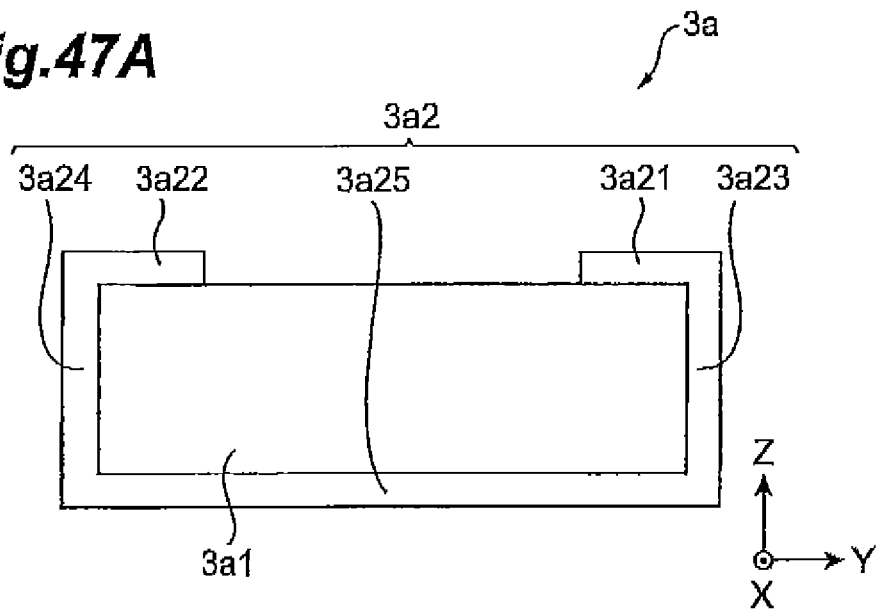
FIG. 47A and FIG. 47B are cross sections of the metallic thin film.
Figure 47B:
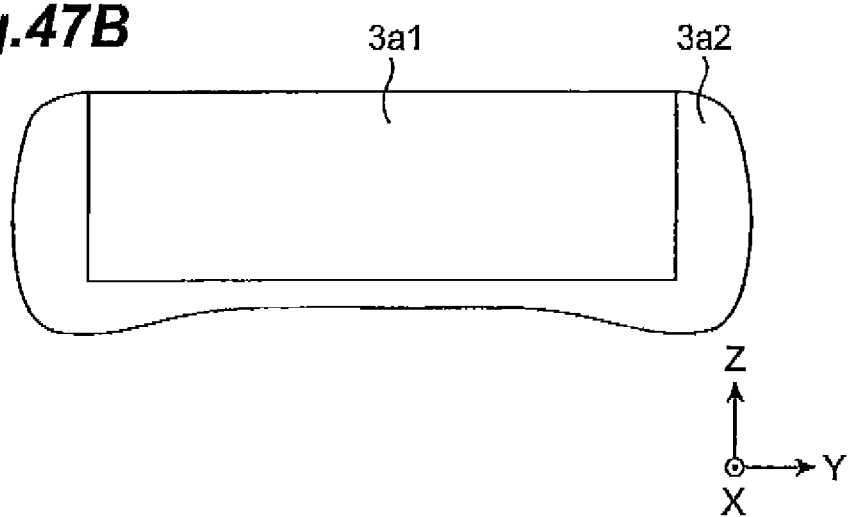

FIG. 47A shows the YZ cross section of the metallic thin film 3a. As a result of forming the plating layers 3a21, 3a22 in the vicinity of the opposite end positions (opposite end positions of the lead in the width direction) in the bending axis BL (Y axis) direction as shown in FIG. 46, the contour of the cross section shape of the plating layer 3a2 (cross section shape that is perpendicular to the longitudinal direction of the lead (YZ cross section)) acquires linearity in comparison to the case (B) of not forming the same. In FIG. 47B, the plating layers 3a21, 3a22 corresponding to FIG. 47A are not formed, and the plating layer in the vicinity of the opposite end positions is rounded and thickened. Meanwhile, with the shape of FIG. 47A, the plating layers 3a23, 3a24 of the side face have a uniform thickness and the contour thereof possesses linearity in the YZ cross section, and are roughly orthogonal to the contour of the plating layer 3a25 on the rear face side. Accordingly, with the shape of FIG. 47A, the product deviation can be reduced since variation in the thickness of the plating layer 3a2 will decrease, and it is thereby possible to provide an electrochemical device of stable quality.

The formation of this kind of plating layer can be performed using methods which are generally well known. The method of forming a plating layer can be generally classified into alkaline, acidic and neutral plating baths.

An alkaline plating bath is configured from potassium stannate or sodium stannate, and potassium hydroxide or sodium hydroxide. When electrodeposition is performed from quadrivalent tin and reaction occurs at a temperature of roughly 70° C., a stable plating layer is formed. Note that the experiments of the Examples described later adopted an alkaline plating bath using an aqueous solution of potassium stannate and potassium hydroxide as the plating solution.

An acidic plating bath is configured from tin sulfate, tin fluoroborate or the like.

Tin chloride is used for a neutral plating bath.

Depending on the degree of adhesion that is required, there are eases of forming copper or nickel plating in a thickness of 1 to 10 μm as the plating surface treatment. As measures against whiskers, there are cases where, after the plating process, melting/heating treatment is performed or heating is performed at approximately 180° C. for approximately 1 hour.

Moreover, the thickness (average value) of the plating layer 3a2 is 0.5 μm or more and 10 μm or less. Specifically, if the thickness is less than 0.5 μm, defects (pinholes) may arise in the plating layer, and, if the thickness exceeds 10 μm, it tends to interfere with the welding. If the thickness of the Sn plated layer 3a2 is roughly 2 μm, then the solder wettability becomes favorable. The solder wettability is defined, for example, based on the standard (JESD22-B102E) of the reliability test of individual semiconductor electronic components conducted by the standardization organization Solid State Technology Association (JEDEC). With a tin plating layer formed on a thin film prepared under the foregoing conditions, a solder layer can be formed on 95% or more of the solder dipping area based on the following conditions; for instance, soldering temperature of 245° C., dip speed of 1.8 mm/sec, dip time of 3 seconds, and dip depth of 2 mm.

Moreover, in cases where the thickness of the Ni thin film body 3a1 is approximately 100 μm, if the thickness of the Sn plated layer 3a2 exceeds 10 μm, the bending portion is subject to stress and there are case where cracks occur at the interface of the Ni thin film body 3a1 and the Sn plated layer 3a2. These cracks tend to deteriorate the bond strength. Moreover, whiskers tend to arise when much stress remains in the Su plated layer 3a2, and, consequently, a short circuit tends to occur in the vicinity of the terminal. As a result of mounting the metallic thin film 3a including the Sn plated layer 3a2 on the Al lead body 3A, the solder wettability (fillet formability) can be improved significantly.

In addition, the thickness of the thin film body 3a1 is preferably 50 μm or more and 500 μm or less. If the thickness of the thin film body 3a1 falls below 50 μm, in the case of fanning the foregoing plating layer structure, an adhesive tape is affixed to the non-plated area (area along the center line CL in FIG. 46) of the thin film body 3a1, plating is subsequently performed, and the adhesive tape is peeled thereafter at an appropriate timing, but the thin film body 3a1 oscillates during the foregoing process and wrinkles, kinks, crimps and the like tend to form on the thin film body, and, since such defects cannot be controlled, an error occurs in the quality of the product Moreover, if the thickness of the thin film body 3a1 exceeds 500 μm, this is undesirable since a phenomenon occurs where bonding with the lead becomes difficult. The present invention can inhibit the foregoing defects by setting the thickness of the thin film body to be within the foregoing range.

As described above, since the bonding (ultrasonic fusion) of the Ni tab (metallic thin film) of the Sn plated surface and the Al lead body 3A is difficult, plate processing is not performed to the bonding plane. Although it is advantageous to cover the entire side face of the metallic thin film 3a with the Sn plated layer in terms of forming a fillet, a certain level of effect can be yielded even if the Ni substrate is exposed. The Sn plate processing is performed in succession and a required amount (for example, roughly 20 mm) is used by being cut before being bonded to the Al lead body 3A. Thus, although the Sn plated layer does not exist in the cut plane, there is no problem since this portion does not affect the formation of a fillet.

FIG. 50 is the XZ cross section of the circuit board which is configured by the foregoing electrochemical device 10 being mounted on a substrate. In order to clarify the features, the portion of the outer package 1 is shown as a side face and not as a cross section.

This circuit board comprises the electrochemical device 10, and a substrate SB comprising an electrode pad E1 and on which the electrochemical device 10 is mounted. The main material of the substrate SB is an insulating material, and the electrode pad E1 is formed on the surface thereof Various electronic components can be mounted on the substrate SB, but this example only shows the portion of the electrochemical device 10, which is the feature of this example.

This circuit board comprises a double-sided adhesive tape 4 which is interposed between the rear face of the outer package 1 and the substrate SB, and a solder material SD which is interposed between the electrode pad E1 and the metallic thin film 3a, and which reaches an outer surface of the metallic thin film 3a. Moreover, since the lead 3 is bent in an obliquely downward direction from a position which is in contact with the outer package; that is, bent to incline in the direction of the electrode pad El, the space between the lead 3 and the electrode pad E1 is narrowed. Thus, depending on the inclination angle, portions may be famed where the electrode pad E1 and the metallic thin film 3a are in direct contact without the intervention of the solder material SD. As a result of the electrode pad E1 and the metallic thin film 3a being in direct contact or the space therebetween being narrowed, an effect is yielded in that the connection resistance can be reduced. Note that, when the tip of the lead 3 is positioned lower than the plane in which the bottom face F1 of the outer package 1 is extended, the tip of the lead 3 is pressed against the electrode pad E1 when the electrochemical device 10 is mounted on the substrate SB. Here, since the tip of the lead 3 is pushed upward by the electrode pad E1, the inclination angle of the lead 3 after it is mounted becomes smaller than the inclination angle before it was mounted.

As a result of the connection portion of the lead 3 and the electrode pad E1 adopting the foregoing structure, since the lead 3 and the electrode pad E1 are firmly fixed and the rear face of the outer package 1 and the substrate SB are also firmly fixed with the double-sided adhesive tape 4, obtained is a circuit board that is resistant to oscillation.

Moreover, with this circuit board, the solder material SD contains Sn and Cu. Since this kind of Material has favorable affinity with Sn contained in the plating layer 3a2 (refer to FIG. 46), the wettability of the solder material SD will increase. However, since Cu is contained, the melting point of the solder decreases, and effects are yielded in that the solder workability is improved and the solder wettability is improved. Moreover, the solder material more preferably contains trace amounts of Ag. In the foregoing case, an effect is yielded in that the durability after the solder welding will improve. The ratio (mass percent ratio) of the respective elements in the solder material SD in this example is as shown below, and a variation of ±1 (mass %) is tolerated in the respective numerical values (provided, however, that the ratio of Cu>0 mass %), Sn:Cu:Ag=96.5 (mass %):0.5 (mass %):3 (mass %)

The method of assembling the foregoing lead is now explained.

Figure 48:
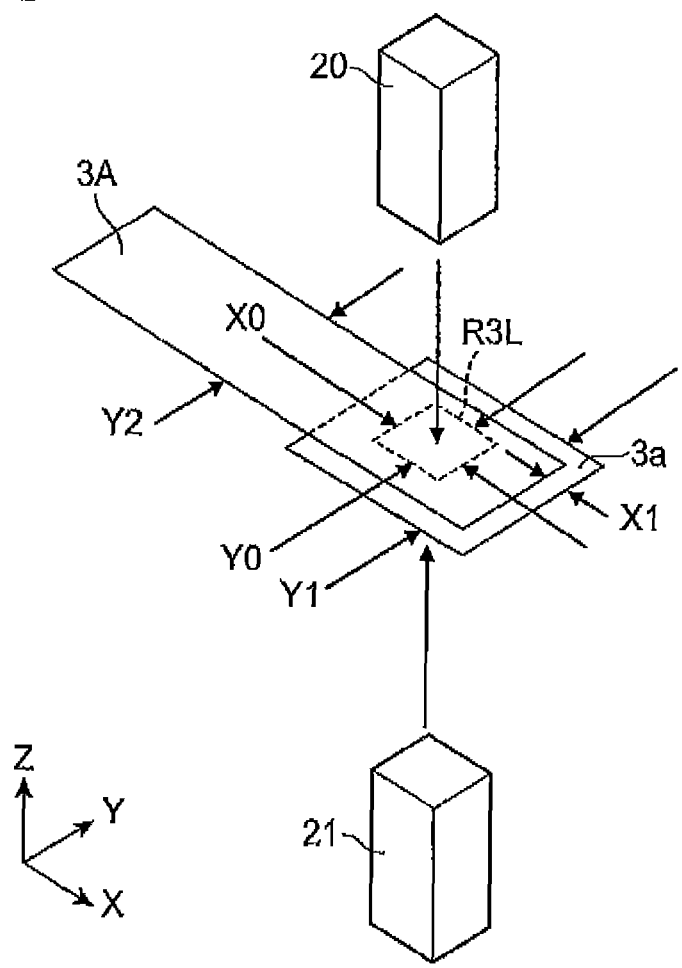
FIG. 48 is a perspective view showing the welding process of the lead body and the metallic thin film.

FIG. 48 is a perspective view showing the welding process of the lead body and the metallic thin film.

The lead body 3A and the metallic thin film 3a are prepared, and their areas are partially superposed at the tip part of the lead body 3A. The width Y2 of the lead body 3A in the Y axis direction, the width Y1 of the metallic thin film 3a, and the width Y0 of the welding area R3L are constant along the X axis, but the width Y0 of the welding area R3L is smaller than the width Y2 of the lead body 3A, and, as a general rule, the welding area R3L does not overlap with the plating layers 3a21, 3a22 (refer to FIG. 46) positioned at the opposite ends in the Y axis direction of the metallic thin film 3a.

The width Y2 of the lead body 3A in they axis direction is smaller than the width Y1 of the metallic thin film 3a, and, although the width Y2 of the lead body 3A is shown to be smaller than the width Y1 of the metallic thin film 3a in FIG. 48, these widths may also be the same. Moreover, in cases where the metallic thin film 3a is bent so as to cover the side face of the tip of the lead body 3A as shown in FIG. 43, the metallic thin film 3a is disposed so as to protrude from the tip part of the lead body 3A in the X axis direction. The width X1 of the protruding metallic thin film 3a (which is not overlapping with the lead body 3A) is preferably greater than the width of the lead body 3A. Ultrasonic vibrator heads 20, 21 for performing ultrasonic welding are positioned at the vertical position in the thickness direction, and, by oscillating an oscillator that is mechanically connected to at least one of such ultrasonic vibrator heads 20, 21, the welding area R3L that comes into contact with the ultrasonic vibrator heads 20, 21 will melt, and the lead body 3A made of Al and the lower face exposed area (Ni) of the metallic thin film 3a become fused.

FIG. 49 is a diagram showing the method of bending the lead and the metallic thin film.

Foremost, as shown in FIG. 49A, an electrochemical device before bending in which the lead 3 and the metallic thin film 3a are not bent is prepared. The electrochemical device before bending is obtained by welding the lead body 3A and the metallic thin film 3a according to the method shown in FIG. 48.

Next, as shown in FIG. 49B, the electrochemical device before bending is placed on a bending jig 20. The bending jig 20 includes a principal plane 20a for mounting the charger/discharger 2 housed in the outer package 1, an inclined plane 20b extending at an angle from the principal plane 20a in an obliquely downward direction, and a vertical plane 20c extending in a direction that is perpendicular to the inclined plane 20b. The inclination angle θ2 of the inclined plane 20b relative to the principal plane 20a is the same as the inclination angle θ1 of the lead 3 after bending. Moreover, although it is desirable that the angle formed by the inclined plane 20b and the vertical plane 20c is 90°, up to approximately 90°±15° is tolerated. The bending jig 20 is obtained by processing a general metal mold material such as an SK material, SUS material, aluminum alloy, copper alloy, super hard alloy and the like into the foregoing shape.

Next, in a state where the outer package 1 housing the charger/discharger 2 is fixed on the principal plane 20a, the lead 3 is pressed against the inclined plane 20b and the vertical plane 20c of the bending jig 20 as shown with the arrow of FIG. 49B. Consequently, as shown in FIG. 49C, the lead 3 is bent along the inclined plane 20b so as to incline in an obliquely downward direction from a position which is in contact with the outer package 1. Simultaneously, the portion of the metallic thin film 3a protruding from the lead body 3A is bent by the vertical plane 20c with the Y axis as the bending axis, and pressed against the side face of the lead body 3A. The electrochemical device 10 shown in FIG. 43 and FIG. 44 is obtained via the foregoing processes.

Preferably, the width (width X1 in FIG. 48) of the bent portion of the metallic thin film 3a is equal to or greater than the thickness of the lead body 3A. As a result of bending the metallic thin film 3a with a width that is greater than the thickness of the lead body 3A, the side face of the lead body 3A is sufficiently covered, the solder material can crawl up to the side face position of the lead body 3A, and the fixation strength between the electrode pad and the lead can be improved. The width of the bent portion of the metallic thin film 3a is preferably greater than the thickness of the lead body 3A, but more preferably the value of the (thickness of the lead body 3A width (X1) of the bent portion of the metallic thin film 3a) is 30 µm or more. If the width of the metallic thin film 3a protruding from the lead body 3A is too wide, there are cases where portions that do not contribute to the improvement in the fixation strength are formed. In the foregoing case, after the bending, the protruding portion may be cut to adjust the length to the intended length.

Note that, in the foregoing embodiment, a case was explained where the metallic thin film 3a is bent at the bending axis that is parallel to the Y axis so as to cover the side face of the tip part of the lead body 3A in the longitudinal direction, but it is also possible to bend the metallic thin film 3a at the bending axis that is parallel to the longitudinal direction of the lead body 3A so as to cover the one or both side faces (XZ plane) positioned at opposite ends of the lead body 3A in the width direction. In the foregoing case, in FIG. 48, the width Y1 of the metallic thin film 3a is made to be greater than the width Y2 of the lead body 3A. Moreover, the metallic thin film 3a does not need to protrude from the lead body 3A in the X axis direction, and the width Xi may be set to 0. In cases of bending the metallic thin film 3a at the bending axis that is parallel to the lead body 3A in the longitudinal direction as described above, as the foregoing bending jig 20, a type in which the vertical plane 20c is provided to the position of bending the metallic thin film 3a may be used.

Moreover, the side face of the lead body 3A to be covered by the metallic thin film 3a is not limited to one location, and this may be two locations or three locations. In the foregoing case, the location of bending the metallic thin film 3a is also not limited to one location, and it may also be two locations or three locations. As a result of a plurality of side faces of the lead body 3A being covered by the metallic thin film 3a, the electrode pad and the lead can be fixed even more firmly. Note that, upon bending the metallic thin film 3a at multiple locations, the metallic thin film. 3a may be provided with slits or partially provided with a notch from the perspective of avoiding interference with the bending operation. Specifically, in FIG. 48, slits may be provided to the metallic thin film 3a at a position of the extended line of a side that is parallel to the X axis direction or a side that is parallel to the Y axis direction of the lead body 3A. Moreover, a notch may be provided to the corner of the metallic thin film 3a that is partitioned by the extended line of a side that is parallel to the X axis direction and the extended line of a side that is parallel to the Y axis direction of the lead body 3A. Moreover, it is also possible to bend the metallic thin film 3a without providing the foregoing slits or notches.

Moreover, although the foregoing embodiment explained a case where the metallic thin film 3a was provided with a portion that does not overlap with the tip part of the lead body 3A and such portion was bent, it is also possible to bend the tip part of the lead body 3A and the metallic thin film 3a without providing such non-overlapping portion. Since the side face of the lead body 3A will still be covered by the metallic thin film 3a in the foregoing case, the same effect as the foregoing embodiment is yielded. Moreover, a fold may be additionally provided to the tip part of the lead body 3A. It is thereby possible to improve the mechanical strength of the lead tip part and increase the fixation strength between the electrode pad E1 and the lead 3.

A housing tray that is suitable for housing the foregoing electrochemical device is now explained. FIG. 51A and FIG. 51B are a cross section and a plan view of the housing tray according to this embodiment. FIG. 51B is a plan view of the housing tray 50, and FIG. 51A is a V-V arrow cross section of FIG. 51B.

As shown in FIG. 51A and FIG. 51B, the housing tray 50 comprises a body housing part 50a for housing the charger/discharger 2 housed in the outer package 1, and a lead housing part 50b including an inclined plane extending at an angle from the body housing part 50a in an obliquely downward direction. Since the lead housing part 50b includes the foregoing inclined plane and is a deeper recess than the body housing part 50a, it can house the electrochemical device 10 without having to change the inclination angle θ1 of the lead 3. There is no particular limitation in the inclination angle θ3 of the inclined plane of the lead housing part 50b so as long as it is an angle which will not change the inclination angle θ1 of the lead 3, but preferably it is the same as or greater than the inclination angle θ1 of the lead 3. Moreover, preferably, the depth Z1 of the body housing part 50a is the same as or greater than the thickness of the outer package 1 housing the charger/discharger 2 of the electrochemical device 10.

The housing tray 50 is provided with a plurality of electrochemical device housing parts configured from the body housing part 50a and the lead housing part 50b, and one housing tray 50 can store a plurality of electrochemical devices 10. Moreover, it is also possible to stack a plurality of housing trays 50.

As the material of the housing tray 50, for example, polypropylene, polystyrene and the like may be used.

The housing tray 50 shaped as described above is extremely useful as a tray for housing an electrochemical device comprising an inclined lead.

Experiments were conducted for measuring the mounting strength regarding the foregoing electrochemical device.

In this example, the EDLC was manufactured according to the following procedures. Foremost, activated carbon and a conductive assistant, a binder (PVDF: polyvinylidene fluoride) and a solvent (NMP: N-methylpyrrolidone) were mixed to prepare paint, and this was applied to the collector foil (aluminum foil) and dried, and an electrode sheet to become the electrode terminal of the capacitor was thereby obtained. This electrode sheet was punched out into a size of 12 mm×17 mm, and laminated so that the electrode surfaces face each other via a separator. An Al lead (aluminum: thickness 100 µm) was ultrasonic-welded to the electrode extraction part of the respective foils, and this was placed in an aluminum laminated foil configuring the outer package and three sides were sealed, and, after pouring in an electrolytic solution, the final one side was sealed to obtain an EDLC. The Al lead tip was prepared as with the following example. The evaluation was performed by disposing a 5 mm×3 mm electrode pad E1 on a substrate SB made, of glass epoxy (Flame Retardant Type 4) (1.6 mm thickness) and connecting the lead tip part of the EDLC to the solder material SD, and measuring the strength thereof by conducting a horizontal tensile strength test.

FIG. 52 is a diagram explaining the experimental method of the Examples.

The lead 3 of the electrochemical device 10 was disposed on the electrode pad E2 of the circuit board SB, and the solder material SD was melted and caused to drip onto the lead 3 and subsequently cooled to fix the same. Note that the electrochemical device 10 was pulled in the arrow direction (negative direction of the X axis) in the figure to measure the tensile strength in the horizontal direction without using the adhesive tape shown in FIG. 50.

FIG. 53 is a diagram explaining the experimental method of Comparative Example 1.

With Comparative Example 1, in comparison to the Examples, a metallic thin film 3b in which a non-bent Ni thin film body was subject to Sn plating was used in substitute for the bent metallic thin film 3a, and this was connected to the lower face of the lead body 3A based on ultrasonic fusion as with the foregoing method, and the product thereof was used. Moreover, the lead 3 was not in a bent state. The solder material SD is interposed between the metallic thin film 3b and the electrode pad E1, but it was not able to crawl up the exposed side face of the lead body 3A made of aluminum, and, when the melted solder material SD was caused to drip from above, the solder material SD moved to the lower side of the lead body 3A and then solidified. This electrochemical device 10 was also pulled in the arrow direction (negative direction of the X axis) of FIG. 53 to measure the tensile strength in the horizontal direction.

FIG. 54 is a diagram explaining the experimental method of Comparative Example 2.

With Comparative Example 2, in comparison to Comparative Example 1, the tip of the metallic thin film 3b is mounted on the tip of the lead body 3A so as to protrude therefrom, and a melted solder ball 3c was caused to drip onto the tip of the metallic thin film 3b and subsequently cooled and fixed, and the solder ball 3c and the electrode pad E1 were fixed with the solder material SD. The solder material SD can be positioned between the solder ball 3c and the electrode pad E1 and on the upper face of the solder ball 3c, but it could not crawl up the exposed side face of the metallic thin film 3b, and, when the melted solder material SD was caused to drip from above, the solder material SD became collected in the vicinity of the solder ball 3c and then solidified. This electrochemical device 10 was also pulled in the arrow direction (negative direction of the X axis) of FIG. 54 to measure the tensile strength in the horizontal direction,

EXAMPLE 1

In Example 1 (Examples 1-1 to 1-7), the Al lead tip was prepared as follows. Foremost, an EDLC before bending comprising a lead 3 in which the width Y2 of the lead body 3A and the width Y1 of the metallic thin film 3a (refer to FIG. 48) are the same, and provided with a protruding portion (width X1) of the metallic thin film 3a which does not overlap with the lead body 3A in the X axis direction was prepared. This EDLC before bending was fixed to the bending jig 20 according to the procedures shown in FIG. 49A to FIG. 49C, the lead 3 was bent to incline in an obliquely downward direction from a position which is in contact with the outer package 1 by pressing down the lead 3, and, simultaneously, the protruding portion of the metallic thin film 3a was bent so as to cover the side face of the lead body 3A. With the bent lead 3, its tip was positioned lower than the plane in which the bottom face of the outer package 1 was extended. Note that the respective dimensions were as follows with reference to FIG. 44 and FIG. 48.

θ1=36°
X0=2 mm
X1=1 mm
Y0=2 mm
Y1=3 mm
Y2=3 mm
XA=5 mm
Xa=3 mm

Note that the thickness of the thin film body 3a1 is 100 μm, and the thickness of the Sn plated layer 3a2 is 0.3 μm (Example 1-1), 0.5 μm (Example 1-2), 2 μm (Example 1-3), 5 μm (Example 1-4), 7 μm (Example 1-5), 10 μm (Example 1-6), and 10.5 μm (Example 1-7). Note that Ea 2000 manufactured by Branson was used for the ultrasonic fusion (welding energy=12.0 J, welding time=0.1 sec), and ultrasonic fusion was performed before the bending of the metallic thin film.

This method is a method of disposing the metallic thin film 3a so that a part thereof does not overlap with the tip of the Al lead body 3A, thereafter connecting them with ultrasonic fusion, and bending such non-overlapping portion so as to cover the side face of the Al lead body 3A.

REFERENCE EXAMPLE 1

In Reference Example 1, the Al lead tip was prepared as follows. As with Example 1, an EDLC before bending was prepared. The bending of the lead 3 and the bending of the metallic thin film 3a were performed separately to the EDLC before bending. Specifically, foremost, the lead body 3A and the metallic thin film 3a connected via ultrasonic fusion were pinched with a prescribed jig, and the portion that does not overlap with the lead body 3A of the metallic thin film 3a was bent so as to cover the side face of the lead body 3A. Subsequently, the EDLC body was fixed to the bending jig configured only from the principal plane 20a and the inclined plane 20b, and the lead 3 was pushed upward so as to bend the lead 3 to incline in an obliquely downward direction from a position which is in contact with the outer package 1. The other conditions and respective dimensions were the same as Example 1-3.

<Measurement of Overall Length of EDLC>

100 EDLCs were prepared respectively based on the manufacturing methods of Example 1-3 and Reference Example 1, and the overall lengths thereof were measured to obtain the average value (mm) and standard deviation (mm) of the overall lengths thereof. Note that the target value of the overall length of the EDLC was 30 mm. The results are shown in Table 2-1.

TABLE 2-1

| | Average value (mm) | Standard deviation (mm) |
|---|---|---|
| Examples 1-3 | 30.15 | 0.09 |
| Reference Example 1 | 30.24 | 0.20 |

As evident from the results shown in Table 2-1, upon comparing Example 1-3 and Reference Example 1, it was confirmed that the EDLC manufactured with the manufacturing method of Example 1-3 was closer to the target value in terms of the overall length, and the variation was also small.

<Measurement of Mounting Strength>

Based on the foregoing methods, the mounting strength of the EDLC of Examples 1-1 to 1-7, and Comparative Examples 1 and 2 was measured. Table 2-2 below is a table showing the experimental results. The number of samples n is 100 samples, and the average value (N) and the standard deviation (N) of the horizontal tensile strength are shown.

In Example 1, the lead did not rupture or come off even when force of 25 N was applied in the horizontal direction. Moreover, as shown in Example 1-1 to Example 1-7, even when the plating thickness was changed within the range of 0.3 μm or more and 10.5 μm or less, there was no change in the tensile strength in the horizontal direction. Note that 25 N is the measurement limit of the measuring device. Meanwhile, with Comparative Examples 1 and 2, the lead came off from the electrode pad E1 when force of 7.8 N and force of 17.3 N were applied, respectively. There was also variation in Comparative Examples 1 and 2.

<Evaluation of Status of Connection of Lead>

The evaluation results of the status of connection of the lead are shown in Table 2-2 below. With respect to the results concerning the status of connection of the lead, in Example 1-1, 94 samples were non-defective among the 100 samples, but 6 samples contained parts where the solder wettability was insufficient (evaluation result of status of connection: Δ). In Example 1-7, 95 samples were non defective among the 100 samples, but 5 samples contained parts with cracks at the interface of the thin film body 3a1 made of Ni foil and the Sn plated layer 3a2 (evaluation result of status of connection; Δ). In Comparative Example 1, 98 samples among the 100 samples contained parts where the solder wettability was inferior (evaluation result of status of connection: ×). In Comparative Example 2, 80 samples among the 100 samples contained parts where the solder wettability was inferior (evaluation result of status of connection: ×). In other Examples 1-2 to 1-6, all samples were non-defective, and no parts could be acknowledged where the solder wettability was insufficient or parts with cracks as those described above (evaluation result of status of connection: ○).

Note that the expression "parts where the solder wettability was insufficient" specifically refers to the parts where the plating layer becomes thin due to the variation in the plating layer thickness and the solder is easily repelled, and the expression "parts where the solder wettability is inferior" specifically refers to the parts where the plating layer was not formed and the solder could not be spread thereon. Moreover, the expression "parts with cracks at the interface" specifically refers to the parts where, after forming the plating layer, the plating layer became separated from the Ni layer. In particular, the parts with cracks at the interface tend to occur at the bent portion.

TABLE 2-2

|  |  | Thickness of plated layer (μm) | Average value (N) | Standard deviation (N) | Status of connection |
|---|---|---|---|---|---|
| Example 1 | Example 1-1 | 0.3 | >25 | — | Δ |
|  | Example 1-2 | 0.5 |  |  | ○ |
|  | Example 1-3 | 2 |  |  | ○ |
|  | Example 1-4 | 5 |  |  | ○ |
|  | Example 1-5 | 7 |  |  | ○ |
|  | Example 1-6 | 10 |  |  | ○ |
|  | Example 1-7 | 10.5 |  |  | Δ |
| Comparative Example 1 |  | 2 | 7.8 | 2.2 | x |
| Comparative Example 2 |  | — | 17.3 | 3.1 | x |

Upon considering these results, with the structure of Comparative Example 1, it is considered that the solder material was repelled by Al and unable to form a sufficient fillet, and the reliability is insufficient. Meanwhile, with the structure of Example 1 in which the metallic thin film (Ni tab) was bent and formed on the Al lead body and the lead was inclined toward the electrode pad, it was possible to form a clean fillet from the side face of the lead body covered with the metallic thin film to the electrode pad and obtain sufficient connection strength, and sufficient reliability was thereby obtained. Moreover, according to the structure of Example 1, the structure becomes resistant to the anticipated load (pulling and twisting) that will be applied to the EDLC after the lead is bonded.

With the ultrasonic fusion of the lead body 3A and the metallic thin film. 3a, preferably the metallic thin film 3a and the lead body 3A are connected firmly. When handling a high current (for example, 1 ampere or higher), the contact resistance between the lead body 3A and the metallic thin film 3a will generate an extremely significant loss. Thus, the lead body 3A and the metallic thin film 3a need to be firmly fused so as to reduce the contact resistance thereof as much as possible.

Moreover, with Comparative Example 2, since the solder ball as the preliminary soldering is uneven, the fillet that is formed also becomes uneven. (in certain cases only the bottom face), variation arises in the connection strength. Consequently, there is a possibility that problems may arise in the connection life in terms of long-term reliability. However, with the structure of Example 1, stable connection strength can be ensured since it is possible to form a fillet on the plated surface. Accordingly, with the structure of the Examples, the connection life in terms of long-term reliability can be significantly improved.

As explained above, since a thin EDLC using a laminated outer package is demanded of solder connectability to a printed board, and a lead of the EDLC needs to satisfy both the resistance properties and electrical conductivity relative to the electrolytic solution, Al with inferior solder wettability was used, and it was not possible to improve the connection strength. In this embodiment, it was possible to improve the fixation strength by using a bent metallic thin film and causing the lead to incline. Since this method adopts processes with superior reproducibility such as plating and fusion, automation can be realized easily, and this is also desirable in terms of productivity. As electronic components having this kind of a flat lead terminal shape, lithium ion batteries and electrolytic capacitors are know in addition to EDLC, and the present invention can also be applied to these components.

What is claimed is:

1. An electrochemical device including a charger/discharger housed in an outer package, and a lead extending from the charger/discharger, wherein
the lead has:
a lead body containing Al; and
a metallic thin film which is provided to a tip part of the lead body, and which is bent at a side face position of the lead body as a boundary, and covers upper and lower faces and a side face of the lead body, the metallic thin film having at least one first portion and a second portion, the second portion including the side face of the lead body, the at least one first portion being welded to the lead body and the second portion not being welded to the lead body,
the metallic thin film includes:
a thin film body containing Ni; and
a plating layer containing Sn and covering at least an outer surface of the bent thin film body, and wherein
the plating layer not being disposed between the metallic thin film and the lead body.

2. The electrochemical device according to claim 1, wherein the metallic thin film is welded to both the upper and lower faces of the lead body.

3. The electrochemical device according to claim 1, wherein the plating layer is formed along a longitudinal direction of the thin film body on an inner surface of the thin film body in the vicinity of opposite end positions of the bent metallic thin film in a bending axis direction.

4. The electrochemical device according to claim 3, wherein a thickness of the plating layer is 0.5 μm or more and 10 μm or less.

5. The electrochemical device according to claim 4, wherein a thickness of the thin film body is 50 μm or more and 500 μm or less.

6. The electrochemical device according to claim 1, wherein a dimension of the bent metallic thin film in a longitudinal direction of the lead is 1 mm or more.

7. The electrochemical device according to claim 1, wherein the plating layer contains 98±1 (mass %) of Sn and 2±1 (mass %) of Cu.

8. The electrochemical device according to claim 1, wherein a width of the metallic thin film is greater than a width of the lead body.

9. A circuit board, comprising:
the electrochemical device according to claim 1;
a substrate on which the electrochemical device is mounted and which has an electrode pad;
a double-sided adhesive tape which is interposed between a rear face of the outer package and the substrate; and
a solder material which is interposed between the electrode pad and the metallic thin film, and which reaches an outer upper face of the metallic thin film.

10. The circuit board according to claim 9, wherein the solder material contains Sn and Cu.

11. An electrochemical device including a charger/discharger housed in an outer package, and a lead extending from the charger/discharger, wherein
the lead has:
a lead body containing Al; and
a metallic thin film which is provided to a tip part of the lead body, and which is bent at a side face position of the lead body as a boundary and covers upper and lower faces and a side face of the lead body, the metallic thin film having at least one first portion and a second portion, the second portion including the side face of the lead body, the at least one first portion being welded to the lead body and the second portion not being welded to the lead body,
the metallic thin film includes:
a thin film body containing Ni; and
a plating layer containing Sn and covering at least an outer surface of the bent thin film body, and wherein
the plating layer not being disposed between the metallic thin film and the lead body, and a lower face of the lead body is not welded to the second portion of the metallic thin film.

12. The electrochemical device according to claim 11, wherein the plating layer is formed along a longitudinal direction of the thin film body on an inner surface of the thin film body in the vicinity of opposite end positions of the bent metallic thin film in a bending axis direction.

13. The electrochemical device according to claim 12, wherein a thickness of the plating layer is 0.5 μm or more and 10 μm or less.

14. The electrochemical device according to claim 13, wherein a thickness of the thin film body is 50 μm or more and 500 μm or less.

15. The electrochemical device according to claim 11, wherein a dimension of the bent metallic thin film in a longitudinal direction of the lead is 1 mm or more.

16. The electrochemical device according to claim 11, wherein the plating layer contains 98±1 (mass %) of Sn and 2±1 (mass %) of Cu.

17. The electrochemical device according to claim 11, wherein a width of the metallic thin film is greater than a width of the lead body.

18. A circuit board, comprising:
the electrochemical device according to claim 11;
a substrate on which the electrochemical device is mounted and which has an electrode pad;
a double-sided adhesive tape which is interposed between a rear face of the outer package and the substrate; and
a solder material which is interposed between the electrode pad and the metallic thin film, and which reaches an outer upper face of the metallic thin film.

19. The circuit board according to claim 18, wherein the solder material contains Sn and Cu.

20. An electrochemical device including a charger/discharger housed in an outer package, and a lead extending from the charger/discharger, wherein the lead has:
a lead body containing Al; and
a metallic thin film which is provided to a tip part of the lead body, and which is bent into a curved shape at a side face position of the lead body as a boundary so as to form a gap between a side face of the lead body and the metallic thin film, and moreover which covers upper and lower faces and a side face of the lead body, and in which a predetermined area is welded to the lead body,
the metallic thin film includes:
a thin film body containing Ni; and
a plating layer containing Sn and covering at least an outer surface of the bent thin film body, and wherein
a specific area of an inner surface of the bent thin film body and a surface of the lead body are directly in contact and welded in the predetermined area without the plating layer being disposed therebetween.

21. The electrochemical device according to claim 20, wherein a distance of the gap between the metallic thin film and the side face of the lead body is 0.1 mm or more and 2 mm or less.

22. The electrochemical device according to claim 20, wherein the metallic thin film is welded to both the upper and lower faces of the lead body.

23. The electrochemical device according to claim 20, wherein the plating layer is formed along a direction that is perpendicular to a bending axis direction of the thin film body on an inner surface of the thin film body in the vicinity of opposite end positions of the bent metallic thin film in the bending axis direction.

24. The electrochemical device according to claim 23, wherein a thickness of the plating layer is 0.5 μm or more and 10 μm or less.

25. The electrochemical device according to claim 24, wherein a thickness of the thin film body is 50 μm or more and 500 μm or less.

26. The electrochemical device according to claim 20, wherein a dimension of the bent metallic thin film in a longitudinal direction of the lead is 1 mm or more.

27. The electrochemical device according to claim 20, wherein the plating layer contains 98±1 (mass %) of Sn and 2±1 (mass %) of Cu.

28. The electrochemical device according to claim 20, wherein a width of the metallic thin film is greater than a width of the lead body.

29. A circuit board, comprising:
the electrochemical device according to claim 20;
a substrate on which the electrochemical device is mounted and which has an electrode pad;
a double-sided adhesive tape which is interposed between a rear face of the outer package and the substrate; and
a solder material which is interposed between the electrode pad and the metallic thin film, and which reaches an outer surface of the metallic thin film.

30. The circuit board according to claim 29, wherein the solder material contains Sn and Cu.

31. An electrochemical device including a charger/discharger housed in an outer package, and a lead extending from the charger/discharger, wherein
the lead has:
a lead body containing Al; and
a metallic thin film which is provided to a tip part of the lead body, and is bent so as to cover a lower face and a side face of the lead body, the metallic thin film having at least one first portion and a second portion, the second portion including the side face of the lead body, the at least one first portion being welded to the lead body and the second portion not being welded to the lead body,
the metallic thin film includes:
a thin film body containing Ni; and
a plating layer containing Sn and covering at least an outer surface of the bent thin film body,
the plating layer not being disposed between the metallic thin film and the lead body, and wherein the lead is bent so as to incline in an obliquely downward direction from a position which is in contact with the outer package.

32. The electrochemical device according to claim 31, wherein the lead is bent so that a tip thereof is positioned lower than a plane extending from a bottom face of the outer package.

33. The electrochemical device according to claim 31, wherein an inclination angle of the lead relative to a plane that is parallel to a bottom face of the outer package is 10° to 80°.

34. The electrochemical device according to claim 31, wherein the plating layer is formed along a direction that is perpendicular to a bending axis direction of the thin film body on an inner surface of the thin film body in the vicinity of opposite end positions of the bent metallic thin film in the bending axis direction.

35. The electrochemical device according to claim 34, wherein a thickness of the plating layer is 0.5 μm or more and 10 μm or less.

36. The electrochemical device according to claim 35, wherein a thickness of the thin film body is 50 μm or more and 500 μm or less.

37. The electrochemical device according to claim 31, wherein a dimension of the bent metallic thin film in a longitudinal direction of the lead is 1 mm or more.

38. The electrochemical device according to claim 31, wherein the plating layer contains 98±1 (mass %) of Sn and 2±1 (mass %) of Cu.

39. A circuit board, comprising:
the electrochemical device according to claim 31;
a substrate on which the electrochemical device is mounted and which has an electrode pad;
a double-sided adhesive tape which is interposed between a rear face of the outer package and the substrate; and
a solder material which is interposed between the electrode pad and the metallic thin film, and which reaches an outer surface of the metallic thin film.

40. The circuit board according to claim 39, wherein the solder material contains Sn and Cu.

41. A housing tray for housing the electrochemical device according to claim 31, comprising:
a body housing part for housing a charger/discharger housed in an outer package; and
a lead housing part including an inclined plane extending at an angle from the body housing part in an obliquely downward direction.

* * * * *